United States Patent [19]
Menkus et al.

[11] Patent Number: 5,719,795
[45] Date of Patent: Feb. 17, 1998

[54] METHOD TO PROVIDE CONSISTENT ESTIMATED GROWTH AND YIELD VALUES FOR LOBLOLLY PINE PLANTATIONS

[75] Inventors: Neal E. Menkus, Ladson; Wade C. Harrison, II; Richard F. Daniels, both of Summerville, all of S.C.

[73] Assignee: Westvaco Corporation, New York, N.Y.

[21] Appl. No.: 507,779

[22] Filed: Jul. 26, 1995

[51] Int. Cl.⁶ .................................................. G06F 17/50
[52] U.S. Cl. .................................................. 364/578
[58] Field of Search .................................................. 364/578

[56] References Cited

U.S. PATENT DOCUMENTS

| | | |
|---|---|---|
| Re. 31,023 | 9/1982 | Hall, III . |
| Re. 31,696 | 10/1984 | Thorsrud ................ 521/88 |
| 3,978,324 | 8/1976 | Rayner . |
| 4,256,850 | 3/1981 | Thorsrud ................ 521/139 |
| 4,306,034 | 12/1981 | Thorsrud ................ 521/95 |
| 4,628,434 | 12/1986 | Tashiro et al. . |
| 4,646,256 | 2/1987 | Bracewell . |
| 4,700,297 | 10/1987 | Hagel, Sr. et al. . |
| 4,703,423 | 10/1987 | Bado et al. . |
| 4,722,055 | 1/1988 | Roberts . |
| 4,744,028 | 5/1988 | Karmarkar . |
| 4,750,121 | 6/1988 | Halley et al. . |
| 4,768,159 | 8/1988 | Gray et al. . |
| 4,787,036 | 11/1988 | Fleming . |
| 4,797,729 | 1/1989 | Tsai . |
| 4,797,847 | 1/1989 | Duhamel . |

*Primary Examiner*—Vincent N. Trans
*Attorney, Agent, or Firm*—Dennison, Meserole, Pollack & Scheiner

[57] ABSTRACT

The invention provides an easy-to-use method of containing consistent growth and yield values at varying levels of resolution (stand, size-class) for loblolly pine plantations in the southern United States. The invention is able to make projections of estimated values using either existing stand data, or predicted from bare-ground conditions. The invention evaluates stand performance based on estimates of potential or "target" productivity yields. The invention provides long-term expected yields for strategic planning, and short term projections for inventory purposes. The invention can function as a simulation tool to provide insights into the life-cycle of a stand under varying initial conditions. While most growth and yield models use an empirical, multiple regression, "best fits to the data" modelling methodology, the present invention is based upon a biomathematical modelling concept.

54 Claims, 76 Drawing Sheets

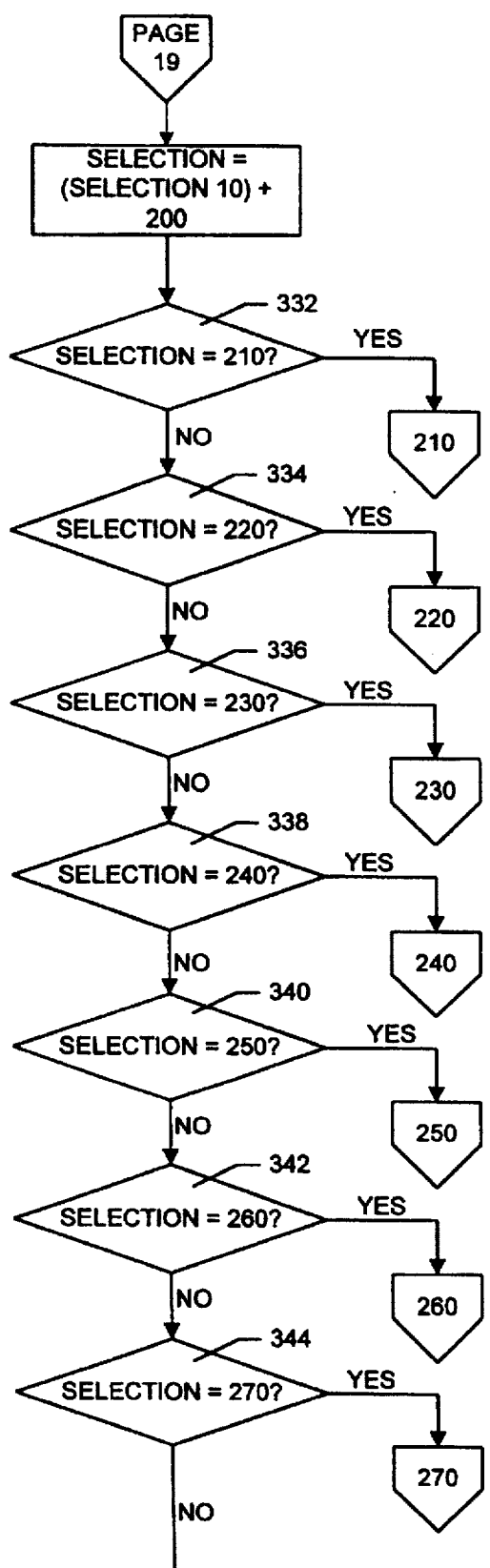
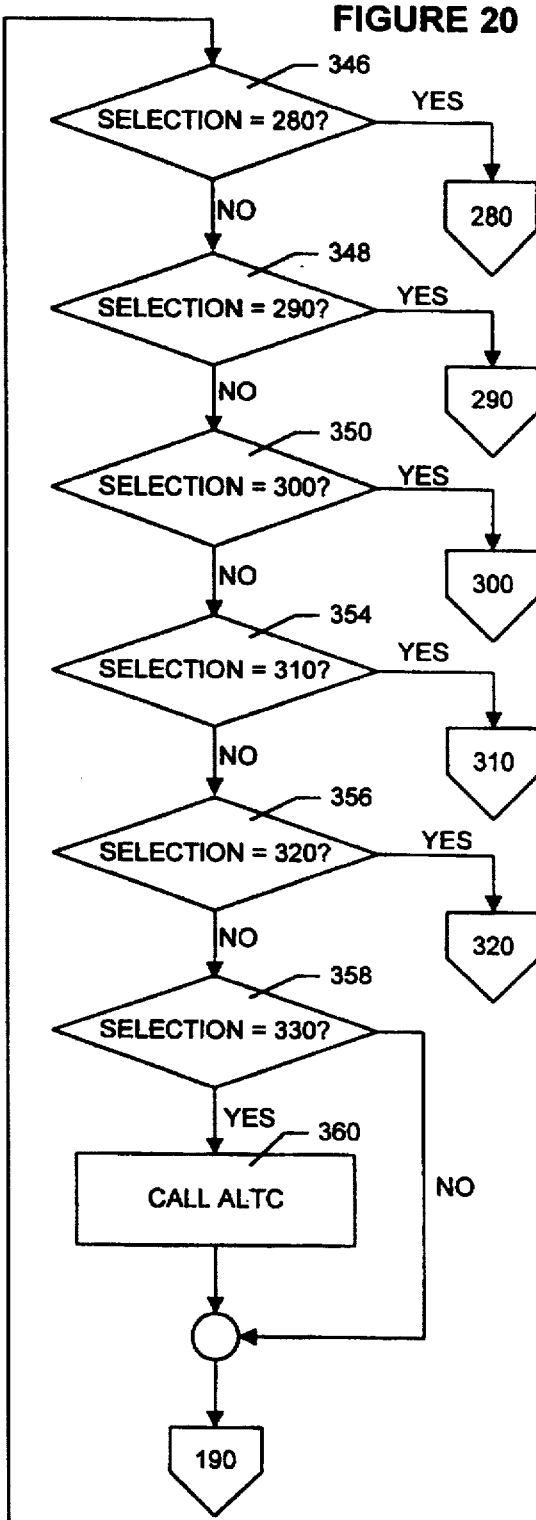
FIGURE 20

METHOD TO PROVIDE CONSISTENT ESTIMATED GROWTH AND YIELD VALUES FOR LOBLOLLY PINE PLANTATIONS

BACKGROUND OF THE INVENTION

FIELD OF THE INVENTION

This invention relates to a method to provide consistent estimated growth and yield values for loblolly pine plantations. More specifically, this invention is a method for predicting growth and yield, by simulating the development of stands of loblolly pine (*Pinus taeda* Linneaus) plantations in the southeastern United States.

One growth and yield model for loblolly pine plantations is the Baseline Loblolly Pine Model. The core equations of this model have a biological rationale: their structure is based on the concepts of foliar carrying capacity and size-density relationships. This structure makes the model equally well suited as a planning and inventory projection tool for forest managers or as a biological simulation tool for scientists in various disciplines. The model was fitted to data from the Seedling Phase of the Loblolly Pine Management Study, along with data from the USDA Forest Service spacing study on the old Calhoun Experimental Forest.

Remeasurement data from the Southern Woodlands Technical Department growth and yield plots, and from south wide university cooperatives were used in model validation. Basal area, number of trees, and product yields are projected either from stand establishment or existing stand conditions. Yield can be separated into desired product classes using a stand level yield ratio model or a Weibull diameter distribution model. For projection tree lists or stand tables, tree level growth and mortality are predicted so as to be compatible with the stand level core estimates. Proposed routines for the effects of thinning, fertilization, genetic improvement, and competing vegetation interact directly with model parameters to simulate the effects of intensive management practices.

The Baseline Loblolly Pine Model is a foundation for planning and inventory projection systems. The model's biological rationale and behavior inspires confidence among users. Equally important is the ability to obtain consistent estimates among all of the various applications for growth and yield data. For example, inventory projections can be consistent with long-term strategic yield expectations. The model can also be used to identify potential or target productivity for loblolly pine plantations and to measure performance toward increasing productivity. Harvest scheduling is a potential model application receiving growing attention, now that conversions from natural stands to plantations are nearly complete.

Besides its immediate utility, the model provides a structure for future technological advances. It has become a framework for further study. For example, the relationships between foliar biomass, sapwood basal area, and total basal area are already under investigation and will strengthen the model's theoretical basis. Mensurational refinements in site index and tree weight and volume methodology, also under way, can be incorporated directly into the model. The interrelated equations of the model can be used to test new statistical techniques such as simultaneous parameter estimation.

Accordingly, the purpose of this model is to develop a model of loblolly pine plantation growth and yield which is based on biological principles. The model provides consistent growth and yield estimates when applied at the stand, size class, and individual tree levels. The model is able to project existing stands and predict from bare ground conditions. The model, also, has the ability to simulate cultural and genetic alternatives. Accordingly, the model is applicable throughout the natural and extended range of the loblolly pine landbase.

There has been much discussion in the literature regarding the relative merits of stand level, size distribution and individual tree based models for forest growth and yield prediction. The Baseline Loblolly Model is integrated in resolution, but begins with the forest stand as the fundamental unit of productivity. The stand level refers to the theoretical definition (homogeneous and contiguous in terms of age, site quality, spacing, and management history). Operational stands do not always meet these criteria. The model is driven by biomathematical core stand level equations for basal area and survival, which behave according to ecological theory and physical constraints. Growth of individual trees, expressed as a tree list or stand table, is then estimated in a manner which is mathematically consistent with the stand level predictions.

For many applications, individual tree resolution in growth and yield predictions is unnecessary. In these instances, predictions of multiple product yields, computed from stand level parameters (including the biomathematical core estimates of basal area and survival), are available as model extensions. These stand level yield estimates are most appropriate for long-term projections, rather than updates of observed stand yield data.

Another available model is the Stand Establishment Model. This model describes the first approximation to a plantation establishment model for loblolly pine plantations, primarily in Southern Woodlands. Where possible, responses to establishment alternatives are specified in terms of biological model parameters such as height, site index, and establishment density. The response mechanisms (methods by which the baseline growth and yield model is adjusted) and the response values (amounts by which parameters are adjusted) were determined using a combination of data, experience, and published information. As data becomes more available for addressing questions of biological response and treatment interaction, this model may be compared to these data and refined. An example of such a comparison is presented. The model serves to quantify many research results in terms of timber yields.

These models referred to hereinabove illustrate the improvements made over the years in simplifying the planning and inventory of modeling responses of Loblolly Pine Plantations. There still exists, however, in this industry, a need for a method to provide short-term projections of existing stands, and to provide long-term yield predictions from bare ground. In addition, there exists a need to provide a method capable of acting as a simulation tool to provide insights into the life cycle of stands under varying conditions.

SUMMARY OF THE INVENTION

The present invention is implemented around the Baseline Loblolly Pine and Stand Establishment core models. These core models consist of stand-level equations for estimating basal area and number of trees surviving. The reference to a "stand" is according to its theoretical definition (homogeneous and contiguous in terms of age, site quality, spacing, and management history). Operational stands do not always meet this criterion. For all practical purposes, the invention model plots with operational stands rather than whole stands. Additionally, basal area and number of trees refer to all trees in the main canopy. In current "vocabulary", these are "stocking chart trees." These equations have a biological rationale, in that they are based on the concepts of foliar carrying capacity and size-density relationships.

These two concepts are related. An individual site is only able to support a given amount of foliage mass. This limit is known as the inherent quality of the site, and the mass varies depending on the inherent quality of the site, and the mix of plant species which is being supported.

As the carrying capacity limit is approached, the stand enters a state of self-thinning, in which the only way plants can increase in size is if the density (number of plants per unit area) decreases.

A young, dense stand composed of trees with small crowns may violate this law. Like most laws, there is a penalty associated with the violation. As the stand continues to grow, the small crowns become inadequate to support a tree's needs. The stand eventually "crashes", with widespread mortality. The survivor trees are stressed and lacking reserves or the ability to quickly take advantage of the increased growing space. Eventually, the stand may recover, if there are no catastrophic outside disturbances.

These models were also designed to provide equivalent estimates at a given point in a stand's development, regardless of the number of intermediate discrete steps taken to arrive at that point. For example, "growing" a stand from age 10 to age 30 in yearly increments, or making a jump of twenty years will provide the same estimates at age 30.

These attributes enable the invention to be used to provide short-term projections for inventory purposes, and to provide long-term yield predictions from bare ground. In addition, given its biological foundations, the invention may be used as a simulation tool to provide insights into the life cycle of stands, under varying initial conditions.

The conceptual model underlying the invention is based on an assumption that the stand's foliage mass is related to the cross-sectional area of its stems at breast height.

An important assumption in the models used for basal area and survival is that growth and yield on different sites may be predicted by substitution of an appropriate height-age curve. Height of the dominant-codominant trees at a specified age accurately predicts the carrying capacity of a given unit of the models.

In addition, it is assumed that the site index, as implied by the mean height of the dominant-codominant trees at a specified age, accurately predicts the carrying capacity of a given unit of land.

As a consequence of the previous assumptions, and remembering that the models are based on the concept of carrying capacity, the program is very sensitive to site index differences.

The invention performs calculations using the site index equation which was developed by Clutter and Lenhart (1968). As a limit of this chosen site index equation, the projected age of a stand cannot be less than eight years old.

The establishment density ("Trees Established" in the Control Panel) for estimating target conditions from bare ground assumes uniform spacing. If the stand has "patchy mortality", target yields will be overestimated, especially for sawlogs.

Accordingly, the invention provides an easy-to-use method of containing consistent growth and yield values at varying levels of resolution (stand, size-class) for loblolly pine plantations in the southern United States. The invention is able to make projections of estimated values using either existing stand data, or predicted from bare-ground conditions. The invention evaluates stand performance, based on estimates of potential or "target" productivity yields. The invention provides long-term expected yields for strategic planning, and short term projections for inventory purposes. The invention can function as a simulation tool to provide insights into the life-cycle of a stand, under varying initial conditions. While most growth and yield models use an empirical, multiple regression, "best fits to the data" modelling methodology, the present invention is based upon a biomathematical modelling concept.

Accordingly, it is an object of the invention to provide consistent estimated and yield values for an agricultural plot, with a method comprising the steps of: calling initial values for the plot; calling current values and program settings; determining if a model currently exists so that calculations are from bare ground and proceeding to next subsequent step, otherwise proceeding with next subsequent step; setting basic values by searching for age of plantation in years, trees (or biomass) per acre surviving, and basal area, wherein values for basal area are projected from bare ground when no value is supplied; calling initial values for stand; calculating height of dominant and codominant trees; determining if values are for bare ground calculations, otherwise calculating relative spacing, calculating quadratic mean diameter, calculating percent stocking and continuing with next subsequent step; if values are for bare ground, determining if values are for establishment model, otherwise setting basal area carrying capacity site index equal to site index and continuing with next subsequent step; if values are for establishment model, continuing with next subsequent step, in which other subroutines are called by projecting to target conditions at given age; determining if an establishment model is utilized and, if the establishment model is utilized, setting bare ground equal to true, otherwise continuing with the next subsequent step; calculating basal area; determining if basal area in square feet per acre is greater than zero and, if said basal area in square feet is greater than zero, calculating quadratic mean diameter, calculating number of stems per acre, calculating basal area, and continuing to the next subsequent step; otherwise, continuing to the next subsequent step; outputting parameters, generating diameter distribution and calculating stand-level yields; determining if the establishment model is being used and, if so, adjusting for cultural and genetic effects and continuing with the next subsequent step; otherwise continuing with the next step; calculating mean annual increment of merchantable dry tons; determining whether values are to be captured and, if values are to be captured, outputting parameters; outputting parameters for at least one of the variables; and projecting consistent estimated and yield values for the plot including height of dominant and codominant to new age, basal area and per acre to new age.

Another object of the invention is to include a step of calling said initial values of the plot to further include the steps of fetching at least one of the following: base site index, cultural/genetics adjustments, coefficient of variation for 0.01 acre survival plots, diameter limits, default age when beginning, calculated site index base age twenty-five years, baseline percent survival, number of trees established, trees planted, background color, foreground color, intensity attribute, blink attribute, cultural/genetic values display, unit number of input, unit number of output, unit number of print file, bare ground, send calculations to the print file, use default values, project from bare ground, print file, user identification field for capture file, and name of capture file for use with another method.

Another object of the invention is to have a step of calling current values and program settings to further include the step of fetching at least one of the following: adjusted coefficient of variation for 0.01 acre survival plots based on cultural/genetic effects, adjusted survival based on cultural/ genetic effects, years gained from cultural/genetic effects, basal area carrying capacity, site index to use for basal area carrying capacity, base site index before cultural/genetics adjustments, array of cultural/genetics adjustments, coefficient of variation for 0.01 acre survival plots, diameter limits, default age when beginning, calculated site index, percent hardwood basal area after crown closure, mean height dominant-codominant trees as projected by the Site Index equation, percent height gain from cultural/genetics, calculated site index base age twenty-five years, baseline percent survival, number of trees established, trees planted, uniformity reduction with coefficient of variation for 0.01 acre survival plots adjusted by cultural/genetic effects, percent of stand area in windrows from cultural/genetics, background color, foreground color, array for cultural/genetic values display with highlighted values recommended for adjustment effects, no change was necessary, unit number of output, send calculations to the print file, the default values, project from bare ground, user identification field for capture file, name of capture file for use with another method, and error message.

It is another object of the invention to include a step of calling initial values for stand which further includes the step of fetching at least one of the following parameters: age of plantation in years, basal area in square feet per acre, trees per acre surviving, background color, foreground color, from bare ground, and project from bare ground.

An object of the invention is to include a step of calling other subroutines by projecting to target conditions at given age by utilizing at least one of the following variables: site index for basal area carrying capacity, number of trees established using age one survival per acre, height of dominant-codominants at previous age, mean height in feet of dominant-codominant trees as projected by a site index equation, quadratic mean diameter in inches at breast height (i.e., 4.5 ft. from groundline), percent stocking, relative spacing, basal area in square feet per acre, trees per acre surviving, any bare ground values, and error message.

A still further object of the invention is to include a step of outputting parameters which includes outputting at least one of the following variables: age of plantation in years, basal area in square feet per acre, trees per acre surviving, quadratic mean diameter at breast height (dbh) in inches, mean height in feet of dominant-codominant trees as projected by the predetermined site index equation, relative spacing, percent stocking, background color, and foreground color.

Another object of the invention is to include steps for generating diameter distributions and calculating stand-level yields which include generating at least one of the following variables: trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre calculated using the Doyle Log Rule (hereinafter "Doyle"), 1000 board feet per acre calculated using the Quarter Inch International Log Rule (hereinafter "QII"), 1000 board feet per acre using the Scribner Log Rule (hereinafter "Scribner"), and error message.

An object of the invention is to have a step of determining whether values are to be captured and, if values are to be captured, outputting parameters which include generating at least one of the following variables: unit number for output, user identification field for capture file, sawtimber dry weight, trees planted, number of trees established with age one survival per acre, coefficient of variation for 0.01 acre survival plots, uniformity reduction with coefficient of variation for 0.01 acre survival plots adjusted by cultural/ genetics, basal area carrying capacity, age of plantation in years, basal area in square feet per acre, trees per acre surviving, quadratic mean dbh in inches, mean height in feet of dominant-codominant trees as projected by the predetermined site index equation, array of diameter limits, total yield in given tons per acre, merchantable yield in green tons per acre, trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using Doyle, 1000 board feet per acre using QII, 1000 board feet per acre using Scribner, and continuing to the next subsequent step, otherwise continuing to the next subsequent step.

It is an object of the invention to include a step of outputting parameters which further includes at least one of the following variables: array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using Doyle, 1000 board feet per acre using QII, 1000 board feet per acre using Scribner, and mean annual increment of merchantable dry tons.

It is an object of the invention to include steps of calling initial values of the plot to include at least one of the following: base site index, cultural/genetics adjustments, coefficient of variation for 0.01 acre survival plots, diameter limits, default age when beginning, calculated site index base age twenty-five years, baseline percent survival, number of trees established, trees planted, background color, foreground color, intensity attribute, blink attribute, cultural/ genetic values display, unit number of input, unit number of output, unit number of print file, bare ground, send calculations to the print file, are we using the default values, project from bare ground, does the print file already exists, user identification field for capture file, and name of capture file for use with another method, calling current values and program settings to include at least one of adjusted coefficient of variation for 0.01 acre survival plots based on cultural/genetic effects, adjusted survival based on cultural/ genetic effects, years gained from cultural/genetic effects, basal area carrying capacity, site index to use for basal area carrying capacity, base site index before cultural/genetics adjustments, array of cultural/genetics adjustments, coefficient of variation for 0.01 acre survival plots, diameter limits, default age when beginning, calculated site index, percent hardwood basal area after crown closure, mean height dominant-codominant trees as projected by the site index equation, percent height gain from cultural/genetics, calculated site index base age twenty-five years, baseline percent survival, number of trees established, trees planted uniformity reduction with coefficient of variation for 0.01 acre survival plots adjusted by cultural/genetic effects, percent of stand area in windrows from cultural/genetics, background color, foreground color, array for cultural/genetic values display with highlighted values are recommended adjustment effects, no change was necessary, unit number for output results, send calculations to the print file, are we using the default values, project from bare ground, user identification field for capture file, name of capture file for use with another method, and error message; determining if establishment model is to be used so that calculations are from bare ground and proceeding to next subsequent step, otherwise proceeding with next subsequent step; setting basic values by searching for age of plantation in years, trees per acre surviving and basal area wherein values for basal area are projected from bare ground when blank; calling initial values for stand including at least one of the following parameters age of plantation in years, basal area in square feet per acre, trees per acre surviving, background color, foreground color, from bare ground, project from bare ground, calculating height of dominant-codominant trees, determining if values are for bare ground calculations, otherwise calculating relative spacing, calculating quadratic mean diameter, calculating percent stocking and continuing with next subsequent step, if values are for bare ground, determining if values are for establishment model otherwise setting basal area carrying capacity site index equal to site index and continuing with next subsequent step, and if values are for establishment model, continuing with next subsequent step, calling other subroutines by projecting to target conditions at given age, utilizing at least one of the following variables: site index to use for basal area carrying capacity, number of trees established using age one survival per acre, height of dominant-codominants at previous age, mean height in feet of dominant-codominant trees as projected by a site index equation, quadratic mean dbh in inches, percent stocking, relative spacing, basal area in square feet per acre, trees per acre surviving, any bare ground values, error message; determining if an establishment model is utilized and if the establishment model is utilized, setting bare ground equal to true, otherwise continuing with the next subsequent step; calculating basal area in pine & hardwood; determining if pine basal area in square feet per acre is greater than zero and, if said pine basal area in square feet is greater than zero, calculating quadratic mean diameter, calculating trees per acre, calculating basal area and continuing to the next subsequent step, otherwise continuing to the next subsequent step, outputting parameters for at least one of the following variables age of plantation in years, basal area in square feet per acre, trees per acre surviving, quadratic mean dbh in inches, mean height in feet of dominant-codominant trees as projected by the predetermined site index equation, relative spacing, percent stocking, background color, and foreground color, generating diameter distribution and calculating stand-level yields by utilizing at least one of trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using Doyle, 1000 board feet per acre using QII, 1000 board feet per acre using Scribner, and error message, determining if the establishment model is being used and, if the establishment model is being used, adjusting for cultural and genetic effects and continuing with the next subsequent step; otherwise, continuing with the next subsequent step; calculating mean annual increment of merchantable dry tons; determining whether values are to be captured and, if values are to be captured, outputting values for at least one of the following variables: unit number for output, user identification field for capture file sawtimber dry weight, trees planted, number of trees established with age one survival per acre, coefficient of variation for 0.01 acre survival plots, uniformity reduction with coefficient of variation for 0.01 acre survival plots adjusted by cultural/genetics, basal area carrying capacity, age of plantation in years, basal area in square feet per acre, trees per acre surviving, quadratic mean dbh in inches, mean height in feet of dominant-codominant trees as projected by a predetermined site index equation, array of diameter limits, total yield in given tons per acre, merchantable yield in green tons per acre, trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip a saw dry weight, sawtimber dry weight, tops dry weight, total cubic feet per acre, merchantable cubic feet per acre, chip a saw cubic foot per volume, sawtimber cubic feet per acre, tops cubic foot volume, 1000 board feet per acre using QII, 1000 board feet per acre using Scribner, and continuing to the next subsequent step; otherwise, continuing to the next subsequent step; outputting values for at least one of the following variables: array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using QII, 1000 board feet per acre using Scribner, and mean annual increment of merchantable dry tons; and projecting consistent estimated yield values for a plot of trees including height of dominant-codominant trees to new age, basal area and trees per acre to new age.

An object of the invention is to have steps of: initializing variables to defaults and saved settings; setting cursor scan lines for avoiding a disappearing cursor problem; setting a BREAK status to OFF to disable Ctrl-Break (Ctrl-C) aborts; checking for a command line parameter and, if present, looking for a file with that name and, if it exists, reading its default values, and skipping around the next step; if a command line parameter was not supplied, looking for a predetermined file, if it exists, using it for default values, and skipping to end of subroutine; checking if the command line pathname is valid; reading the settings from the file; using the default settings; adjusting basal area in square feet per acre, carrying capacity, site index; setting top diameter limits; setting minimum dbh limits; setting maximum dbh limits; setting pulpwood maximum dbh equal to sawtimber minimum dbh; turn on highlighting for recommended response categories in the cultural/genetics response adjustment matrix; opening file channels; turn on keyboard buffering and clock display; setting pulpwood maximum dbh equal to sawtimber minimum dbh; and writing the values out to the predetermine file, if it does not exist.

Another object of the invention is to include the steps of opening the capture file for use and, if it does not exist, then creating it, opening it, and adding column headings to it.

It is an advantage of the invention to include the steps of displaying current values of program settings, asking if changes are to be made, indicating sawtimber does not have a specifiable maximum limit, blanking out the prompt message, and subsequently finish writing the display.

It is an advantage of the invention to include the steps of: obtaining initial values for stand; determining whether the basal area in square feet per acre or trees per acre surviving are entered, otherwise projecting from bare ground; getting the initial stand age; checking for errors, and printing message; blanking out any error message; getting the initial stand basal area, if not entered, assume bare ground, and projecting to target stand; using key codes to determine whether or not a particular keystroke is within a class that is void and, if so, processing the keystroke, otherwise ignoring the keystroke or constructing an error message and returning control (e.g. typing 1=Numeric keys, blanking out the "press <enter> to project from bare ground" message, typing 5=Control characters (ASCII 1–31), blanking out the "press <enter> to project from bare ground" message); blanking out any error message; determining if basal area was entered; reading trees per acre; checking for errors; printing message; and blanking out any error message.

Another advantage of the invention is to include the steps of: calling the routines listed in the external subroutines section; computing the quadratic mean diameter, percent stocking, and relative spacing; determining data from bare ground projection by calculating the basal area and trees per acre; receiving the data and indicating that bare ground is false; declaring variables; determining if mean height in feet of dominant-codominant trees as projected by the site index equation equals height of dominant-codominants at previous age and the data is not from bare ground; calculating stand-level model parameters; performing the intermediate calculations for basal area in square feet per acre and survival equations; calculating the basal area growth; calculating surviving trees per acre; determining crash factor of grown stand; checking for errors in computed values returned by other modules; initializing error message variables; calculating quadratic mean diameter; and calculating percent stocking.

Another advantage of the invention is including the steps of displaying values at their proper location on the screen and blanking out the unknown variables' previous value.

A further advantage of the invention is to include the steps of: displaying the final portion of the calculated values on the screen; filling in the values at the appropriate locations for total green weight, dry weight and cubic feet to include merchantable pulp, chip & saw, and sawtimber for each of total yield in green tons per acre, total dry weight, total cubic feet per acre, merchantable yield in green tons per acre, merchantable dry weight, merchantable cubic feet per acre, chip & saw green weight, chip & saw dry weight, chip & saw cubic foot volume, sawtimber yield in green tons per acre, sawtimber dry weight, and sawtimber cubic foot volume; calculating pulp values as merchantable minus sawtimber, wherein the currently used dry-weight equation is invalid for sawtimber, if the top-diameter is larger than eight inches; calculating cord values as seventy-five cubic feet of solid wood; and multiplying by one thousand to give total board feet.

A further advantage of the invention is the step of displaying the first text portion of the control panel by putting the first text portion of the control panel on the screen.

Another advantage of the invention is the step of displaying the second part of control panel by putting the second text portion of the control panel on the screen.

A still further advantage of the invention is the step of writing values to an output file.

An advantage of the invention resides in the steps of controlling the calling order of the modules denoted in the subroutines section; utilizing external subroutines to compute the Weibull distribution; computing stand level yield; declaring variables; recovering the Weibull distribution scale and shape parameters; calculating stand-level yields from diameter distribution based on parameters from the Weibull distribution; and displaying variable labels and current values of variables.

It is an advantage of the invention to include steps of: getting values for settings variables; displaying variable labels and current values of variables; prompting for new value settings; saving calculations to a print file; blanking out the filename prompt; getting specified user identification name for capture file; checking for stand establishment model; getting pulpwood top diameter; getting pulpwood minimum dbh; getting chip & saw top diameter; getting chip & saw minimum dbh; getting chip & saw maximum dbh; getting sawlog top diameter; getting sawlog minimum diameter; setting pulpwood maximum diameter equal to sawtimber minimum diameter; getting site index base age twenty-five; getting number of trees established at age one; using the calculator; writing the current settings to a file; and adjusting stand establishment model settings.

Another object of the invention is to have a step of determining total stem volume (inside the bark) or merchantable volume from dbh and total height by performing the following steps: initializing variables; checking input variables for invalid values; building at least one error message; and calculating volume.

A further advantage of the invention is to include steps of providing an equation which calculates total stem dry weight inside the bark and, if top diameter is not equal to zero, then calculating merchantable dry weight using total stem estimate and a Flowers' ratio equation by performing the following steps: initializing variables; checking input variables for invalid values; building error message or messages; calculating dry weight of the total dry weight in pounds inside bark; and determining if top diameter is specified (i.e., >0), then calculating dry weight as merchantable dry weight using equation by Flowers.

It is an advantage of the invention to include steps of: calculating Girard's form class which is the ratio of the diameter at the top of the first log to dbh, for an individual planted loblolly pine from an unthinned, unfertilized stand by performing the following steps: developing an equation for unfertilized, unthinned, planted loblolly pine; using trees with an age>7 years, dbh>4.5 inches, and total height>24 inches; initializing variables; checking input variables for invalid values and building error message or messages;

determining if ERROR is true; and setting the output values to zero, otherwise performing the calculations.

It is an object of the invention to describe a step of reducing proportion of sawtimber trees for a given dbh class by performing the following steps: declaring variables; initializing variables; checking input variables for invalid values; and building an error message or messages.

It is an object of the invention to describe a step of displaying error messages.

A further object of the invention is to have steps of determining basal area growth by performing the following steps: declaring variables; initializing variables; checking input variables for invalid values; building an error message or messages; and computing basal area in square feet per acre if no errors or warnings.

Another object of the invention is to include a step of computing board foot volume for one log, according to Doyle, by performing the following steps: declaring variables; initializing variables; checking input variables for invalid values and building an error message or messages; and calculating Doyle board feet.

It is an object of the invention to describe a step of computing board foot volume for one log, according to QII by performing the following steps: declaring variables; initializing variables; checking input variables for invalid values; building an error message or messages; and calculating International board feet.

Another advantage of the invention is to include a step of computing board foot volume for one log according to a least squares equation, which approximates Scribner, by performing the following steps: declaring variables; initializing variables; checking input variables for invalid values; building an error message or messages; and calculating Scribner board feet.

A further advantage of the invention is to include a step of opening non-existent settings files by writing the default settings to the file, along with identifiers for each value.

It is an advantage of the invention to include a step of updating the establishment model settings by writing the accumulated value for the response.

A still further advantage of the invention is to include a step of obtaining a character string from an input according to the following steps: displaying the field width in reverse video, and inserting the current value of the string; positioning the cursor at the beginning of the field, awaiting input; providing the variable keyboard scan code which has the following meanings:

0=all characters are allowed, including control and graphics,
1=check for DOS filename protocols, but no pathnames,
2=allow only normal ASCII characters (32–126),
3=check for DOS filename and pathname protocols,
4=Yes/No answer;

setting ASCII Code 13=<Enter> key (Carriage Return); and checking if anything other than a carriage return is entered.

A further object of the invention is to include a step of calculating individual tree green weight equation for plantation-grown loblolly pine by performing the following steps: declaring variables; initialize variables; checking input variables for invalid values; building error message or messages; calculating green weight; and calculating merchantable green weight, using the top diameter, to compute a ratio, wherein if the top diameter equal to zero, then ratio equal to one and green weight is returned as the total green weight.

Another object of the invention is to describe steps of calculating crash factor and relative spacing wherein the crash factor reduces basal area in high-density stands by performing the following steps: setting the relative spacing is the ratio of inter-tree distance to mean height of dominant-codominant trees; imposing a lower limit on the crash-factor; fitting the data wherein if the minimum value encountered is about 0.64, choose value of 0.6; declaring variables; initializing variables; checking input variables for invalid values and build error message or messages; calculating relative spacing and crash-factor, where 0.6<=crash-factor<=1.0; testing the value to be used in the exponential function, to prevent floating point exceptions; and determining if OK, then calculating and testing for the crash factor lower limit, otherwise just set crash factor equal to lower limit.

An advantage of the invention is to include a step of evaluating the expression for the second non-central moment of the Weibull distribution when the location parameter and the 93rd percentile are known by performing the steps of: declaring variables; initializing variables; checking input variables for invalid values; building an error message or messages; and calculating the shape, scale, and moment.

It is an advantage of the invention to include a step of determining the total height for plantation-grown loblolly pine according to the following steps: declaring variables; initializing variables; checking input variables for invalid values; building an error message or messages; and calculating total height.

It is an advantage of the invention to have a step of calculating percent stocking according to the following steps: declaring variables; initializing variables; checking input variables for invalid values; building an error message or messages; and calculating percent stocking.

Another object of the invention is to have a step of predicting survival by projecting the number of trees from one time (using height of dominant-codominants as a surrogate) to another time according to the following steps: declaring variables; initializing variables; checking input variables for invalid values; building an error message or messages; and calculating trees per acre surviving.

Another advantage of the invention is to include steps of receiving an integer from an input for displaying the field width in reverse video, and inserting the current value of the variable; after which the cursor is positioned at the beginning of the field, awaiting input.

Another object of the invention is to include steps of receiving values for the cultural/genetics response adjustment matrix according to the following steps: assigning limits of the cultural/genetic adjustment matrix; assigning keyboard scan codes for the cursor control keys; assigning keyboard scan codes for the escape key; displaying the value of the current cell; waiting for a keystroke to be entered, then determine its type, wherein Type 0=Extended key functions, Type 1=Numeric keys (and signs); adjusting the position to the lightbar wherein Type 2=Alpha (ASCII 32–126); and adjusting the position of the lightbar wherein Type 3=Math symbols and brackets, Type 4 =Graphics characters (ASCII 128–254), Type 5=Control characters (ASCII 1–31), ASCII Code 27 is escape, so exit, ASCII Code 13 is carriage return, so adjust position of lightbar, Type 6=Cursor movement keys.

It is an object of the invention to include a step of obtaining a double precision value from the input by displaying the field width in reverse video, and the current value is inserted wherein Type 5=Control characters (ASCII 1–31), and <Enter> key was not pressed.

It is an advantage of the invention to include steps of calling a pop up calculator for performing the steps of: calculating site index base age twenty-five, trees per acre surviving, and percentages; turning the keyboard buffer off; saving current text in window area for calculator; clearing the window, and drawing a box around the window; restoring text to screen; turning keystroke buffer back on, and exit; calculating calculated site index, given age of plantation in years and height of dominant-codominant tree or trees; calculating trees per acre surviving, given spacing within rows and between rows; and calculating a percentage value.

Another object of the invention is to describe steps of evaluating variables using defaults or values supplied according to the following steps: evaluating variables, using defaults, or values supplied at run-time; adjusting percent survival, based on genetic/cultural values; calculating trees established at age one; calculating uniformity reduction, if the adjusted coefficient of variation for 0.01 acre survival plots at age one is greater than zero; checking the uniformity reduction so it is not greater than 1.0, or less than 0.0; adjusting for age gain; adjusting for height gain from genetics improvement; adjusting basal area carrying capacity site index, using height gain (%) and calculated site index with a base age of 25 years adjusted; and calculating the basal area carrying capacity.

Another advantage of the invention is to describe steps of estimating taper reduction for calculating diameter inside bark at the top of the each sixteen foot log wherein up to six logs with up to forty inch diameter (at the base) can be handled according to the following steps: declaring variables; initializing variables; checking input variables for invalid values; building an error message or messages; and calculating the taper of the log.

A further object of the invention is to include steps of performing intermediate computations using stand-level model parameters for the basal area and survival equations of the loblolly pine plantation growth and yield model according to the following steps: determining if bare ground=true and, if bare ground=false but basal area has not been measured, entering the number of trees established at age one survival per acre to project basal area as if from bare ground, while projecting survival from its observed value; determining if the number of trees established at age one survival per acre defaults to 600; determining if both initial basal area and initial survival are entered (that is, greater than zero) and bare ground is false, so that the number of trees established at age one survival per acre is ignored; declaring variables; initializing variables; assigning values for model parameters; checking input variables for invalid values; building an error message or messages; computing parameters for basal area in square feet per acre; determining bare ground projection by computing for basal area in square feet per acre model and for trees per acre surviving model based on number of trees established at age one survival per acre; determining inventory projection by computing for basal area in square feet per acre model based on initial basal area in square feet per acre model and initial mean height in feet of dominant-codominant trees as projected by the site index equation; computing for trees per acre surviving model based on initial trees per acre surviving and initial mean height in feet of dominant-codominant trees as projected by the site index equation; determining if initial basal area in square feet per acre is greater than or equal to a carrying capacity; decreasing basal area in square feet per acre so that basal area in square feet per acre is 99%; determining if input basal area in square feet per acre is zero; projecting basal area in square feet per acre as if a bare ground projection; using estimate of establishment density number of trees established with age one survival per acre, wherein the number of trees established with age one survival per acre will default to 600 trees per acre if it was not specified; and estimating initial mean height feet of dominant-codominant trees as projected by the site index equation≦HIP, T1 and T2 as if from bare ground, where number of trees established with age one survival per acre is estimated from initial trees per acre surviving and initial mean height in feet of dominant-codominant trees as projected by the site index equation.

A further advantage of the invention is to describe steps of calculating either site index or mean height in feet of the dominant-codominant trees as projected by the site index equation, depending on which has a value of zero or less, wherein the calculation utilizes a modified Clutter and Lenhart site index curve according to the following steps: declaring variables; initializing variables; assigning values for model parameters; checking input variables for invalid values; building an error message or messages; performing calculations; calculating height of dominant-codominant trees wherein for ages of 13 years and greater, using the Clutter and Lenhart height predictions, and for ages less than 13 years, defining the curve by an allometric form of the Richards function, in which the equation is forced through three points, the origin, and the Clutter and Lenhart height predictions at ages 12 and 13 years; calculating site index wherein if age of plantation in years is greater than 12, use Clutter and Lenhart equation, and if less than 12, performing an iterative bisection on the range 30 to 110, until predicted height is within 0.1 foot of the true height; and bisecting and iterating.

It is an object of the invention to include steps of: receiving Weibull parameters; computing stand-level yields from three threshold dbhs for three different top diameters; calling for prediction of total height, individual tree green weights, dry weights, cubic foot volume, 1000 board feet per acre using Doyle, 1000 board feet per acre using QII, and 1000 board feet per acre using Scribner; corresponding the three values for threshold dbh and top diameter to three different yield classes; outputting yields corresponding to the first class (merchantable yield in green tons per acre, merchantable dry weight, merchantable cubic feet per acre) for all material larger than threshold dbh (1) and top diameter (1), wherein the second class includes chip & saw, chip & saw dry weight, chip & saw cubic foot volume and is for all material larger than threshold dbh (2) and top diameter (2) but smaller than threshold (3) and top diameter (3), and the third class is the largest material (sawtimber) and excludes the others; reducing frequency of trees larger than threshold dbh (3) by removing, changing, or modifying, the third value of threshold dbh and top diameter (input to correspond to any desired product definition); assuming the material to be sawtimber, setting diameter increment equal to 1 inch for accuracy and efficiency; defining class limits as (0, DX, 2*DX, 3*DX, 4*DX, 5*DX, . . . ); using the class midpoints, ([i*DX+(i+1)*DX]/2), for the accumulation of basal area and yield; processing classes into infinity according to the definition of the Weibull, but for practicality imposing a stopping condition when a class is reached with less than 0.15 trees per acre surviving; picking up exactly one inch (not one class) and placing the remaining trees at that point; specifying values for threshold dbhs so that their precision is compatible with DX, otherwise merchantable yields will be biased; determining if accumulated basal area and input trees per acre surviving imply that the quadratic mean dbh is different from its input value then issuing a warning; determining if the input Weibull parameters were recovered from stand parameters so this condition would never occur; providing yields for any Weibull parameter values; initializing variables; assigning values for model parameters; checking input variables for invalid values and building an error message or messages; marking the fallback position, in case there are too many inputs≦0, so the error message can be modified; checking if there is room to complete normal error message about≦0, otherwise replacing with a "Multiple . . . " error message, but do not overwrite any message about mean diameters being unequal; performing calculations; flagging the stopping criterion, after which one last pass is made with left-over probability placed in the right tail exactly one inch back from the current unused value of X; accumulating basal area check sum, and calculating total yield values; calculating merchantable values, wherein dry weight equation is invalid if top diameter is>8.0 inches; calculate chip & saw values; calculating saw log values by reducing proportion of sawtimber trees wherein dry weight equation is invalid if sawtimber top diameter is>8.0 inches; and incrementing diameter, wherein all probability has been accounted for, and determining if not, building a warning message.

It is an advantage of the invention to have steps for evaluating the Gamma function using a polynomial approximation for values greater than zero according to the steps of: determining if the argument to the function is a value which may cause a floating point error, so the evaluation will not be performed, wherein the function arguments which may cause an error condition are in categories defined as zero (divide by zero error), values greater than about 57 (floating point overflow error), and negative values; determining if the value to be evaluated falls within one of the categories, wherein the function result is set to zero, which the Gamma function will never evaluate to, and passing control back to the calling routine; checking for invalid input, wherein the function is undefined for zero; determining if ARG=0, wherein the function returns 0, and if ARG has a value greater than 57, floating point overflow may occur, so the function returns 0; determining if ARG is a cardinal number, GAMMA(ARG)=ARG! (factorial), wherein the absolute value of the error of the polynomial approximation equation is≦3*10$^7$; declaring variables and parameters; initializing variables; and checking for argument value which may cause a floating point exception.

It is an advantage of the invention to have a step of estimating individual tree board feet based on log rule definitions, with upper log taper based on equations developed from predetermined tables and sawtimber height from a taper equation previously derived from Flowers' volume ratio equation, for plantation loblolly pine according to the following steps: determining if the sawtimber height is greater than six logs, then calculating the board feet for six logs only; determining if the dbh is greater than forty inches, then calculating with the value of forty inches for the scaling diameter; declaring variables; initializing variables; checking input variables for invalid values and building an error message or messages; calculating saw timber height, using Flowers' equation; checking that there is at least one sixteen foot log and not more than six logs; determining if there are more than six; estimating form class; assuming that the stump subtracts one half foot, then dividing up the stem into sixteen foot logs plus an eight foot half log if there is that much left over; calculating forty percent of dbh here, rather than each pass through loop; looping through each log in the tree to compute board foot per log; determining if there is an extra half-log, also looping through another tree, one with an extra whole log, and using the mean board foot of the two trees; calculating taper of the log; checking for problems which arise from the way taper and dbh are calculated; calculating the board feet for sixteen-foot log, using equations for Doyle, International, and Scribner; and calculating mean board feet for a tree with a half-log.

It is an object of the invention to describe a step of recovering the shape and scale parameters of the Weibull distribution using the second noncentral moment quadratic mean dbh and the 93rd percentile according to the following steps: using a combination of the bisection and secant methods to solve for the shape parameter, restricting to lie between a range of one and ten; determining if the solution implied by the inputs lies outside the range, perturbating a 93rd percentile of dbh in increments of 0.1 until bracketing a solution by one and ten; determining if the prediction of the 93rd percentile is adjusted during the calculations, creating a warning message; declaring variables; initializing variables; checking input variables for invalid values and building an error message or messages; calculating the 93rd percentile; insuring that SHAPEL and SHAPEU bracket the solution, and if not, adjusting the 93rd percentile as necessary; doing five bisection iterations to get started; beginning secant iterations, maximum of 100, and if no convergence, return non-convergence parameters and implied value of quadratic mean dbh; indicating no convergence by secant method; adjusting prediction of 93rd percentile; and indicating a solution cannot be found, even after adjusting the 93rd percentile.

A further object of the invention is to have a step of displaying stand establishment model settings according to the following steps: displaying variable labels and text; waiting for a keystroke; checking if it is Alt-C, and if so, pop up the calculator; setting ASCII code of 13 to carriage return, treat as zero, and exit; getting base site index; getting trees planted; getting percent survival; getting coefficient of variation for 0.01 acre survival plots at age one; and getting values for the cultural/genetics response adjustment matrix.

Further objects and advantages of the invention will become apparent from a consideration of the drawings and ensuing description.

BRIEF DESCRIPTION OF THE DRAWINGS

FIGS. 19–32 illustrate the get values for settings variables flow diagram of the present invention.

DESCRIPTION OF THE INVENTION

Figure 1:
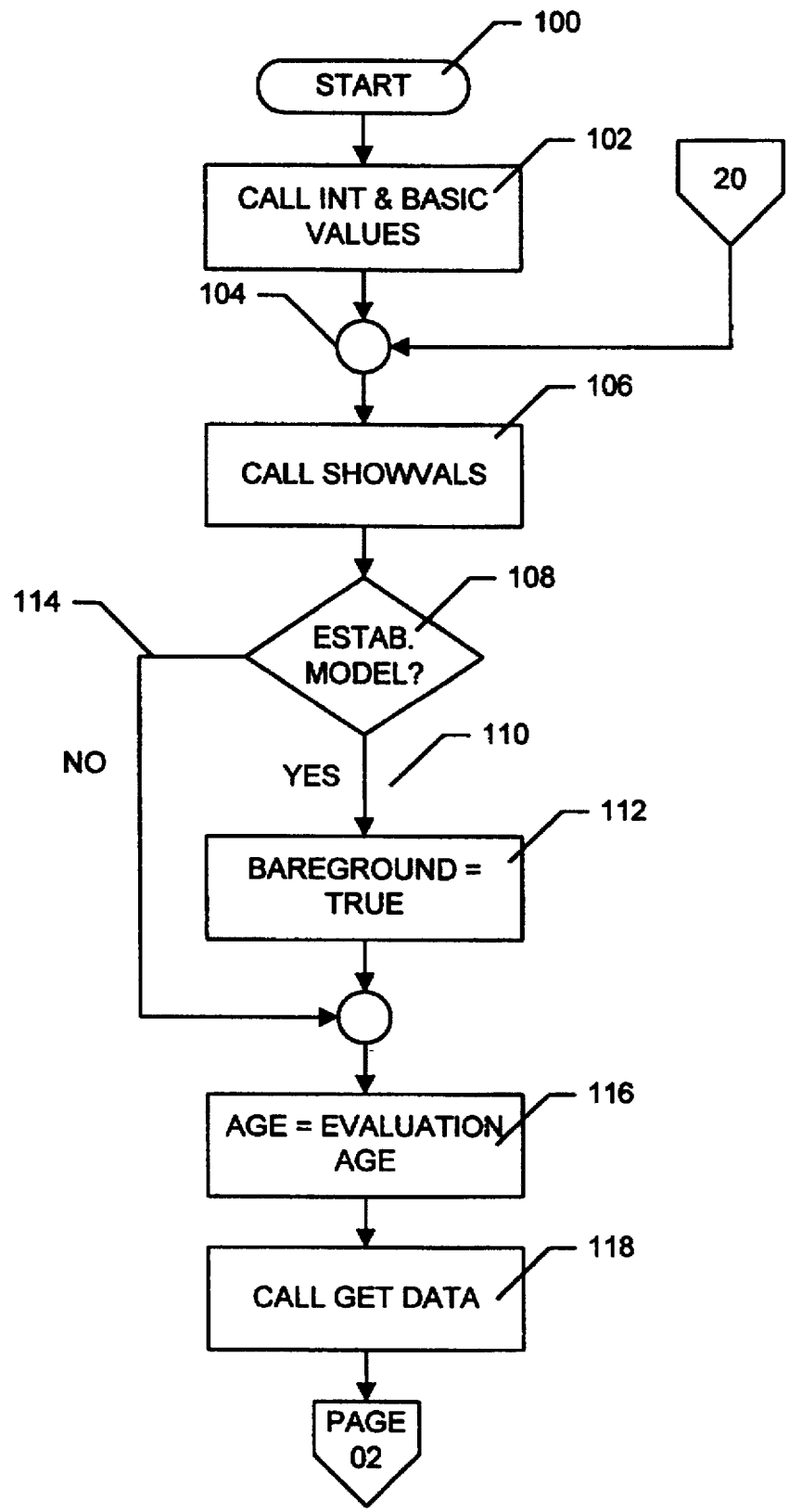
FIGS. 1–6 illustrate the main flow diagram for the method of the present invention.
Figure 2:
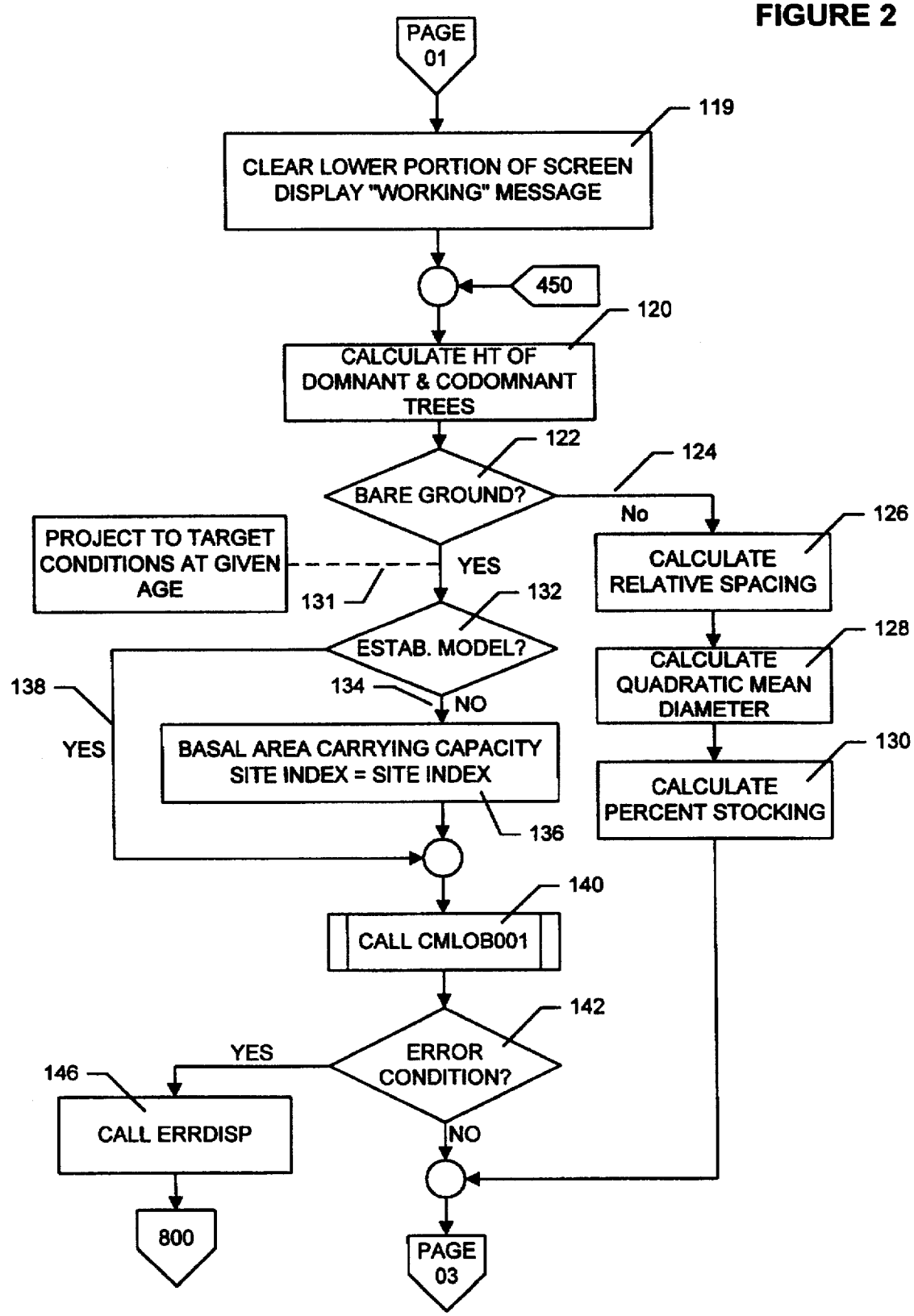

FIGS. 1–6 illustrate the main flow diagram for the method of the present invention. Data from long-term designed spacing studies played a key role in both the conceptual development and in fitting the parameters. The first dataset is the Seedling Phase of the Loblolly Pine Management Study, which includes six square spacing treatments ranging from 4 to 14 feet. There are two to three blocked replications of the study at each of three locations on cutover land in the South Carolina Coastal Plain and Piedmont, representing site index classes of approximately 50, 65 and 75 feet (base age 25). The three locations were selected according to the site index (base age 50) of the previous natural stand; these values were 70, 90 and 110, respectively. The locations are hereafter called LPMS-70, LPMS-90 AND LPMS-110.

Measurements have occurred at 5-year intervals from age 10 through age 20 or 25, with additional younger or intermediate measurements available in some instances. Additional measurement in later years can be used to refine model parameters.

A second important source of data was the USDA Forest Service spacing study established on the old Calhoun Experimental Forest near Union, S.C. The study (which is hereinafter referred to as the Calhoun study) remains active, though the Experimental Forest is not. The Calhoun study includes four square spacings ranging from 6 to 12 feet. It was installed on a single old-field site, but exhibits considerable variation in site quality among four blocked replications, with site index (base age 25) ranging from 55 to 72 feet.

Because of the similarities in the LPMS and Calhoun studies, their data were combined for development purposes, except where individual tree growth data were required. (Individual trees were not numbered consistently in the LPMS data from year to year.) For convenience, the combined data set is called "the spacing study data." The range in site quality in the combined data set closely approximates the range in site quality encountered in loblolly pine plantations in South Carolina. These data were used as the primary fitting data.

Validation data to test performance as an inventory projection tool came from operational loblolly pine plantations. In the following description, "basal area" and "number of trees" refer to all trees in the main canopy. In addition, unless otherwise noted, it is assumed that stands are pure pine plantations without a hardwood component.

The method for providing consistent estimated and yield values for a plot of trees begins with the start 100 in FIG. 1.

In step 102, the variables are initialized by calling initial values of the plot to include at least one of the following: base site index, cultural/genetics adjustments, coefficient of variation for 0.01 acre survival plots, diameter limits, default age when beginning, calculated site index base age twenty-five years, baseline percent survival, number of trees established, trees planted, background color, foreground color, intensity attribute, blink attribute, cultural/genetic values display, unit number of input, unit number of output, unit number of print file, bare ground, send calculations to the print file, using the default values, project from bare ground, does the print file already exist, user identification field for capture file, and name of capture file for use with another method. Additionally, in step 102, the basic values are called which include: age of plantation in years, basal area in square feet per acre, and trees per acre surviving. If basal area in square feet per acre is blank, then this is a projection from bare ground. Accordingly, step 102 calls current values and program settings to include at least one of the following: adjusted coefficient of variation for 0.01 acre survival plots based on cultural/genetic effects, adjusted survival based on cultural/genetic effects, years gained from cultural/genetic effects, basal area carrying capacity, site index to use for basal area carrying capacity, base site index before cultural/genetics adjustments, array of cultural/genetics adjustments, coefficient of variation for 0.01 acre survival plots, diameter limits, default age when beginning, calculated site index, percent hardwood basal area after crown closure, mean height dominant-codominant trees as projected by the site index equation, percent height gain from cultural/genetics, calculated site index base age twenty-five years, baseline percent survival, number of trees established, trees planted, uniformity reduction with coefficient of variation for 0.01 acre survival plots adjusted by cultural/genetic effects, percent of stand area in windrows from cultural/genetics, background color, foreground color, array for cultural/genetic values display with highlighted values, no change necessary, unit number of output, send calculations to the print file, using the default values, project from bare ground, user identification field for capture file, name of capture file for use with another method, and error message.

In step 104, initializing has been completed so that the flow will come back to step 104 for the next run and any further runs.

Step 106 allows the opportunity to show default/current settings. It is at this point that a change can occur, if desired.

At decision step 108, the flow asks and determines if the Establishment Model is in effect because, if that model is to be used, as indicated by branch 110, then all calculations are from bare ground. The system automatically sets the flow to indicate that such calculations are from bare ground with box 112. The flow then proceeds to next subsequent step. Of course if the model is not be used, the flow is by way of branch 114, which bypasses box 112 and proceeds with next subsequent step.

Now, in box 116, the system sets basic values by prompting for the input of the age of plantation in years, trees per acre surviving, and basal area wherein values for basal area are projected from bare ground when blank.

In step 118, the system retrieves the initial values for the stand including at least one of the following parameters: age of plantation in years, basal area in square feet per acre, trees per acre surviving, background color, foreground color, from bare ground, and project from bare ground.

Since the system is capable of being executed with minimum hardware, the user can run the system on a PC-compatible microcomputer running PC-DOS or MS-DOS, version 2.10 or later. The system requires only 256 kb of free RAM, after loading DOS and other programs. A monitor, either monochrome or color, and the appropriate graphics adapter are all necessary, as is at least one disk drive able to read a 360 Kb double-sided double density diskette. Optional equipment includes a printer and a numeric coprocessor (80×87) chip. The numeric coprocessor can speed calculations considerably. For instance, on an IBM XT, running at 4.77 Mhz, computing stand yields take approximately 20 seconds without a coprocessor, and about 4 seconds with one. The time difference for faster machines is not as dramatic, but is still obviously more productive.

After clearing the lower portion of the display screen and displaying the message "Working" (box 119 in FIG. 2), the system calculates the height of the dominant-codominant trees in box 120. A component of the stand-level core is stand height development, specifically, the average height of all trees in the dominant and codominant crown classes. For convenience, this is called dominant height. The relationship between dominant height, step quality, and age is expressed by a family of site index curves (i.e. a site index equation). Dominant height rather than age was adopted as the independent predictor variable (time) in the basal area and survival models discussed previously. The purpose of this transformation was to account for both site and age in one predictor. Many relationships with age which had to be qualified by site were much clearer when examined over height. While using dominant height as the predictor variable places a great deal of emphasis in use on the site index curve, the approach offers flexibility by introducing different development patterns through the shape and level of the site index curve.

Parameters of all equations were fit separately with linear or nonlinear least squares. Equations were accepted or rejected primarily on the basis of their biological implications and mathematical utility, rather than fit statistics or significance of parameters. Model performance in validation trials was also a criterion. The biomathematical core equations were developed in yield space (in which stand attribute is projected from bare ground), then tested in growth space (in which a stand attribute is projected from one state to another).

Relationships among the stand level core equations required that they be fit in the following order: basal area, survival, and crash. Efforts to use simultaneous estimation techniques to estimate these parameters were not successful.

Extensions to the stand level core (stand level yield models and individual tree growth and survival models) usually depend upon estimates of basal area, survival, or mean dbh available from the core equations. In developing these model extensions, observed rather than estimated values were used. Similarly, the core equations themselves were developed using observed values of dominant height, rather than predicted heights from a site index equation. For measurements in which crown class was not recorded, dominant height was estimated with a regression equation relating dominant height (H) to the average height of trees with dbh greater than quadratic mean dbh (H*). This equation was developed using a portion of the spacing study data, in which crown class was observed:

$$H = 2.88 + 1.01 H^*.$$

Decision box 122 determines if values are for bare ground calculations or otherwise. If the calculations are not for bare ground, as indicated by branch 124, a number of calculations take place. First, the system begins calculating relative spacing as indicated by box 126, then a calculation of quadratic mean diameter is conducted as indicated in box 128. Next, the system calculates percent stocking, in box 130, and continues with next subsequent step.

If values are for bare ground, as indicated by branch 131, a projection to target conditions at a given age is begun. First, the system determines if values are calculated using the establishment model, as indicated by decision box 132. If the system figures that the model is not to be used, the system sets basal area carrying capacity site index equal to site index (box 136 via branch 134).

Widespread in forest ecology literature is the concept that soon after crown closure, stand foliage mass or leaf area per unit area approaches an equilibrium level which is dependent upon site resources. This constant foliage level can be considered the asymptote, or upper boundary, of a sigmoid (S-shaped) development curve. The asymptote is independent of stand density, whereas approach toward the asymptote may be density dependent. Several investigators have shown the proportionality between leaf area and the cross sectional area of conducting xylem or the "pipe" supplying water to the foliage. Hence, sapwood basal area should follow a similar asymptotic sigmoid development curve, if the exact relationship between sapwood and total basal area were known. This transformation applied to the sapwood development curve would provide one with a biologically derived model of total basal area. For relatively young loblolly pine on pulpwood rotations it seems safe to assume that total tree basal area follows at least a similar shape. In the older stands the accumulation of heartwood would imply an increasing level of basal area. Thus the first component of the stand level core is an asymptote sigmoid model of basal area per unit area.

Note that the asymptotic basal area model implies a relationship between average size and density, known in much of the literature as the self-thinning rule. This rule has been widely applied as a forest management tool. For a self-thinning stand, basal area (BA) approaches a constant (a), so mean tree basal area (B) approaches an inverse relation to number of trees (N):

$$BA = a$$
$$B = aN^{-1} \text{ or } \ln B = \ln a - \ln N.$$

As long as basal area is approaching its asymptote and the number of trees per acre is decreasing, the self thinning trajectory (on a logarithmic scale) approaches a straight line. No matter how stand survival is expressed, the asymptotic basal area model implies a self-thinning slope of $-1$ for mean basal area or $-0.5$ for quadratic mean diameter. Note that size attributes which continue to increase during self-thinning, such as total volume or weight, result in self-thinning slopes steeper than $-1$.

The level or intercept of the self-thinning line is clearly determined by the level of the basal area asymptote. This is called the carrying capacity for basal area. Data from the LPMS, Calhoun and Rigesa spacing studies corroborate the findings that carrying capacity increases with increasing site quality for loblolly pine. Also, estimated self-thinning lines were significantly different in intercept by site, but not different in slope. Thus, carrying capacity, or the asymptote for basal area, is determined in the Baseline Loblolly Model by site quality. The rate of approach to carrying capacity is determined by stand density.

An exception to the concept of asymptotic basal area can occur, particularly in dense stands. Basal area per unit area may approach its carrying capacity and then decline or crash substantially with a major wave of mortality. This basal area crash has been consistently observed in spacing studies for spacings of 4×4 and 6×6 feet.

It is speculated that the mechanism for such a basal area crash involves small individual crowns on closely spaced trees. As the carrying capacity for foliage is achieved, it is distributed among many individuals. With increased tree growth individual crowns become too small to maintain physiological processes and many stressed trees may die almost simultaneously as a result of this biophysical imbalance. The survivors too are stressed and lack the photosynthetic potential to respond quickly to increased growing space. Of course, one would expect the mechanism of self-thinning to result in some oscillation about the self-thinning line or carrying capacity. A major crash associated with high densities may be considered an exaggerated oscillation in which survivors will eventually recover and the stand will again approach its carrying capacity. On the other hand, under such stressful conditions these trees are almost certainly more susceptible to other density-related mortality agents and the crash may have a more lasting effect. A choice was made to model the crash phenomenon explicitly with a function to reduce basal area from the asymptotic model as average tree sizes approach a biophysical imbalance. Accordingly, with this in mind, the basal area carrying capacity site index is set equal to site index as indicated by box 136, and the system continues with next subsequent step.

If values are for an establishment model, the system bypasses along branch 138 and continues with next subsequent step.

In this next step 140, the flow for the run is set up by calling and coordinating an order in which other subroutines are called based on at least one of the following variables: site index to use for basal area carrying capacity, number of trees established using age one survival per acre, height of dominant-codominants at previous age, mean height in feet of dominant-codominant trees as projected by a site index equation, quadratic mean dbh in inches, percent stocking, relative spacing, basal area in square feet per acre, trees per acre surviving, and any bare ground values.

In step 142, a check is made for error messages. If there are any, branch 144 allows these to be displayed in box 146.

Figure 3:
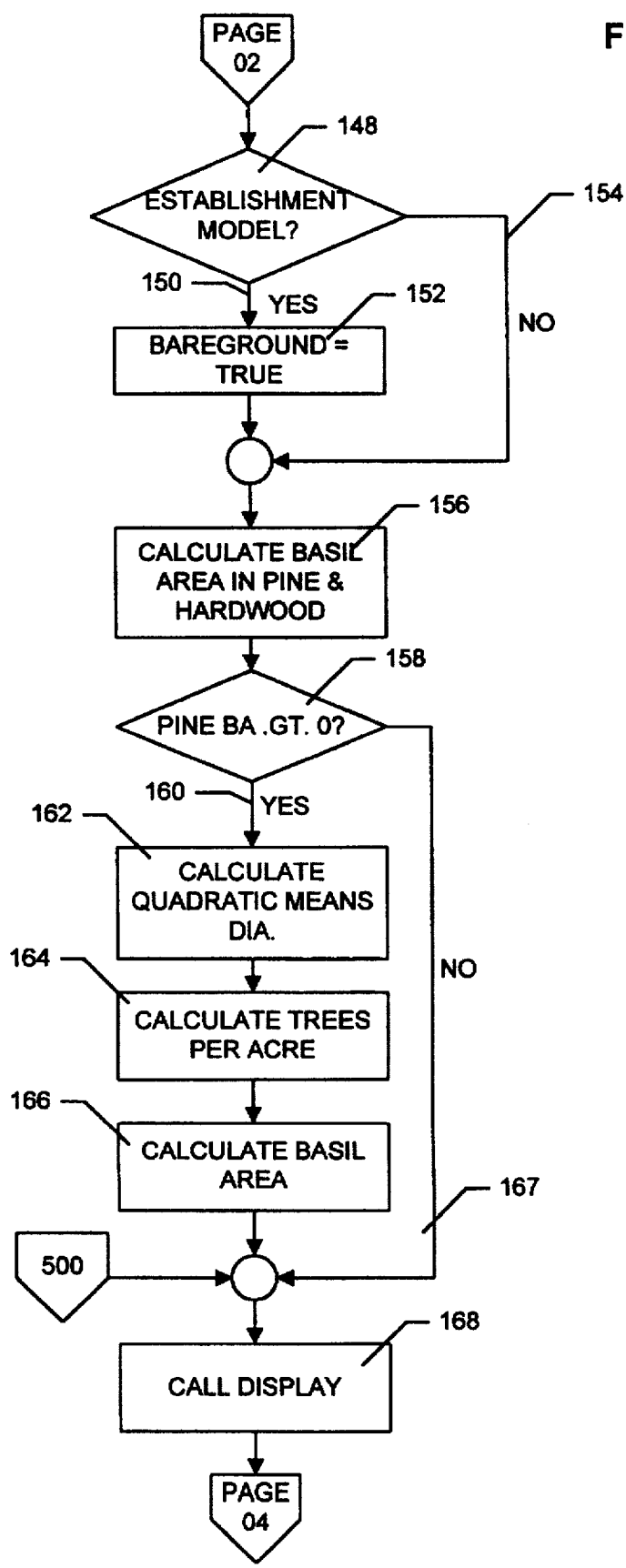
Figure 4:
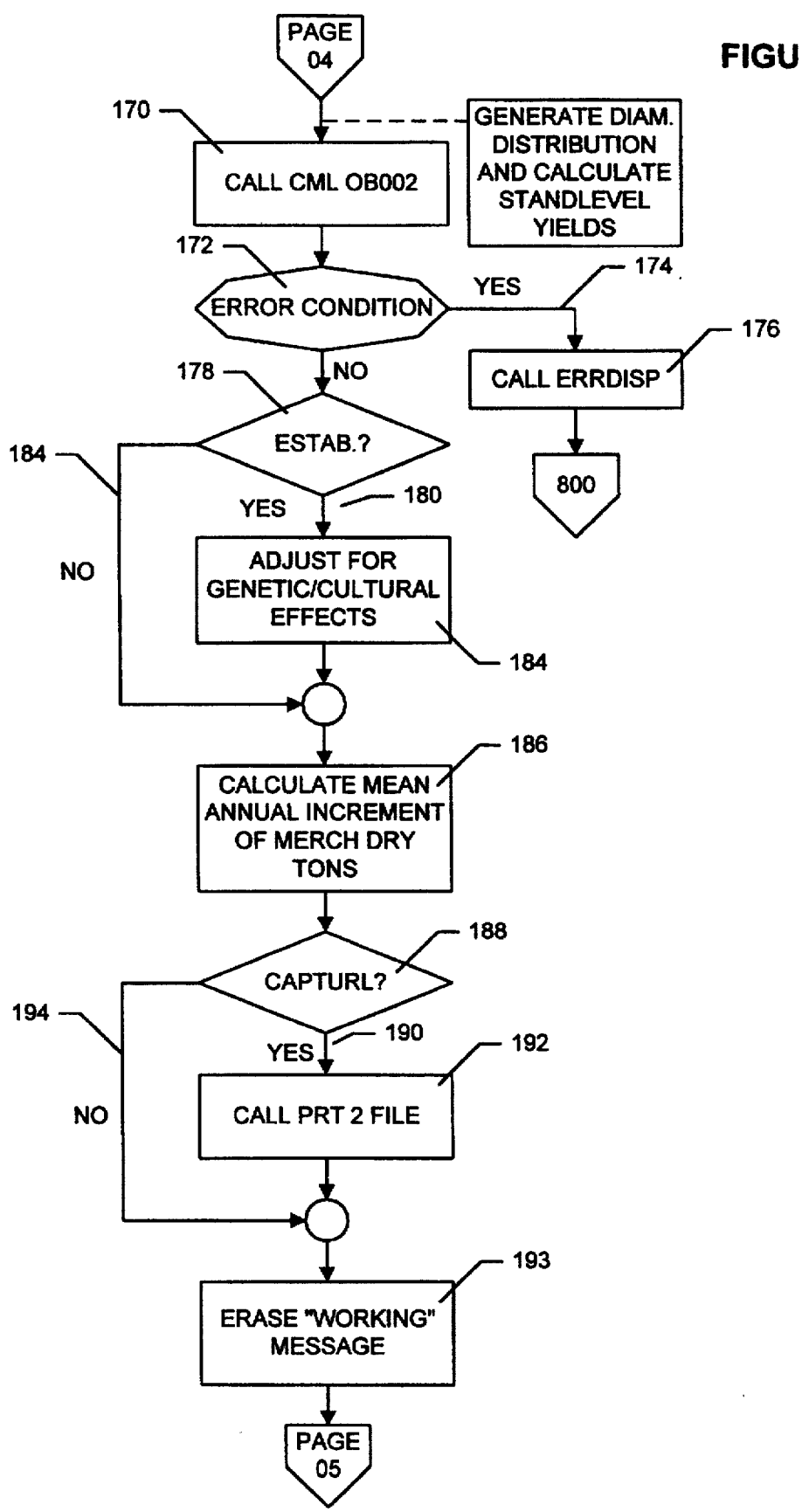

Once again a check is made to determine if an establishment model is utilized. This is done with decision box 148 (FIG. 3). If the establishment model is utilized, the flow follows branch 150 and, in box 152, it sets bare ground equal to true.

Otherwise, the system follows branch 154 and bypasses box 152. The flow then continues with the next subsequent step.

In step 156, a calculation is made for basal area in pine & hardwood. The proportion of total stand basal area allowed to remain in competing hardwoods will stay fairly constant from crown closure through rotation age. The present invention chose to apply a model in which the projected number of trees and mean squared diameter of 100 percent pure loblolly pine plantations are reduced according to the expected percentage of hardwood basal area in the main canopy. This expected percentage is an input to the system flow, so that baseline values ranging from zero to ten percent were compiled which vary by site description and site preparation treatment.

A response mechanism for hardwood competition that is more consistent is to adjust the basal area carrying capacity and the establishment density to allow for an explicit loss in growing space (occupied by competing hardwoods), as well as antagonistic competition. The model used for the system flow described here was readily available, however, and appears to provide logical results for the levels of hardwood competition typically found in Westvaco's Southern Woodlands.

In decision step 158, a comparison is made to determine if pine basal area in square feet per acre is greater than zero, and if said pine basal area in square feet is greater than zero, the flow follows branch 160.

In box 162, the system calculates quadratic mean diameter. In box 164, the system calculates trees per acre. When this is finished, the calculating of the basal area is done in box 166. The stand basal area was a generalized form where the time variable is dominant height. The system is conditioned to give zero basal area per acre (BA) when dominant height in feet (H) is equal to breast height (h=4.5 feet):

$$BA = a(1 - e^{-b(H-h)})^c$$

where
  a=asymptote (carrying capacity)
  b=rate of approach to asymptote
  c=parameter governing time of inflection.

Parameters a, b, and c are functions of site index (SI) in feet for base age 25, and number of trees established (surviving at age 1) per acre (NE):

$a = a0 + a1\ SI^{a2}$
  $b = b1\ NE^{b2}$
  $c = c1\ SI^{c2}$ where
  a0=123.84
  a1=0.12999
  a2=1.5457
  b1=0.0044565
  b2=0.36191
  c1=0.17843
  c2=0.63871.

This formulation of the basal area model is appropriate for non-declining estimates of basal area from bare ground starting conditions. The "a" parameter is the carrying capacity for basal area, or the asymptote approached over time by the basal area growth curve. The asymptote increases with site index. The "b" parameter defines the steepness of the basal area curve, or the rate of approach toward the asymptote. Its value increases with establishment density. The "c" parameter affects both the steepness of the basal area growth curve and its shape. Its value increases with site index. Together, the "b" and "c" parameters define the inflection point of basal area development, or the height at which basal area growth (per unit of height growth) is maximized ($H_c$). An equation for this value can be derived through calculus:

$$H_c = [h\ b - \ln(1/c)]/b.$$

This inflection point value ($H_c$) will be used. Accordingly, the system continues to the next subsequent step.

Of course, the answer to box 158 could easily be in the negative so the flow would follow branch 167 and bypass to the next subsequent step.

In box 168, the opportunity arises for the system to output parameters for at least of plan the following variables: age of plantation in years, basal area in square feet per acre, trees per acre surviving, quadratic mean dbh in inches, mean height in feet of dominant-codominant trees as projected by the predetermined site index equation, relative spacing, percent stocking, background color, and foreground color.

Now, the system flow comes to the point 170 (FIG. 4) where it generates diameter distribution and calculates stand-level yields.

With reliable estimates of stand basal area, number of trees surviving, and dominant height at any point in time, product yields can be predicted, if necessary, without observing individual tree or diameter class information. From geometry, it is reasonable to assume that the product of stand basal area and dominant height should be closely related to the total stem biomass in the stand. The addition of the number of trees surviving allows estimation of the average size of the trees in the stand, which is logically related to the distribution of products in the stand. These relationships can be used to specify two alternative yield models, allowing stand level estimates of product yields where individual tree resolution is impossible or unnecessary.

The first is a stand level yield ratio model, which allows for the prediction of total yield (all trees, entire stem of each tree). A subsequent prediction then provides the proportion of that total yield in any particular product class (defined by a threshold dbh and a merchantable top diameter). A stock table (yield by dbh class) may be derived from this yield model.

The second yield model is a diameter distribution algorithm. The parameters describing the distribution are recovered, where possible, from stand parameters. Because of its flexible shape and mathematical simplicity, the Weibull distribution was chosen to describe diameter distributions. The predicted distribution is applied to the estimate of surviving number of trees. This results in a distribution of trees by diameter class (a stand table), which sums to the correct number of trees. If the stand level estimate of quadratic mean dbh is one of the stand parameters used to recover the Weibull parameters, the stand table also sums to the correct basal area. Height prediction equations and individual tree yield equations may then be applied to the stand table to compute yield equations, and may then be applied to the stand to compute yields in each diameter class, which may be sorted into any product classes.

Essentially, both yield models sort known or previously predicted quantities into size classes distributed around the mean diameter at breast height or dbh. The diameter distribution model is more difficult to develop and apply, but provides the most flexibility and consistency in specifying product yields. The yield ratio model must be re-developed for every yield measure. It can provide a stock table, but not stand tables that are consistent with known values of numbers of trees and basal area. However, its simplicity makes it desirable for some applications.

The yield ratio model provides a simple method of predicting stand yields from estimates of basal area, number of trees, and dominant height at any point in time. Total green weight in tons of all stems ($Y_t$) is given by an allometric function of basal area in square feet per acre (BA) and dominant height in feet (H):

$$Y_t = a\, BA^b\, H^c$$

where a=0.0106
b=1.022
c=1.006.

Merchantable green weight in tons ($Y_m$) to any top diameter (t) for all trees above any threshold dbh in inches (d) is a function of the total yield ($Y_t$) given, the number of trees per acre (N), and quadratic mean dbh in inches (D):

$$Y_m = Y_t\, e^X$$

where

X=[x1 (t/D)$^{x2}$ −x3 N$^{x4}$ (d/D)$^{x5}$]

x1=−0.7756
x2=3.206
x3=1.599
x4=−2.355
x5=6.788.

Presently, the yield ratio model provides estimates in green weight only. Predictions will reflect the yields that would be computed by applying the individual tree green weight equations to each tree in the stand, assuming no cull or defect. One of the principle disadvantages to this method of yield prediction, is that the model must be recalculated from raw data in order to substitute a different individual tree yield expression (e.g. cubic foot volume, dry weight, or an alternative expression for green weight).

The diameter distribution model describes the proportion of trees in the stand that occur in each dbh class. Using a three parameter Weibull distribution as the model, the following expression may be derived:

$$F(D) = 1 - e^{-((D-a)/b)^c}$$

where

F(D)=cumulative proportion of trees with dbh≦D
D=tree dbh
a=Weibull location parameter
b=Weibull scale parameter
c=Weibull shape parameter.

The difference in cumulative proportions, e.g. $F(D_2)-F(D_1)$, for successive diameters ($D_1$, $D_2$) gives the proportion of trees for which $D_1$<tree dbh<$D_2$. Hence, the equation may be used to generate diameter distributions for dbh classes of any size. This formulation implies that the cumulative proportion asymptotically approaches 1.0 as D increases. A logical truncation rule: When the proportion of trees for a particular class implies that the frequency for that class is less than 0.5 trees per acre, set that proportion to zero and adjust the proportion for the next smallest class so that the cumulative proportion for that class is equal to 1.0. This rule gives logical results for one-inch classes. When smaller classes (e.g. tenth-inch) are used, it may be necessary to distribute the truncated proportion over a number of classes to avoid a blip in the distribution. To estimate the three Weibull parameters, the general approach taken was to predict or specify the location parameter a, and use stand attributes related to the diameter distribution to recover the implied values for the scale and shape parameters, b and c. A number of alternative model formulations within this general approach were available. For comparing distributions, it has been suggested to use the mean absolute deviation between observed and predicted cumulative distributions F(D). As a means of comparison, this statistic was computed for each plot of the spacing study data. In this case, the cumulative distributions were also computed in terms of basal area (in addition to number of trees). An analysis of variance was then performed on the mean deviations to identify how they differed by age, spacing, and location. Finally, mean deviations were averaged over all plot groupings for which no significant difference was indicated, and ranked by model.

Traditionally, modelers have used a regression equation to predict the location parameter, or lower bound of the distribution. This lower bound would presumably increase as the trees in a stand get larger. For the data available here, extreme variability was found in the implied lower bound (as estimated using maximum likelihood estimation, as well as two different percentile-based methods). Specifying a small positive constant for the location parameter was found to work as well or better than any of several alternative prediction equations. Because of the flexibility of the Weibull distribution, the proportion of trees allocated to small classes is made negligible in stands where the mean dbh is large.

In testing the system, a=0.51 inches (the lower boundary of the 1-inch dbh class, using a class size of one inch) worked well. In practice, users may want to apply a truncation rule to the lower end of the distribution, similar to the one suggested above for the upper end. To recover the shape and scale parameters, two other attributes of the diameter distribution are required. An obvious choice is quadratic mean dbh ($D_q$), which may be computed from the stand level core equations for basal area and survival. In the terminology of statistical distributions, $D_q$ is the square root of the second non-central moment of dbh. The other attribute of the distribution can be another moment of dbh (arithmetic mean dbh is the first non-central moment, and cubic mean dbh is the cubed root of the third non-central moment), or a percentile of dbh. Prediction equations for each of these values were developed and tested. The most consistently high-ranking method was based on the 93rd percentile of dbh.

The procedure for recovering the Weibull parameters may now be outlined as follows:

1. Obtain quadratic mean dbh, or predict it from the stand level core.
2. Set the location parameter equal to the lower bound of the smallest possible whole dbh class. For one-inch-wide classes, use:

$$a=0.51 \text{ inches.}$$

3. Predict the 93rd percentile of dbh ($D_{93}$) with the following regression equation, developed from the spacing study data:

$$D_{93}=D_q+0.3011\ HT^{0.4718}$$

where $D_q$=quadratic mean dbh
HT=dominant-codominant height.

The spacing study data indicated no relationship between stand density and the difference between $D_{93}$ and $D_q$.

Note that the equation $F(D)=1-e^{[-((D-a)/b]c}$ can be rearranged, after imposing $D=D_{93}$ and $F(D)=0.93$, to give an expression for the scale parameter b in terms of the other two parameters, a and c:

$$b=(D_{93}-a)/[-ln(0.07)]^{(1/c)}$$

4. Solve the following expression for the shape parameter c. The expression is derived from the definition of the second non-central moment of dbh:

$$D_q^2=a^2+2\ ab\Gamma_1+b^2\Gamma_2$$

where $\Gamma_i=\Gamma(i/c+1)$ ($\Gamma$ denotes the Gamma function).

To solve, set $D_q$ equal to its value from step 1. For a, substitute its value from step 2. For b, substitute the expression from step 3. The equation in step 4 then becomes an equation in one unknown (c) and may be solved with an iterative technique.

In general, yield calculations for this yield model are as follows: A height prediction equation can be applied to each dbh class. Yield in each dbh class is then computed from any individual tree volume, weight, or taper equation as a function of dbh and height, multiplied by the number of trees in the class. Cull or defect rates can be included by dbh class and/or according to position on individual trees. Note that possible sources of error in a diameter distribution yield system are clearly specified (number of trees by dbh class, height by dbh class, yield and taper by dbh and height). In the yield ratio model, these sources of error can be identified only in the data used to fit the model. Accordingly, they are inextricably bound together in the model itself.

Both the yield ratio model and the diameter distribution yield model are useful when yield estimates are desired for (a) a hypothetical stand projected from bare ground, and (b) an actual stand in which only basal area, number of trees, age, and site index (but no yields) are known. However, a disadvantage to each model is its inability to utilize observed data on the yield or size structure of an initial stand when a projection is desired. Initial stand information, such as a tree list or a stand table, is frequently available in inventory projections.

Accordingly, by utilizing at least one of the following variables: trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using Quarter Inch International Log Rule, and 1000 board feet per acre using Scribner Log Rule; the diameter distribution can be generated and the stand level yields can be calculated.

In box 172, the system checks for errors; if necessary, an error message is displayed through branch 174 by box 176.

In box 178, the system determines if the establishment model is to be used.

If the establishment model is to be used, the flow follows branch 180 and to the next subsequent step which is box 182. Here, at box 182, the system adjusts for cultural and genetic effects. These effects concern tillage, genetic improvements, herbaceous control, and phosphorus fertilization.

Where used appropriately, tillage improves soil drainage and increases access to available nutrients, thereby improving both site quality and initial survival. Treatment of logging debris (chopping, burning, raking) can make the tillage treatment more effective. Debris movement, however, can also displace topsoil, thereby decreasing site quality even though survival may be improved. Debris movement also decreases the effective stand area, because parts of the stand are occupied by windrows or piles. There exist in the industry good reviews of mechanical site preparation alternatives and effects.

Responses in terms of adjustments to site index, survival percent, and survival uniformity, vary by site description, debris condition, and tillage. The site index adjustments apply to the input baseline site index, which presupposes tillage. The survival percent and uniformity adjustments apply to the baseline values. Recall that these baseline values correspond to the minimum establishment scenario. In the minimum establishment scenario, debris is left in place (chopped or burned if necessary). Debris movement implies a decrease in site index, but improvements in survival percent and uniformity.

Because the baseline site index presupposes tillage for both conversion and second rotation sites, tillage of the new plantation does not increase the baseline site index. Failure to till causes decreases. For conversion sites, the minimum establishment scenario includes tillage. Hence, the failure to till causes the negative adjustments for survival and uniformity on conversion sites. For second rotation sites, the minimum establishment scenario does not include additional tillage. Hence, "re-till" gives favorable adjustments for survival and uniformity on second rotation sites.

Additional responses to mechanical site preparation treatments are expressed in the expected amount of hardwood basal area which will occupy the main canopy and the amount of stand area lost to windrows or piles. These effects are specific to the treatments used to achieve particular planting conditions.

A separate site preparation treatment necessary on some sites is to break up an existing rootmat by raking or harrowing. This has given responses such as a one-foot increase in site index, a 27-point increase in survival percent, and a 13-point decrease (improvement) in CV for survival uniformity.

Phosphorus-fertilization on responsive (P-deficient) sites provides a long-term productivity gain through increased nutrient supply. A logical model for this productivity gain is an increase in site index.

An additional issue is how to handle second-rotation sites that were previously fertilized to correct a P-deficiency. It has been found that even a harvest of stemwood alone would remove substantially more phosphorus than is replenished from the atmosphere, though the loss is less than the amount originally applied. It is suggested that re-fertilization will eventually be necessary in order to replenish P reserves and maintain site productivity.

Note that in simulations of second-rotation plantations, the baseline site index is observed over the previous rotation, including any effects of previous fertilization. The model makes no distinction among different rates of P-fertilization. Instead, it assumes that an appropriate rate was used. Note also that sites which are not P-deficient (as specified in the site description) do not benefit from fertilization. In reality, sites which are P-deficient may benefit considerably more than the conservative estimates provided here.

Chemical control of herbaceous competition at or near stand establishment effectively accelerates a stand's height development pattern. Long-term results reported, as well as early observations on numerous experimental plots monitored, support this claim. As a conservative modeling convention, it is recommended that selection of herbaceous weed control should shift the height-age curve to the left by two years. Equivalently, one might say that a stand's apparent age is increased by two years. A 25-year old stand in which herbaceous weeds were controlled will appear to be 27 years old in terms of height. Hence, the adjustment implies an increase in site index. However, the competitive advantage given to seedlings in early years is not seen as an increase in the inherent quality of the site (though the advantage is often significant and long-lasting, allowing a shorter rotation age). Therefore, basal area carrying capacity is not recomputed. Note that the model makes no distinction among various chemical alternatives. Instead, it assumes that an appropriate one was chosen and was effective. Based on early results of the latest herbicide trials, two years may be very conservative.

Planting genetically-improved families represents an imposed change in a stand's height development pattern, or apparent site index, even though the site itself has not been altered. It has been found that simply increasing the level of the height-age curve could account for this change. Other changes in curve shape (when using a more flexible non-linear height-age model) may also be necessary. Until more extensive long-term data for different families could be examined, the approach of using a proportional height gain over the entire height development pattern has been chosen. Based on age-12 row-plot progeny test data, the height gains (over unimproved seed sources) were adopted.

The response mechanism is to increase the stand's projected height at rotation age by the appropriate percentage. Such a height increase implies a corresponding increase in site index. However, as a conservative measure the system does not to allow a subsequent increase in basal area carrying capacity. Hence, while the present model implies that improved stands are taller (therefore yielding more) and that they approach their basal area carrying capacity faster (therefore shortening the rotation), it does not provide for higher stand densities in the same way that site manipulations such as tillage and fertilization increase productivity.

Of course, if no establishment model is available, the flow follows branch 184 and bypasses box 182.

In step 186, there is a calculation for mean annual increment of merchantable dry tons.

Next, there is a decision to be made, in decision box 188, as to whether the data should be captured and sent to the print file. If yes, then the flow follows branch 190 and the system calls the print program through box 192. The data captured is sent with the parameters for at least one of the following variables: unit number of outputs, user identification field for capture file sawtimber dry weight, trees planted, number of trees established with age one survival per acre, coefficient of variation for 0.01 acre survival plots, uniformity reduction with coefficient of variation for 0.01 acre survival plots adjusted by cultural/genetics, basal area carrying capacity, age of plantation in years, basal area in square feet per acre, trees per acre surviving, quadratic mean dbh in inches, mean height in feet of dominant-codominant trees as projected by the predetermined site index equation, array of diameter limits, total yield in given tons per acre, merchantable yield in green tons per acre, trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet at quarter inch international per acre, and 1000 board feet at scribner per acre.

If the data is not to be printed, the flow bypasses box 192 by way of branch 194.

Either way, the flow travels to box 196 wherein the system calls a display program. At this point the user can output data to a display with parameters for at least one of the following variables: array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using the Quarter Inch International Log Rule, 1000 board feet per acre using the Scribner Log Rule, and mean annual increment of merchantable dry tons.

Figure 5:
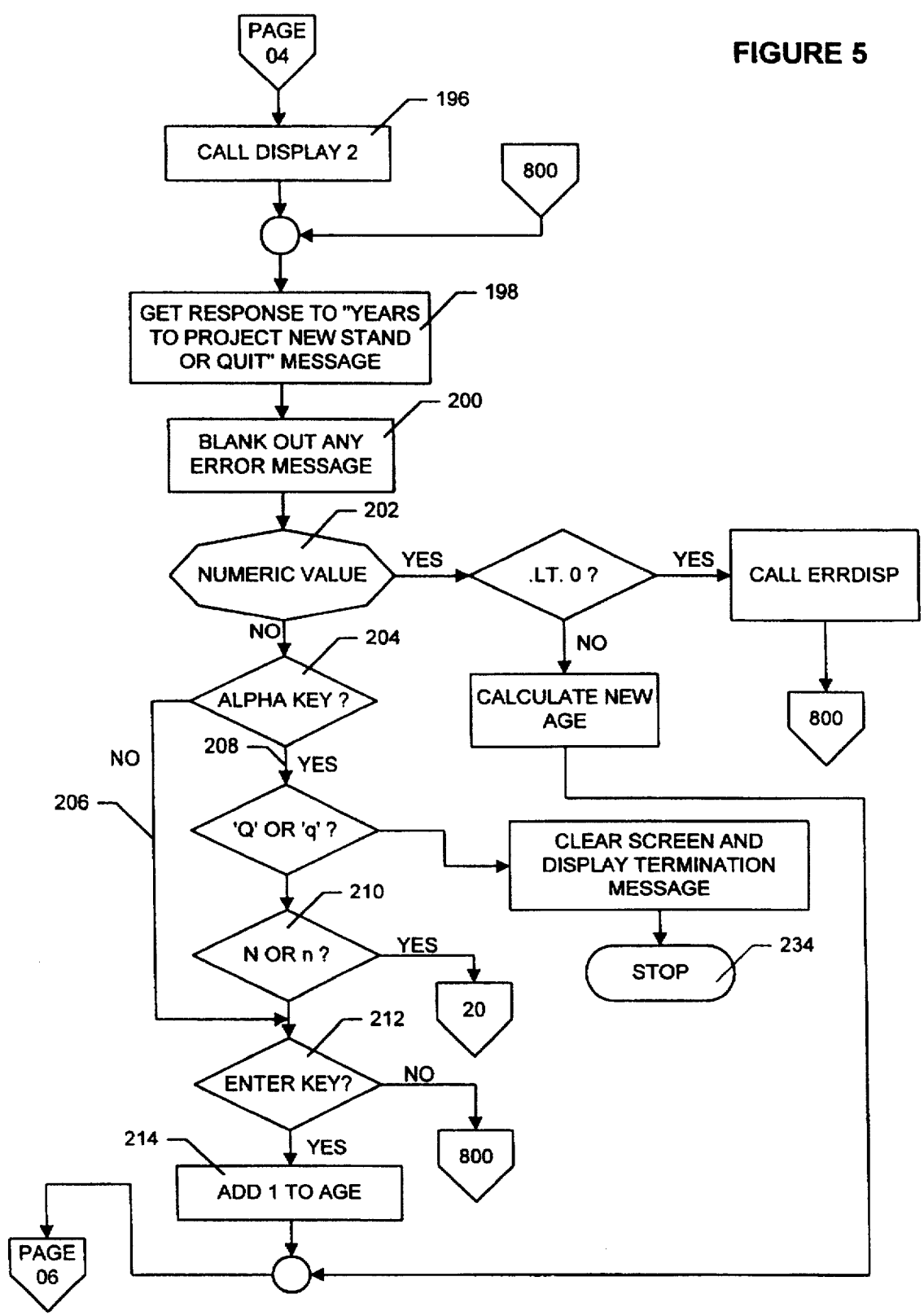
Figure 6:
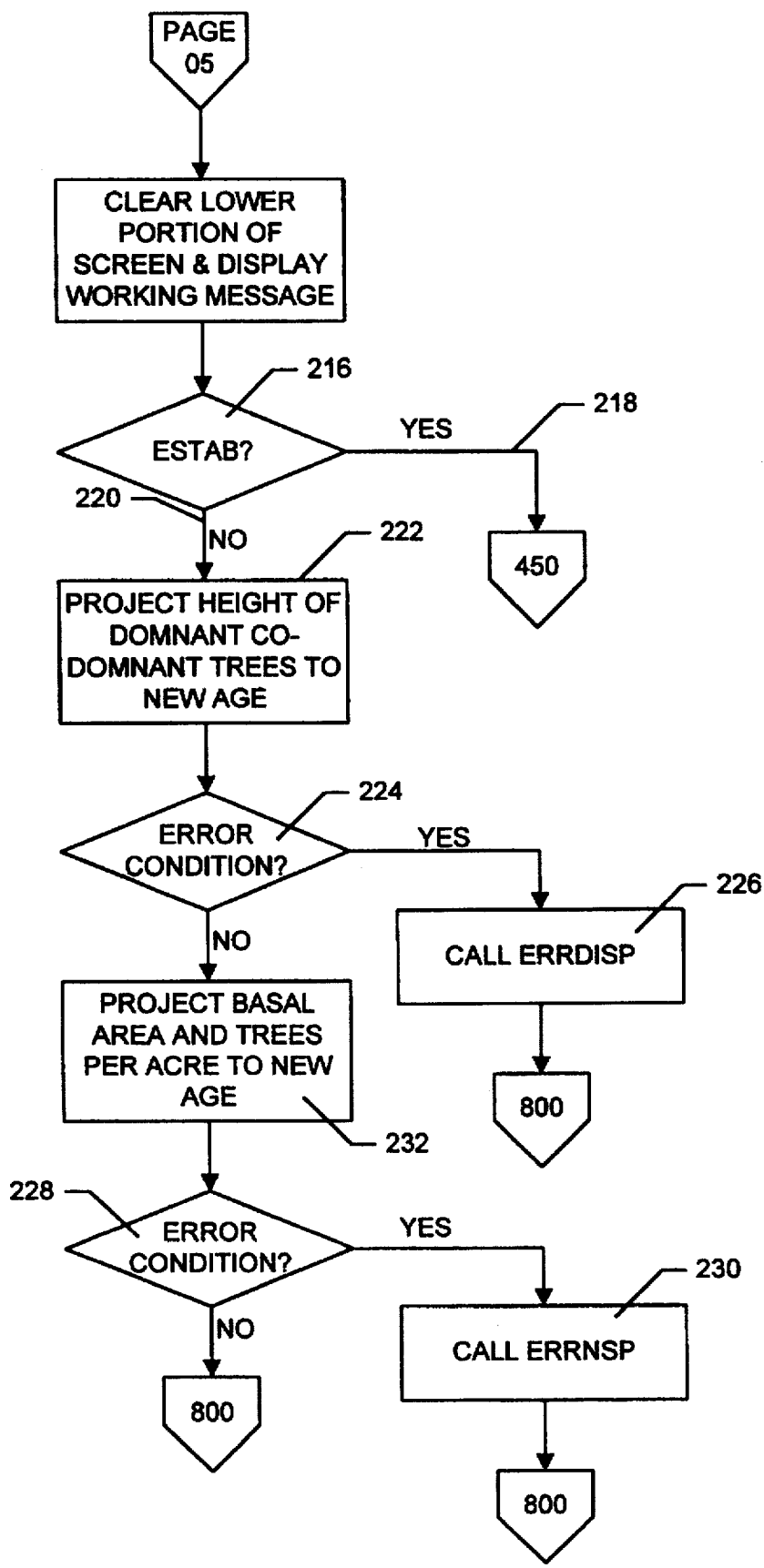

Now, starting with box 198 (FIG. 5, the system takes the user through a series of questions to determine if the user wants to continue, quit or begin a new stand. For example, in box 198 the user is prompted with the message "Years to Project, New Stand, or Quit?" In box 200, the system will blank out any error message. Next, the system checks for responses based on which key is pressed such as box 202. If a Numeric key was pressed, either an error message is displayed (LTO=Y) or a new age is calculated and a branch to jump PAGE 06 is executed (LTO=N). If a Numeric key was not pressed, box 204 checks for an alpha key, and selects either branch 206 (ALPHA KEY=N) or continues questioning (ALPHA KEY=Y) via branch 208. For example, box 210 checks for any other key pressed, and box 212 checks for the <enter> key which has a scan code of 28.

When the system flow comes to box 214, the age of the current plantation is incremented. Now, the system flow checks to see if the establishment model is being used in decision box 216 (FIG. 6) and, if so, the flow follows branch 218 and returns through jump 450. As can be appreciated, there are jumps to guide the flow back to certain portions, such as jump 800. The final result is the capability to project consistent estimated and yield values for a plot of trees including height of dominant and co-dominant trees to new age, basal area and trees per acre to new age.

Of course, if the establishment model is not being used, the flow follows branch 220 into box 222 and a projection of height of the dominant-codominant trees to new age is started.

Boxes 224, 226, 228 and 230 check and display error messages. At box 232, a projection of basal area square feet per acre and trees per acre surviving to new age of plantation in years is done.

The system flow eventually takes the user to box 234 (FIG. 5), wherein a quit the program is run.

Figure 7:
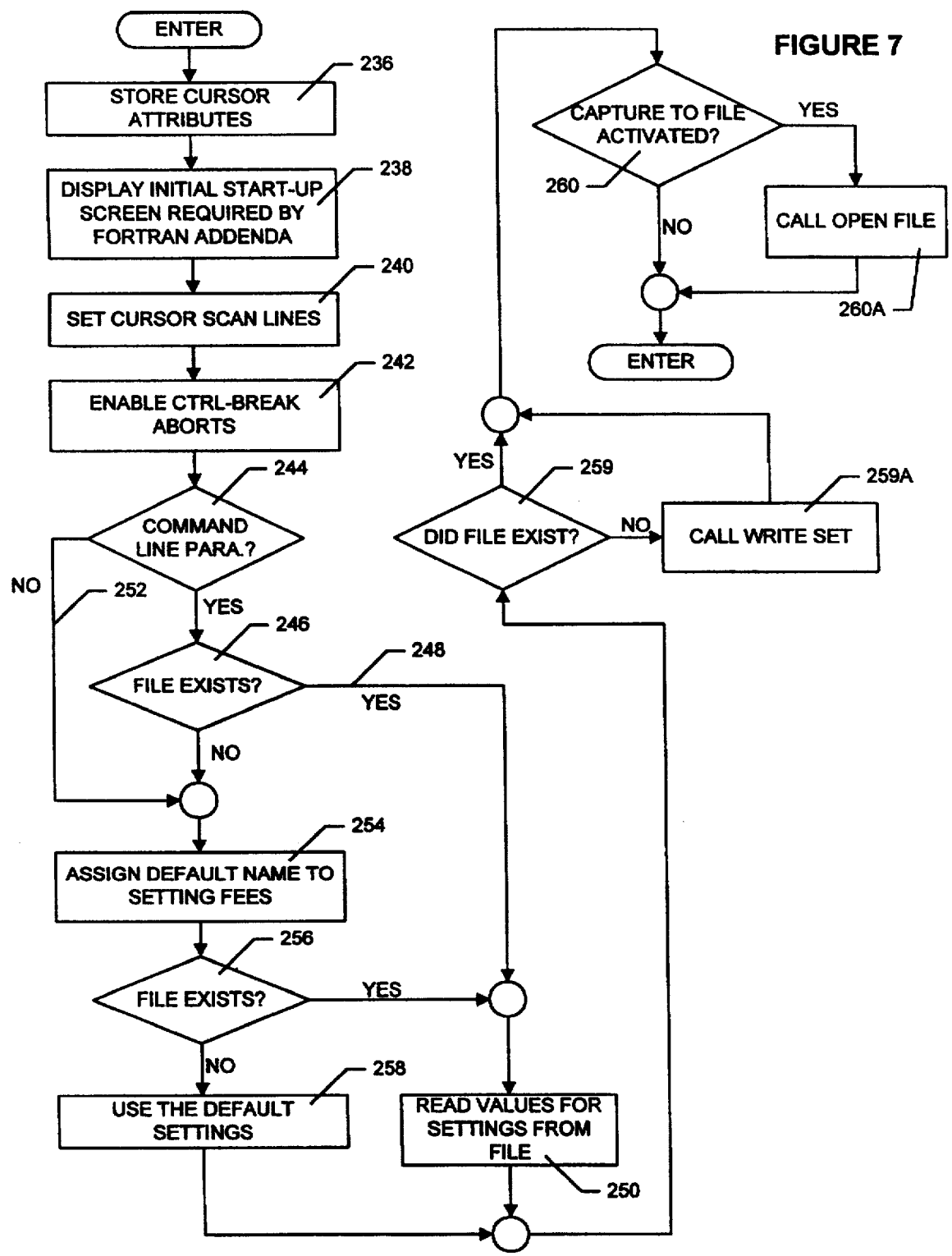
FIG. 7 illustrates the initialize variables to defaults or saved settings flow diagram of the present invention.

FIG. 7 illustrates the initialize variables to defaults or saved settings flow diagram of the present invention.

In box 236, information about the cursor attributes are stored. Next, information about the start-up screen is displayed, in box 238. At box 240, the system allows a setting of the cursor scan lines to avoid "disappearing cursor" problem. Also, the setting of the BREAK status to OFF and disabling Ctrl-Break (Ctrl-C) for abort are done in box 242.

In decision box 244, there is a check for command line parameter. If present, the system looks for a file with that name as indicated by box 246. If the file exists, as indicated in branch 248, the flow goes to box 250, reads its default values, and branches to box 252. If the command line parameter is supplied but the file does not exist, or if the command line parameter is not supplied (see branch 252), the system looks for file named "NEOLOB21.SET" (boxes 254 and 256). If it exists, the system uses it for default values, as in box 258, and branches to box 252. If it does not exist, default values are used, and a branch to box 252 is executed.

Thus, if all are "no", then the system uses the built-in default settings (box 258) for site index, coefficient of variation, age, survival, trees planted, trees established, indicators if basal area (in square feet per acre) carrying capacity should be adjusted wherein 0.0D0=FALSE, and 1.0D0=TRUE. From here, the following values are set: Top diameter limits, Minimum dbh limits, Maximum dbh limits, Pulpwood maximum dbh=Sawtimber minimum dbh, Turn on highlighting for recommended response categories in the cultural/genetics response adjustment matrix [HILITE (ROW, COL)], open file channels, turn on the keyboard buffering and the clock display, set pulpwood maximum dbh to sawtimber minimum dbh. The system then enters box 260 and writes the values out to NEOLOB21.SET (boxes 252, 260 and 260a) if the file existed, or calls WRITESET (box 252a) if he file did not exist.

Figure 8:
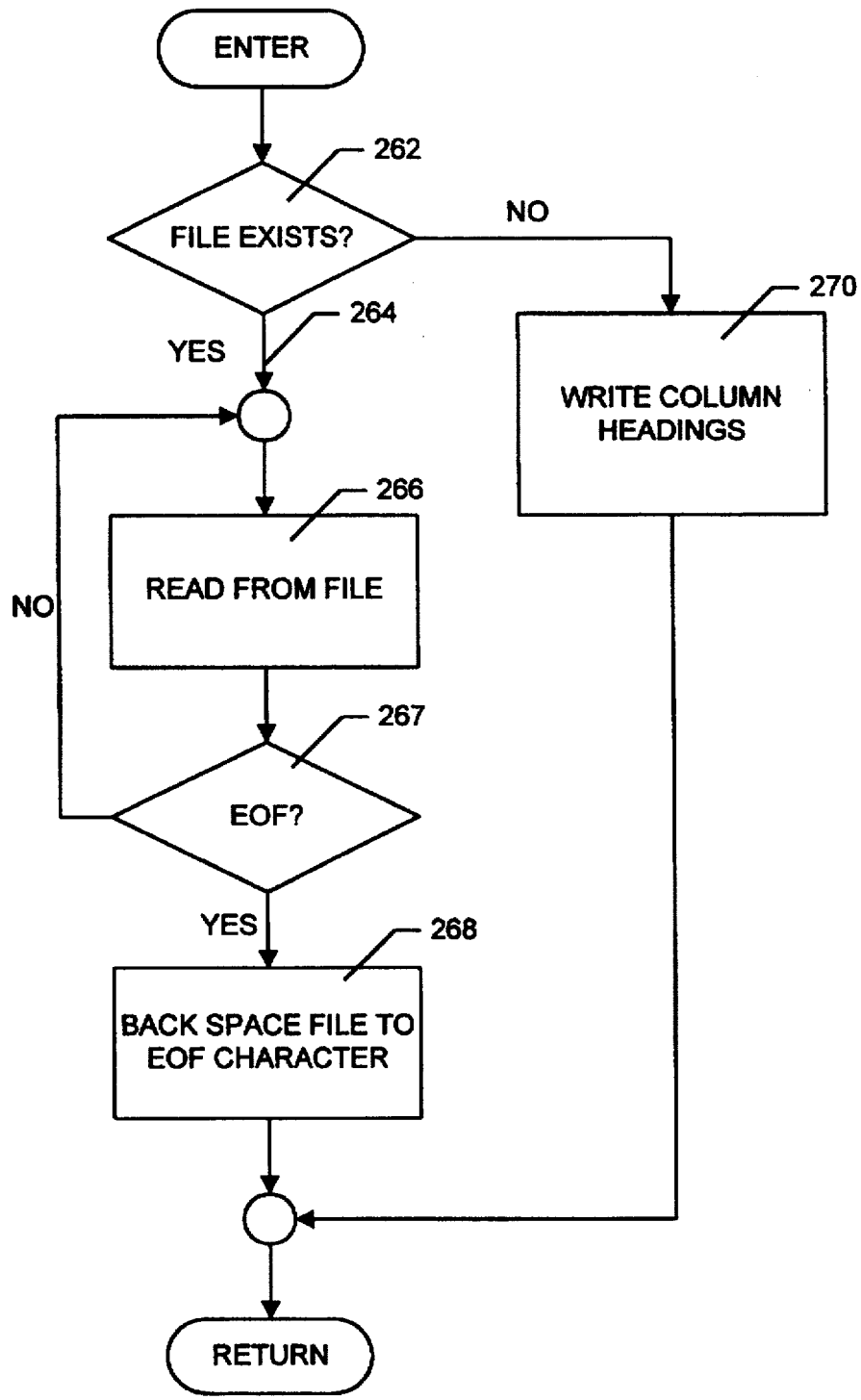
FIG. 8 illustrates the open capture file flow diagram of the present invention.

FIG. 8 illustrates the open capture file for use flow diagram of the present invention. The system enters decision box 262 and checks for the capture file (where results can be saved). If it exists (see branch 264), then the system opens it, and reads from it until the end-of-file character is located (see boxes 266, 267 and 268). If the capture file does not exist, the system writes the column headings (box 270).

Figure 9:
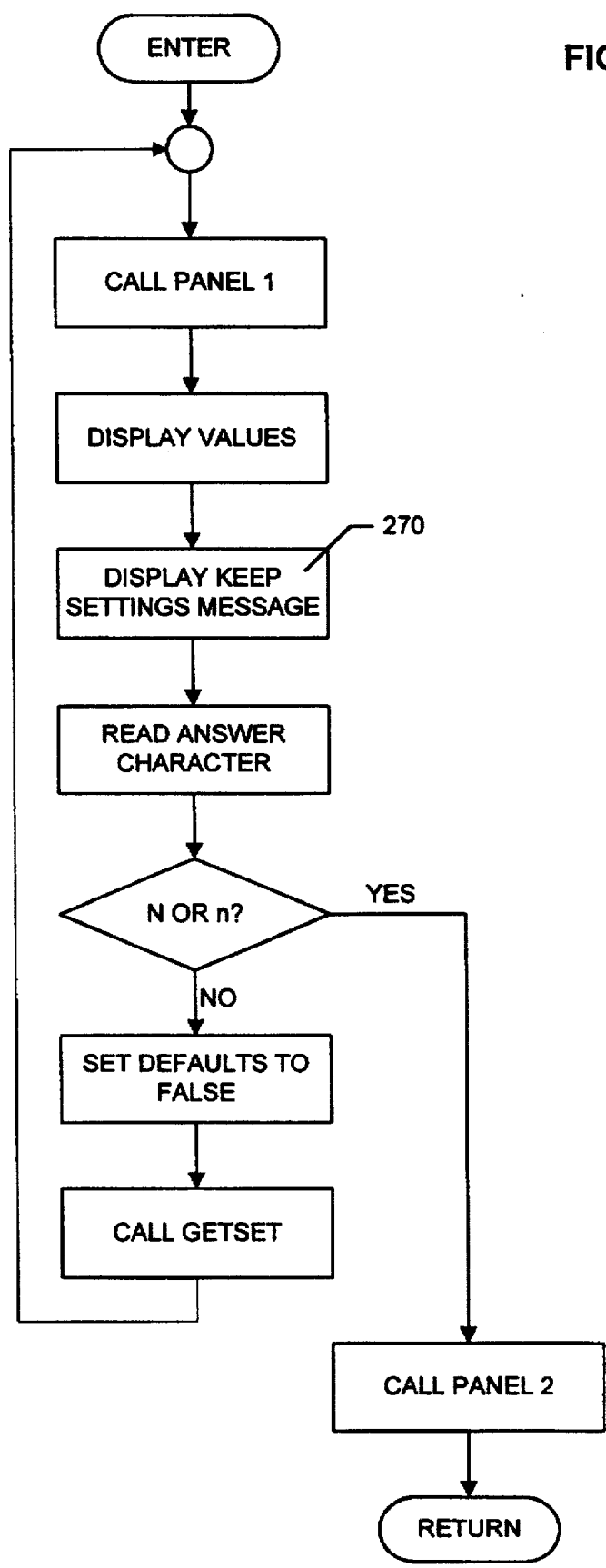
FIG. 9 illustrates the display current values of program settings flow diagram of the present invention.

FIG. 9 illustrates the display current values of program settings flow diagram of the present invention. This is a subroutine to show the current values of the program settings, and the system asks if changes are to be made. First, the displays are checked for the variable sawtimber that do not have specifiable maximum limits. Box 270 will blank out the prompt message and the system finishes writing the display.

Figure 10:
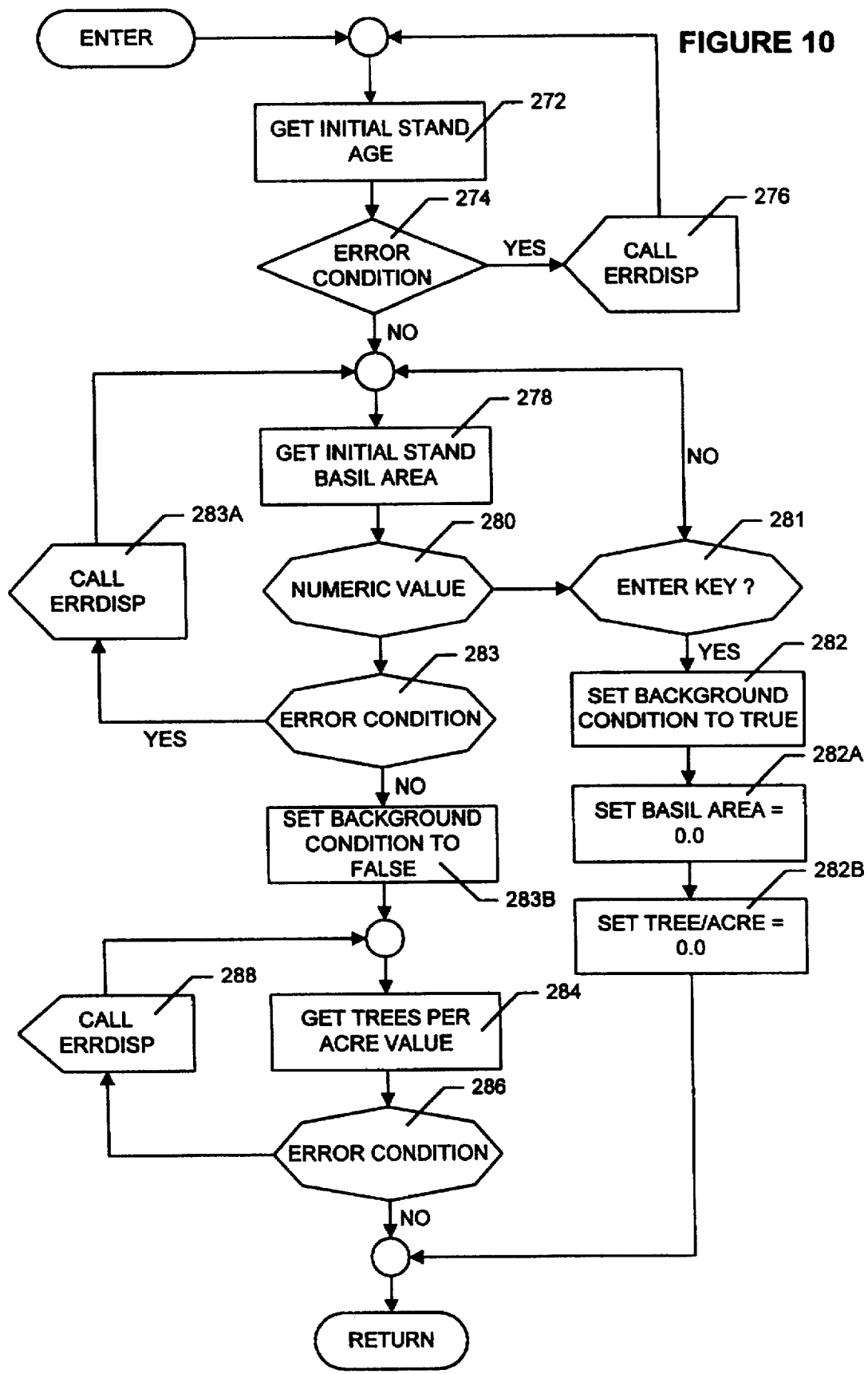
FIG. 10 illustrates the getting of initial values for stand flow diagram of the present invention.

FIG. 10 illustrates the getting of initial values for stand flow diagram of the present invention. Box 272 is a get step for the initial ages of the stand.

In box 274, the system checks for errors and prints a message in box 276. The system will blank out any error message, if necessary.

In box 278, the system gets the initial stand basal area. In box 280, a check for entry of the basal area is carried out; if basal area was not entered, a check for pressing of the <Enter> key is carried out (box 281). If the <Enter> key was pressed, then the system assumes bare ground in box 282, and projects to target stand (boxes 282a and 282b). These are the commands: Type 1=Numeric keys, Blank out the "press <enter> to project from bare ground" message, Type 5=Control characters (ASCII 1–31), Blank out the "press <enter> to project from bare ground" message, Blank out any error message. Now, if basal area was entered, the system makes an error check (box 283). If an error exists, an error message is displayed (box 283a); if not, bare ground is not assumed (box 283b). Then, the system reads trees/acre data (box 284). Continuing to box 286, the system checks for errors and, if an error exists, calls the subroutine to display error messages (box 288). Additionally, the system will blank out any error message.

Figure 11:
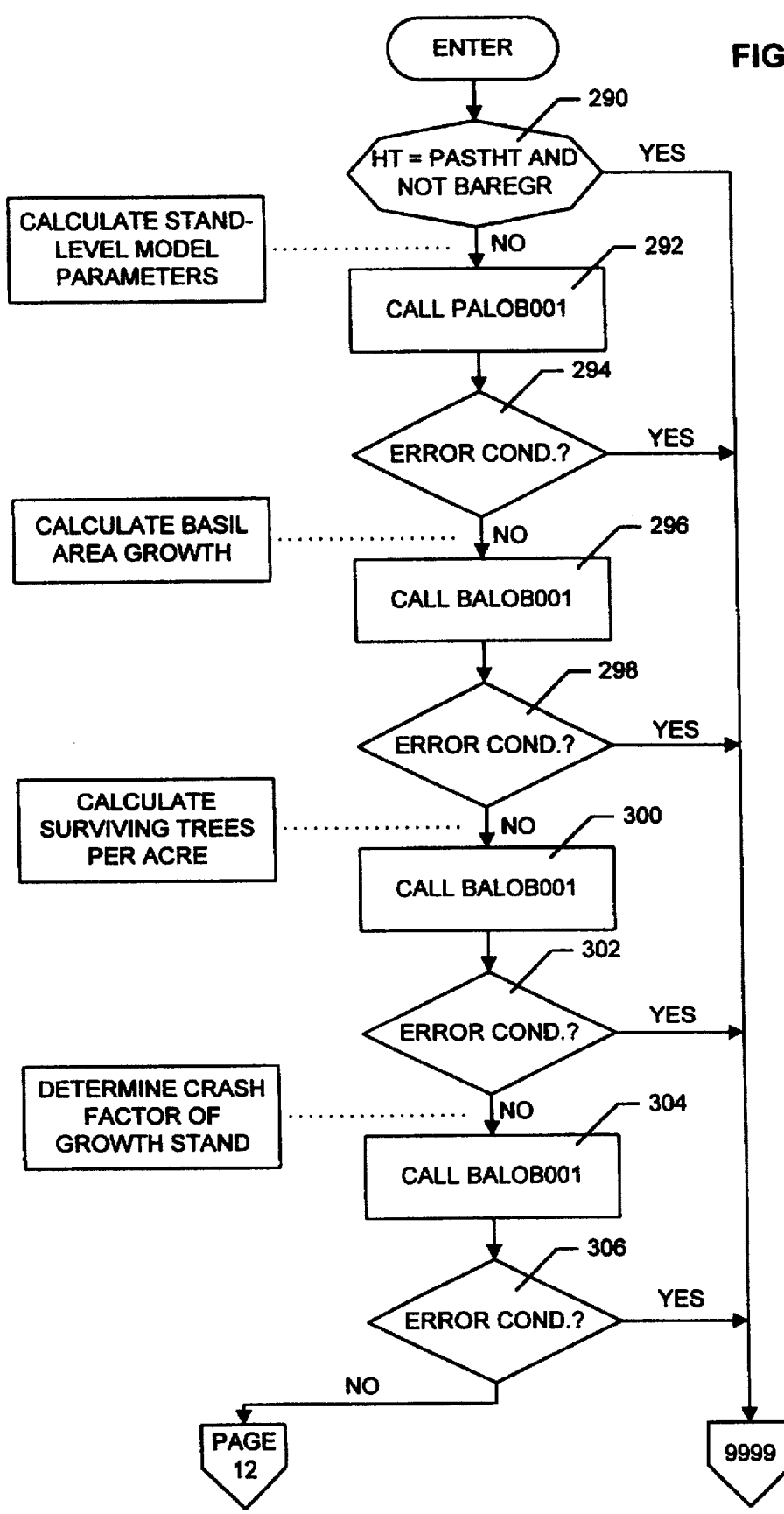
FIGS. 11 and 12 illustrate the flow diagram for coordinating order for which subroutines are called and computing quadratic mean diameter, percent stocking and relative spacing for the present invention.
Figure 12:
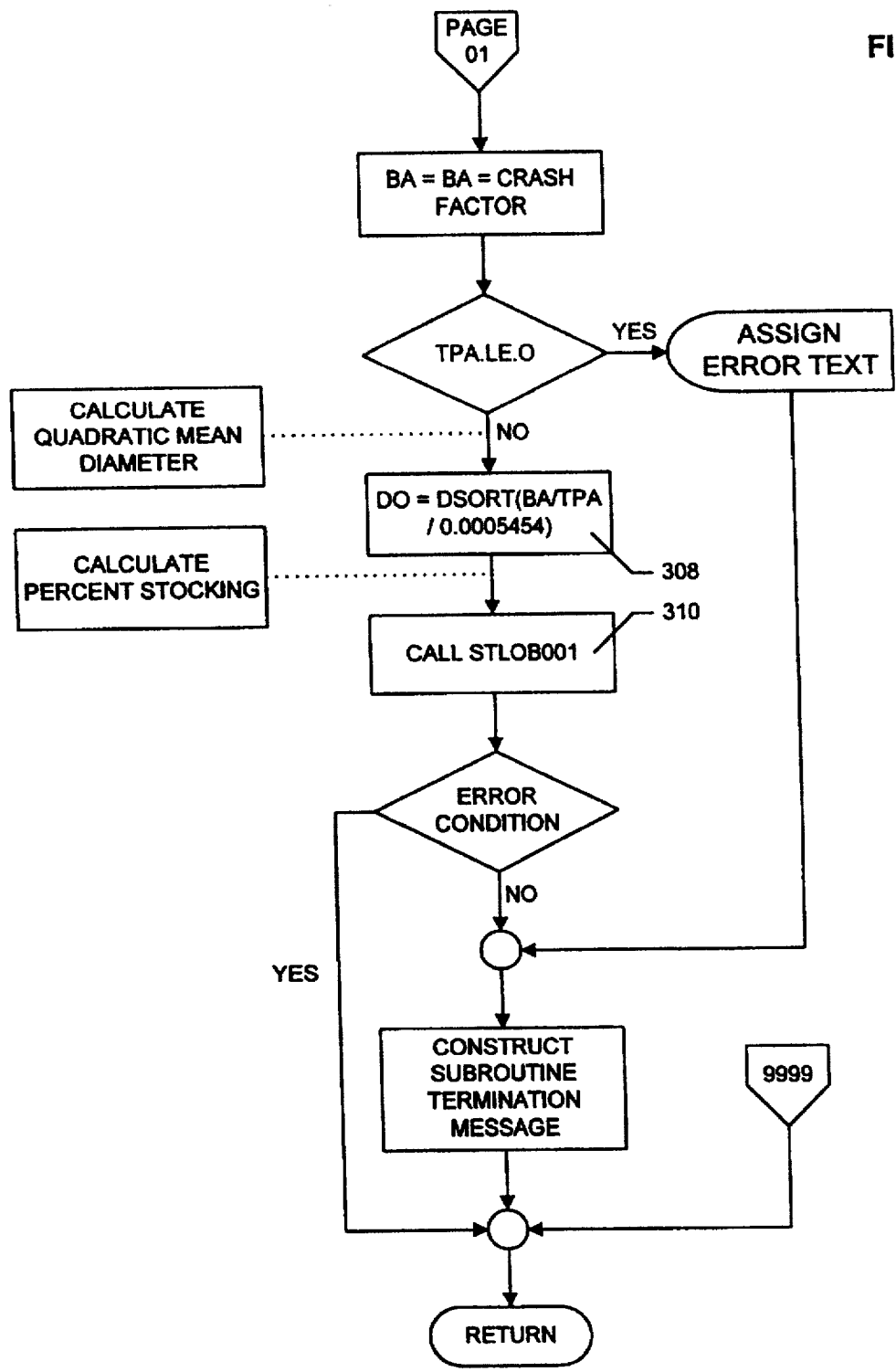

FIGS. 11–12 illustrate the flow diagram for coordinating the order in which subroutines are called. This is a complex module which calls the routines listed in the external subroutines section. It also computes the quadratic mean diameter, percent stocking, and relative spacing. If data are from bare ground, the procedure will calculate the basal area and trees per acre. After receiving the data, an indication is made that bare ground is false.

First, there is a declaration of variables. Next, decision box 290 (FIG. 11) checks if the mean height in feet of dominant-codominant trees as projected by the site index equation equals the height of dominant-codominants at previous age. If the data are not from bare ground, then the system goes to jump 9999.

The system moves to box 292, calculates stand-level model parameters, and performs the intermediate calculations for basal area in square feet per acre and survival equations (boxes 296, 300 and 304). In carrying out the calculations, error checks are made (boxes 294, 298 and 302) and, if errors are detected, a branch to jump 9999 is executed.

Forest managers have identified an immediate need for assessing expected benefits of various cultural and genetic alternatives in establishing and managing loblolly pine plantations. Obviously, constraints on time, labor, and cost would prevent actually planting, treating, and growing stands under every possible alternative in order to compare the results at rotation age. Therefore, a model is ideally suited for such an analysis.

Any reliable model requires data. Much research and investigation, both formal and informal, have addressed the response of loblolly pine to intensive culture (e.g. bedding, raking, fertilization, chemical weed control, thinning), as well as the expected benefits from the use of genetically improved planting stock.

However, the fundamental difficulty with using such information to construct a model is not in gathering it, but in quantifying existing knowledge in model-oriented terms. To overcome this difficulty it is possible to use some of the information available, via extensions to a baseline model. A biomathematical model for loblolly pine plantations was used as a baseline on which to build the response model for plantation establishment alternatives. One application of the baseline model is in projecting growth and yield for an entire rotation, given "bare ground" starting conditions. The establishment model exploits this particular application (as opposed to inventory projection capabilities).

This baseline model was developed with a biological rationale, using concepts of stand height development, foliar carrying capacity, and self-thinning as a conceptual framework. The input parameters of the model have fundamental roles in this modeling framework. Therefore, a guiding principle behind development of the response model has been to specify responses in terms of fundamental biological parameters, rather than "bottom-line" yield parameters. To appropriately model the effect of some treatment, one must attempt to model its cause.

For instance, if a ten-year old study suggests that treatment can increase yield at age 10 by X percent, it is difficult to use that information in assessing expected effects at other ages or other sites unless one knows why the yield increased. Was there increased survival and/or reduced competition after planting? Are the trees taller? Are their crowns larger or denser? Has their height-diameter relationship changed? Is the response dependent on the method by which yield was calculated? Answers to such questions are clues to the mechanism of the treatment response, and enhance the ability to extrapolate such information to other conditions. A yield increase attributable to a treatment which improves first-year survival will not be apparent on sites in which survival is already high without the treatment.

This principle of using "fundamental biological parameters" is often difficult to follow. In many cases, the understanding of the system's biology is not clear enough, nor is there access to the most fundamental parameters (crown or foliage data, detailed soil information, etc.). It is perhaps more accurate to say that one has attempted to specify responses in terms of the parameters for the baseline model. To the extent that the baseline model is biologically motivated and driven, one has to be consistent with the guiding principle. Specifically, the input parameters for the baseline model are:

Establishment Density,

Basal Area Carrying Capacity,

Site Index (base age 25),

Height, and

Plantation Age.

The "establishment density" is defined as the trees per acre surviving one year after plantation establishment. The "basal area carrying capacity" is the maximum basal area per acre attainable which is a level asymptotically approached by a stand's basal area development curve over time. Unless otherwise specified, a stand's "height" refers to the mean total height of dominant and codominant trees, or those trees whose heights are little affected by stand density.

There are various relationships between these input parameters. Site index may be computed from height and plantation age. Basal area carrying capacity may be computed from site index. In the response model, selected adjustments to these parameters may imply that these relationships do not always hold. For instance, a treatment which changes the height-age relationship must change the height at age 25, implying a change in site index. Yet one may not choose to re-compute basal area carrying capacity, if one sees no evidence nor logic supporting such a change.

The first parameter in the list above, establishment density, has two aspects which affect plantation yields: quantity (number of trees per acre at age one) and uniformity (the spatial distribution, especially "patchiness," of those trees across the planted area). The baseline model considers only the quantity, not the uniformity. This phenomenon has been addressed as a sampling issue, rather than a biological parameter; its treatment in the response model required a yield reduction external to the baseline model, based on the coefficient of variation (CV) associated with establishment density. Because only the "bottom-line" yield estimates are affected, the guiding principle was violated in this case. Estimates of stand parameters such as basal area, number of trees, and mean dbh at rotation age are unaffected, representing uniform establishment densities.

After checking for error conditions, see box 294, there is a flow calculation of the basal area growth in box 296.

For any particular stand, growth of individual trees can be expressed as a linear function of initial tree size. While maintaining some theoretical distribution of tree sizes is not necessary, the use of a stand-specific linear expression for individual tree growth offers another advantage. A simple linear equation for basal area growth of individual trees ($\Delta B$) as a function of initial tree basal area (B) can be summed over all survivor trees in the stand to provide a mathematical link between the parameters of the linear equation and stand level estimates of survivor basal area ($BA_s$), and surviving number of trees (N). Coefficients of the linear equation can then be specified subject to this implied relationship:

$$\Delta B = a + b\, B$$

$$\Sigma \Delta B = N\, a + b\, \Sigma B$$

$$\Delta BA_s = N\, a + b\, BA_s.$$

To obtain estimates of BAs and $\Delta$BAs, a method is required for distributing stand level estimates of mortality among individual trees. Tree basal area growth estimates are then applied to survivor trees. For distributing mortality, a compromise is required between ideal situations. It is possible to have completely random mortality, where tree mortality is entirely unrelated to tree size and occurs uniformly over the diameter distribution; and size-controlled mortality, in which the smallest trees are always the first to die. Given an estimate of the surviving number of trees, generalized across stand conditions, allows one to identify which trees (according to their dbh) will die. Estimates of survivor basal area and survivor basal area growth (derived from the estimated set of survivor trees and the biomathematical core equations) are then used along with other stand characteristics to estimate the parameters of the individual tree survival and basal area growth, provide a mechanism for projecting individual trees, or stand tables consistent with stand level estimates of basal area growth and survival.

Once again, error conditions are looked for in box 298, and then the system begins in box 300 to calculate surviving trees per acre. The time of inflection ($H_c$) is a logical indicator of crown closure and the start of density-dependent mortality, or self-thinning. For survival prior to this time, a declining exponential function of dominant height serves to reduce establishment density to the density at crown closure ($N_c$), which appeared to be a constant proportion of establishment density. After crown closure, density-dependent mortality is expressed with a model. This model is formulated as a function of dominant height, and includes a lower asymptote representing the minimum number of trees required to fully utilize the site ($N_{min}$). Using $H_c$ from the equation, the combined system for predicting the number of surviving trees per acre (N) is:

For $H \leq H_c$, $$N = NE[s + (1-s)e^{-0.5H}];$$

For $H > H_c$, projection from bare ground, $N = N_{min} + 100\{[(N_c - N_{min})/100]^p + q[(H/100)^r - (H_c 100)^r]\}^{1/p};$ For $H > H_c$, projection from existing stand, $N_2 = N_{min} + 100\{[(N_1 - N_{min})/100]^p + q[(H_2/100)^r - (H_1/100)^r]\}^{1/p}$ where
$N_c = sNE$
$p = -2.1502$
$q = 0.18732$
$r = 5.3364$
$s = 0.9374$.

Because data is lacking for stands in advanced stages of self-thinning, the value of $N_{min}$ is, at best, a guess. The largest recorded loblolly pine in existence has a dbh of 63 inches (USDA 1975). It is expected that the maximum average size in a very old plantation (one in which individuals are still competing with one another) to be much smaller, say 40 inches. On site index 70 land, the basal area carrying capacity is about 216 square feet per acre. If quadratic mean dbh reached 40 inches in a stand with this level of basal area, survival would be down to about 25 trees per acre. This seems a reasonable minimum number of trees. It may be that the minimum should vary by site index. However, these issues are largely academic, since the model's performance is not very sensitive to the value chosen for $N_{min}$. A constant value of $N_{min} = 25$ trees per acre as a parameter in the model was used.

To apply the survival model to project initial density ($N_1$) in an existing stand, $N_1$ and $H_1$ are substituted for $N_c$ and $H_c$. If $H_2$ is less than $H_c$ in projecting an existing stand, $N_2$ may be predicted by solving for NE, as follows:

$NE = N_1/[s + (1-s)e^{-0.5}].$

Again, the system checks for any error conditions in box 302, then moves to determine crash factor of a grown stand in box 304. An additional model was developed to account for the basal area crash in high-density stands, where asymptotic predictions of basal area growth do not reflect observed stand development. The ratio of observed basal area in a stand exhibiting a crash to the predicted basal area for that stand using the asymptotic model forms a crash factor (CF). Note that if CF were known, then the prediction of basal area could be refined:

$BA = CF \cdot BA_{asymptotic}.$

A prediction model for CF is based on relative spacing, the ratio of the average distance between trees to dominant height. Relative spacing (S) is appealing as an indicator of the crash because it is readily computed from the model estimates of dominant height (H) and survival (N), which are well-behaved in dense stands:

$S = (43560/N)^{0.5}/H.$

The first derivative of S with respect to height (dS/dH), proved to be a reasonable predictor of CF. The analytical expression for dS/dH is a function of dominant height, number of trees, and parameters p, q and r:

$dS/dH = -S\{[r \cdot q/(2 p N 100^{-r})](N-25)^{1-p} H^{r-1} + 1/H\}.$

Ordinarily, S decreases in a developing stand, and asymptotically approaches a limit. This limit is interpreted as a biophysical limit to density. As S decreases, dS/dH is negative. AS S approaches a limit, dS/dH approaches zero and observed values of basal area tend to be very low in relation to predictions from the asymptotic model (CF<1.0). When dS/dH is more negative, predictions of basal area from the asymptotic model are unbiased (CF=1.0). A non linear equation with an asymptote of 1.0 describes the relationship. However, in dense, self-thinning stands, dS/dH may actually equal or exceed zero (relative spacing increasing). For these stands, predictions of the crash factor using the appropriate equation approach zero or became negative (an illogical result). Hence, a lower bound of 0.6 is imposed on CF. Its minimum value in the fitting data was about 0.64. Constraining CF to 0.6 or above is equivalent to constraining dS/dH to $-0.00048154$ or as follows:

If $dS/dH \leq -0.00048154$, $CF = 1 - e^{-k1(k2 + dS/dH)}$ where
$k1 = 2467.0$
$k2 = 0.00085296$;

If $dS/dH > -0.00048154$, $CF = 0.6.$

The revised estimate of stand basal area is computed by multiplying the basal area estimate by the crash factor.

When applying the crash factor in the projection of an existing stand, it is important to use an asymptotic estimate of initial basal area for $BA_1$ which should be multiplied by the quantity 1/CF. Otherwise, the mathematical consistency of the basal area projection system is lost over multiple projection periods.

Checking for errors in computed values returned by other modules is completed in box 306. Next, a calculation of the quadratic mean diameter is completed in box 308 (FIG. 12), and a calculation of the percent stocking is done in box 310.

Figure 13:
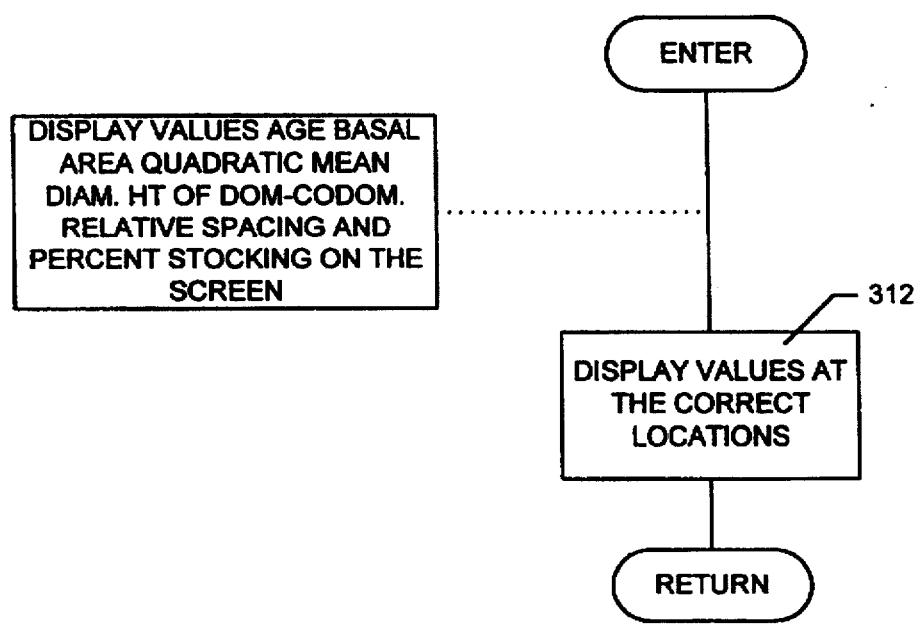
FIG. 13 illustrates the display values flow diagram of the present invention.

FIG. 13 illustrates the display values flow diagram of the present invention. Box 312 calls for the display of values at their proper location on the screen—specifically, age, basal area, quadratic mean diameter, height, relative spacing, and percent stocking.

Figure 14:
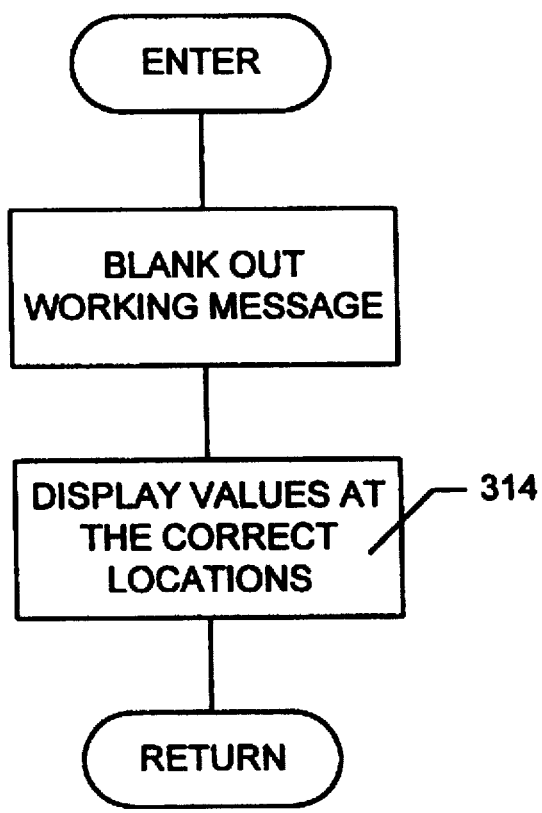
FIG. 14 illustrates the display final portion of calculated values of the flow diagram for the present invention.

FIG. 14 illustrates the display final portion of calculated values of the flow diagram for the present invention. Box 314 shows the display final portion of the calculated values on the screen. The parameters are filled in with the values at the appropriate locations for total green weight, dry weight and cubic foot to include merchantable, pulp, chip & saw and saw for each of the following: total yield in green tons per acre, total dry weight, total cubic feet per acre, merchantable yield in green tons per acre, merchantable dry weight, merchantable cubic feet per acre, chip & saw green weight, chip & saw dry weight, chip & saw cubic foot volume, sawtimber yield in green tons per acre, sawtimber dry weight, and sawtimber cubic foot volume. It should be noted that pulp values are calculated as "merchantable–saw". The currently used dry-weight equation is invalid for sawtimber, if the top-diameter is larger than eight inches. Cord values are calculated as seventy-five cubic feet of solid wood, and multiplied by one thousand to give total board feet.

Figure 15:
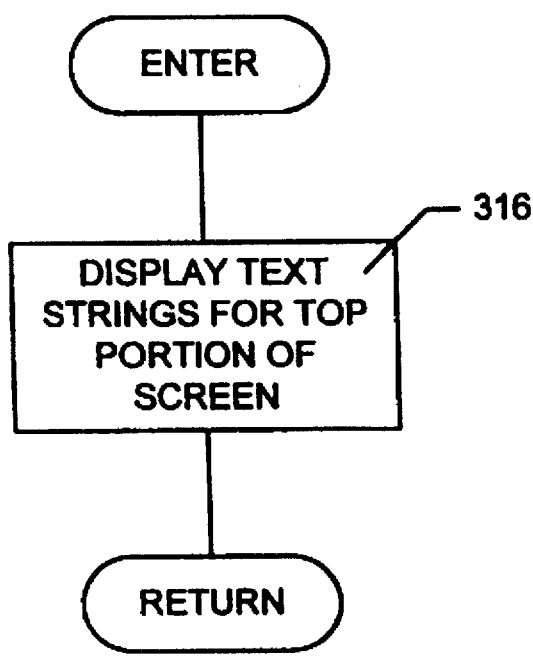
FIG. 15 illustrates a flow diagram for the display of the first text portion of control panel of the present invention.

FIG. 15 illustrates a flow diagram for the display of the first text portion of control panel of the present invention. Box 316 starts with putting the first text portion of the control panel on the screen.

Figure 16:
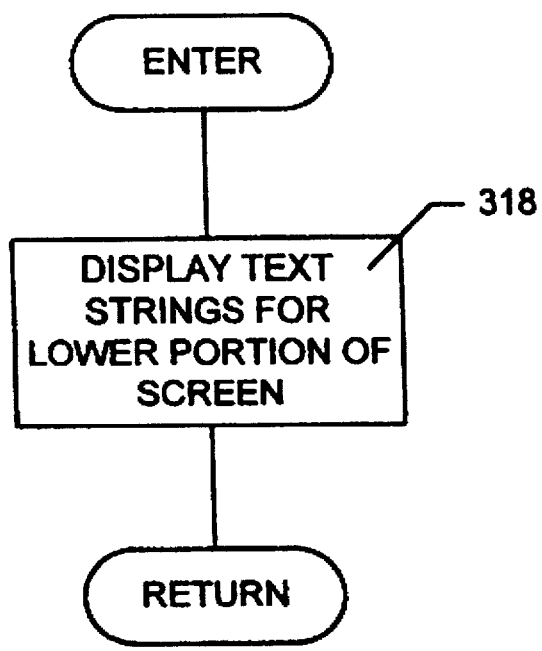
FIG. 16 illustrates a flow diagram for the display of the second part of control panel of the present invention.

FIG. 16 illustrates a flow diagram for the display of the second part of control panel of the present invention. Box 318 begins with putting the second text portion of the control panel on the screen.

Figure 17:
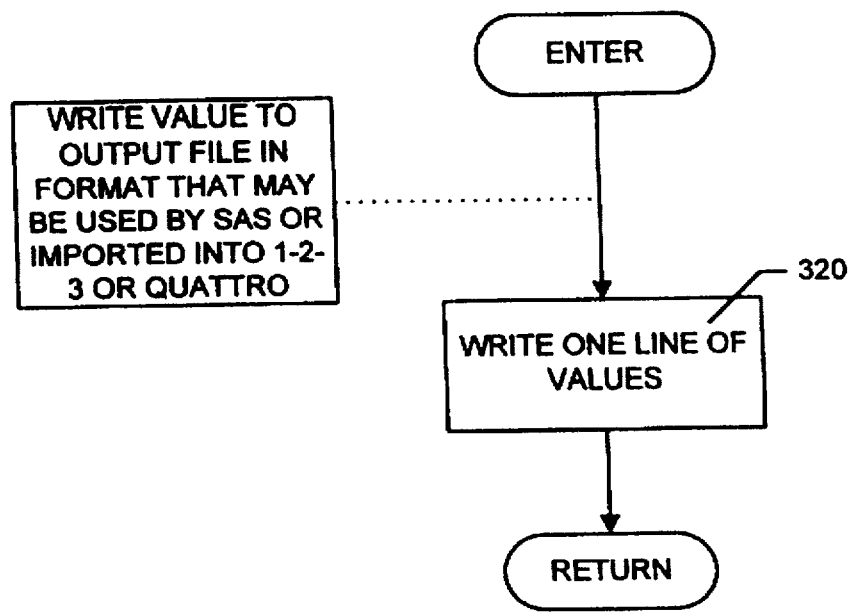
FIG. 17 illustrates the flow diagram for writing values to an output file of the present invention.

FIG. 17 illustrates the flow diagram for writing values to an output file of the present invention with box 320.

Figure 18:
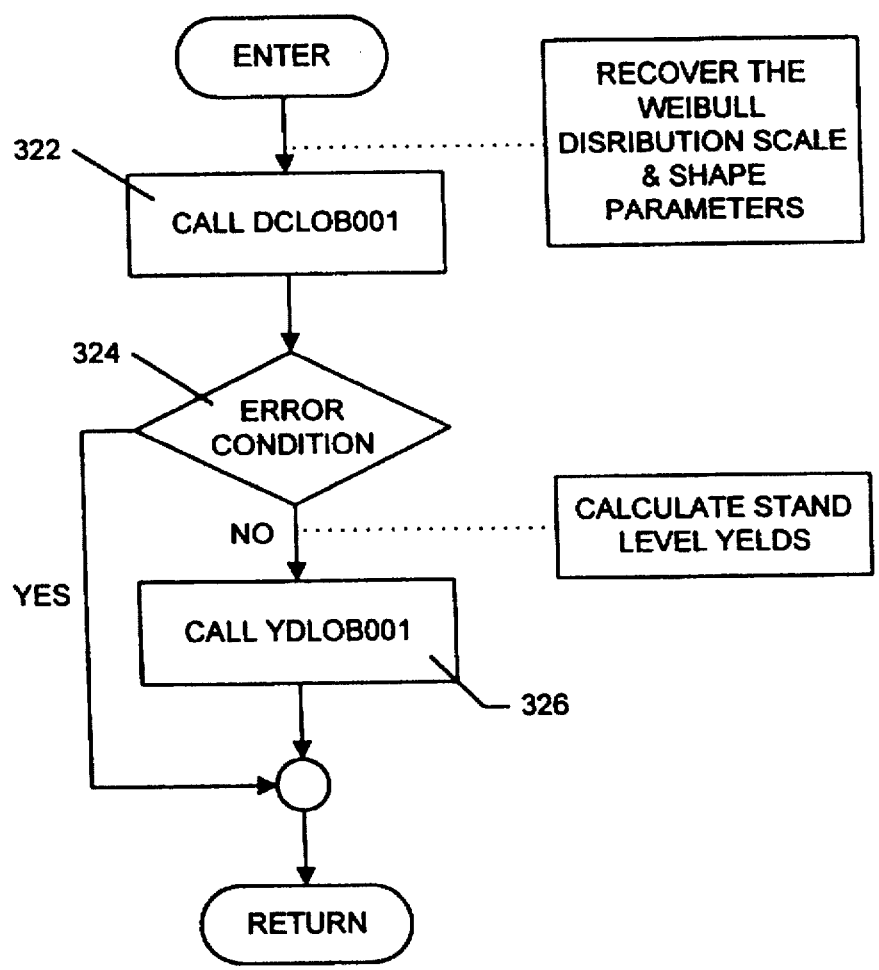
FIG. 18 illustrates the flow diagram for controlling the calling order of the present invention.

FIG. 18 illustrates the flow diagram for controlling the calling order of the present invention. This is a complex module that controls the calling order of the modules denoted in the subroutines section. It performs no calculations, because external subroutines are used to compute the Weibull distribution and compute stand level yield. First, there is a declaration of variables; then, in box 322, a call to recover the Weibull distribution scale and shape parameters is executed. An error check condition is performed (box 324). If no error is found, a call is made for calculating stand-level level yields from diameter distribution based on parameters from the Weibull distribution (box 326).

Figure 19:
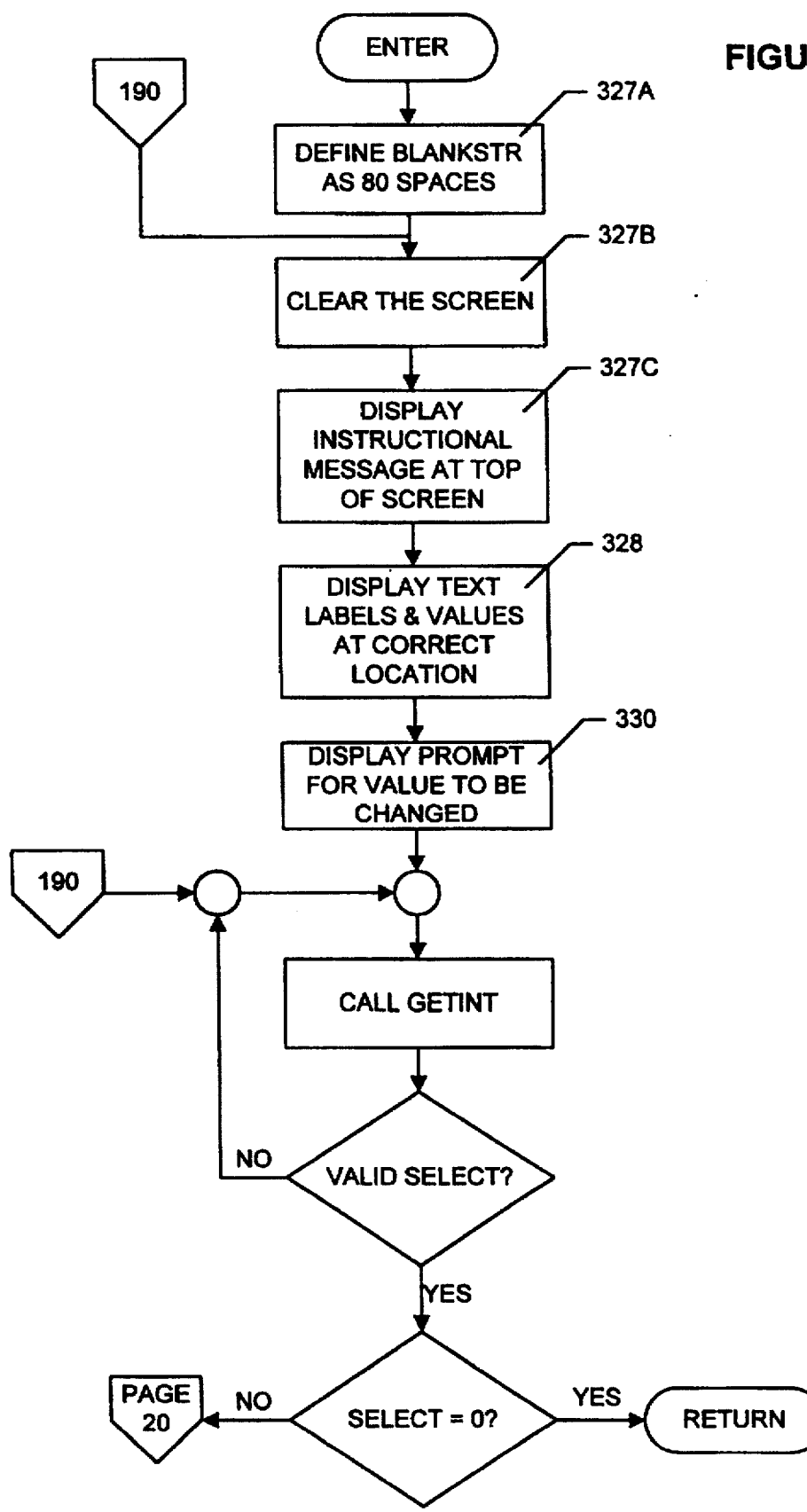
Figure 21:
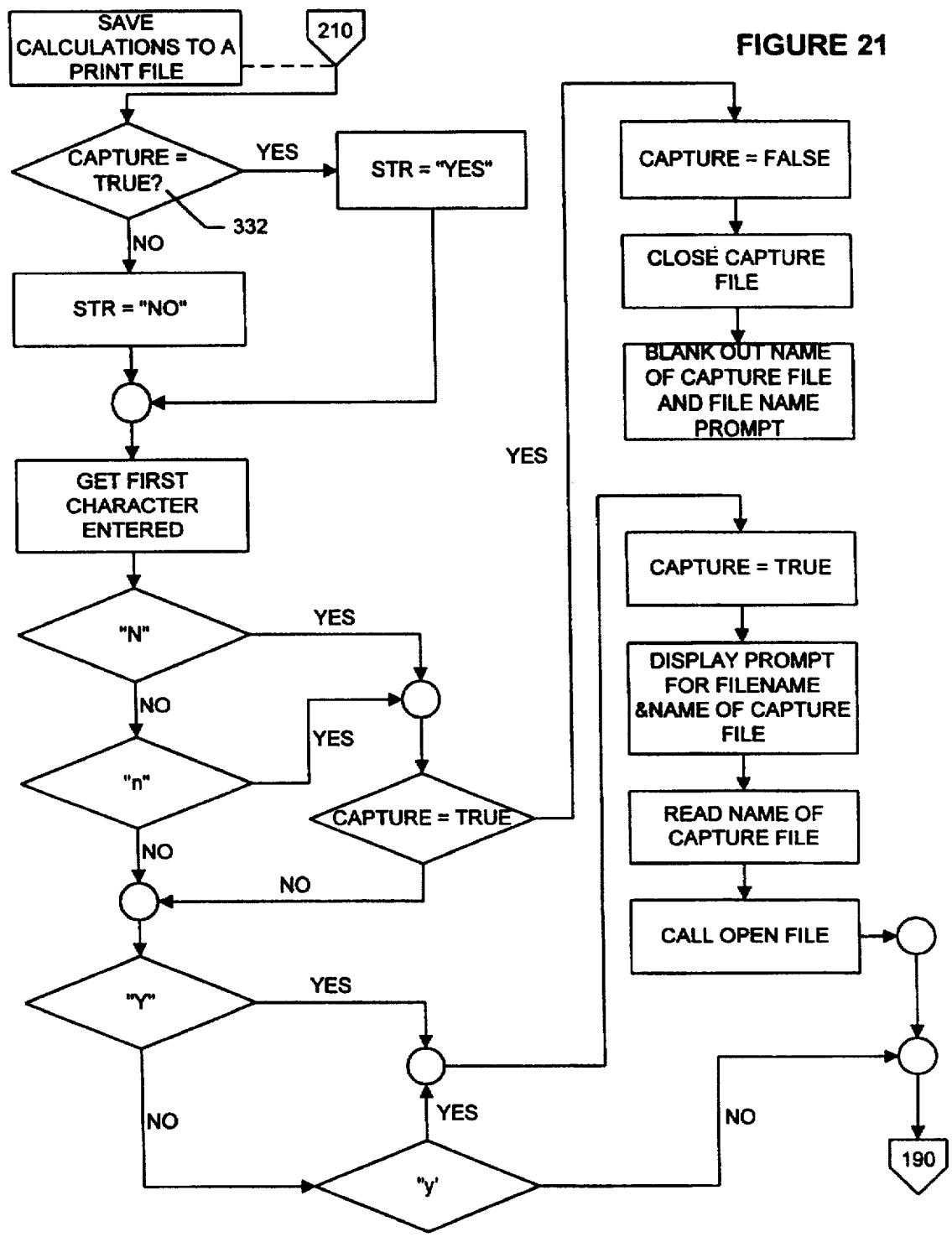
Figure 22:
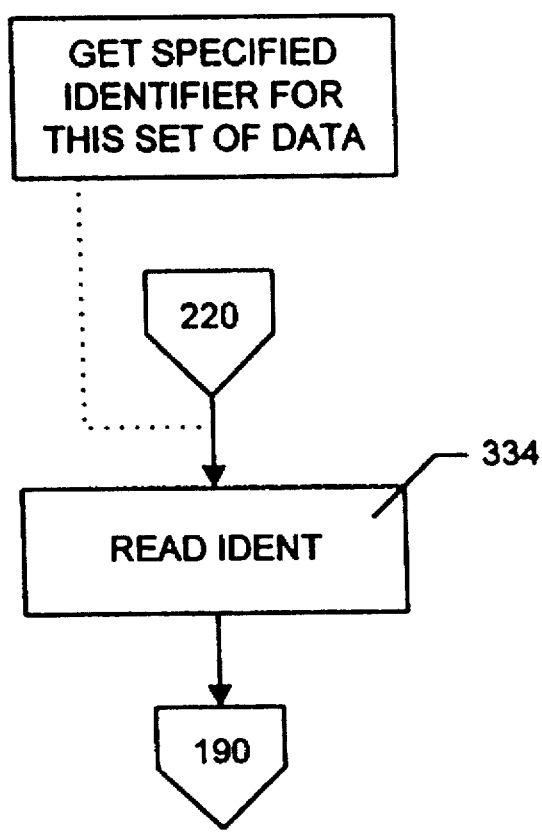
Figure 23:
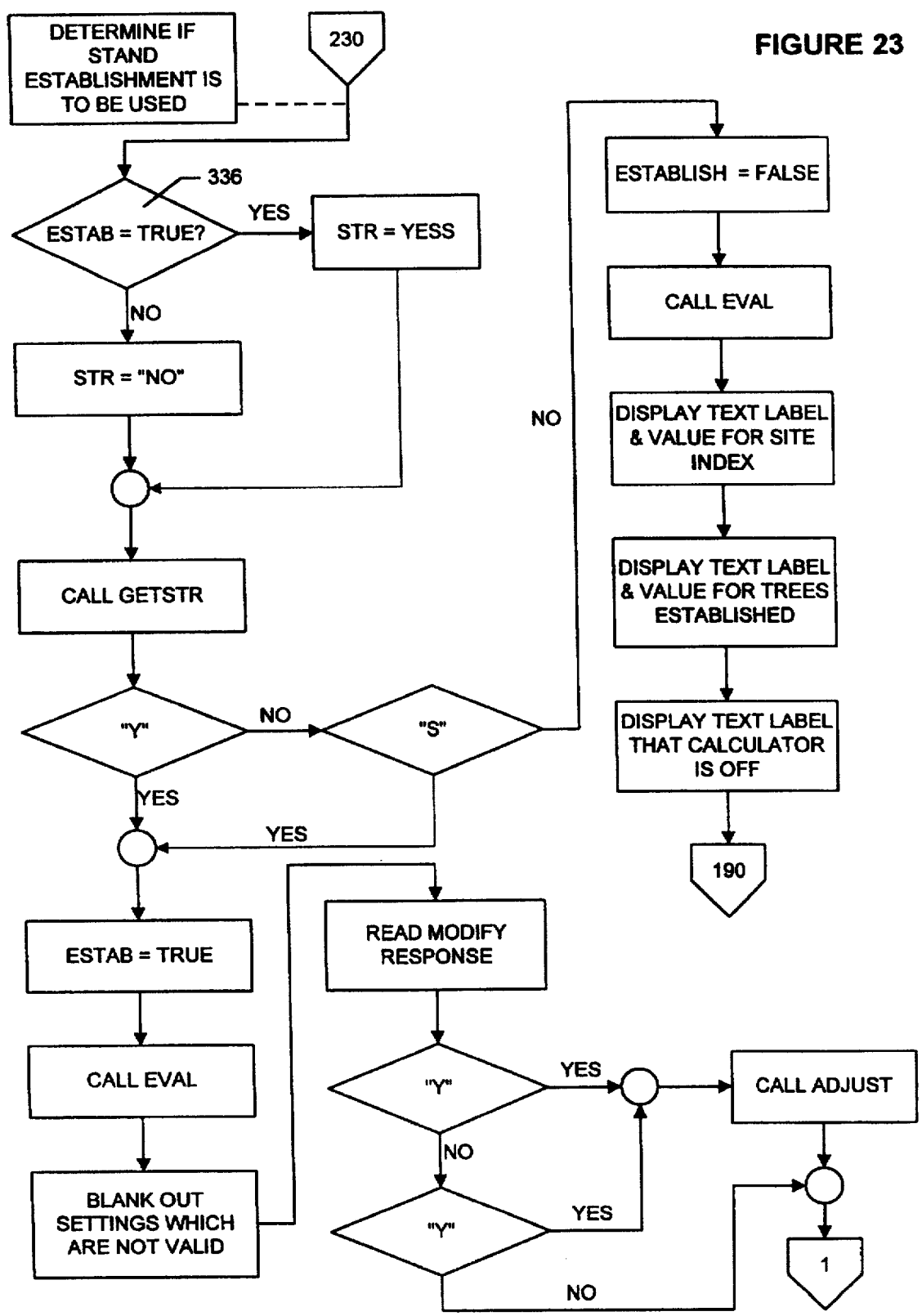
Figure 24:
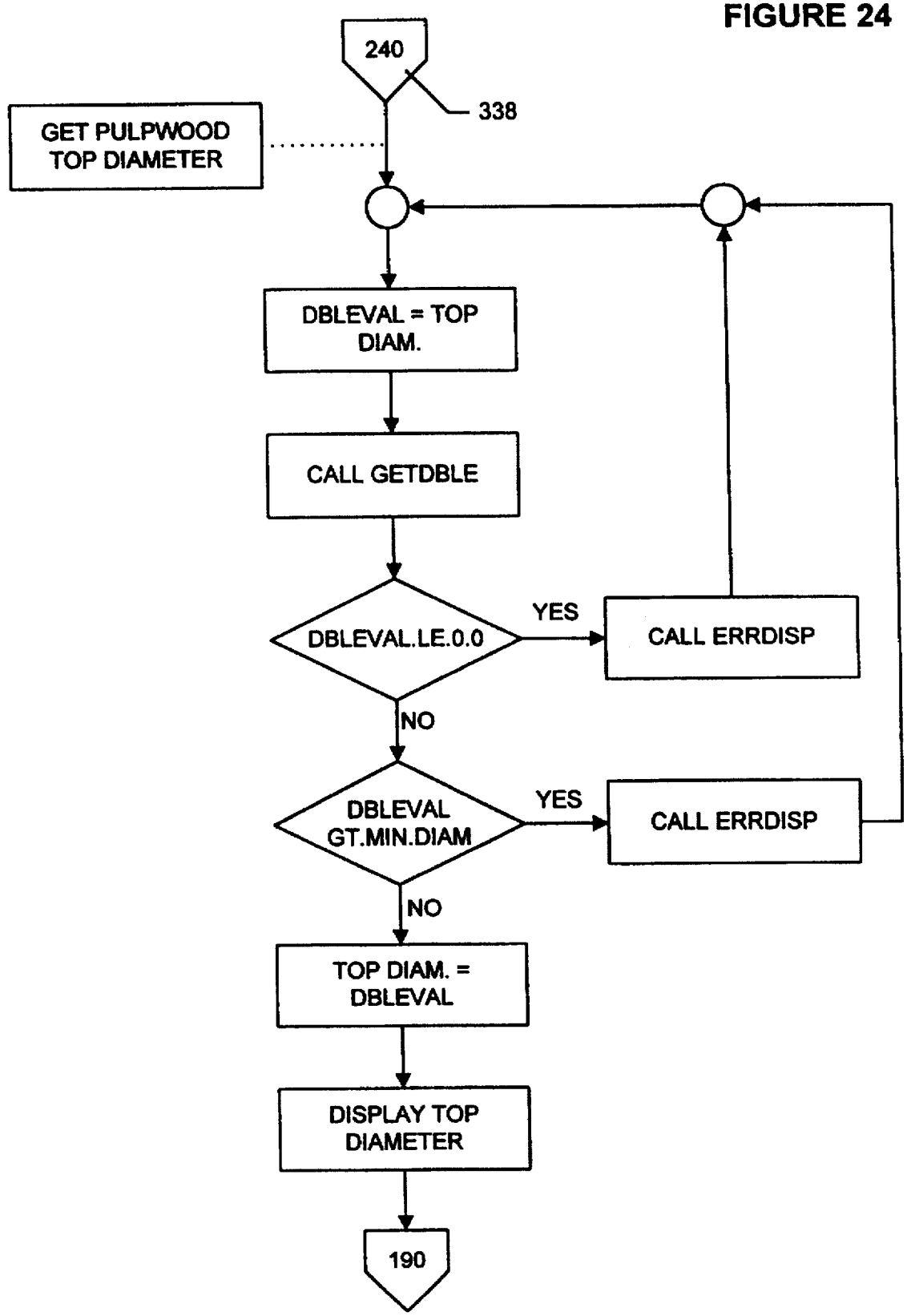
Figure 25:
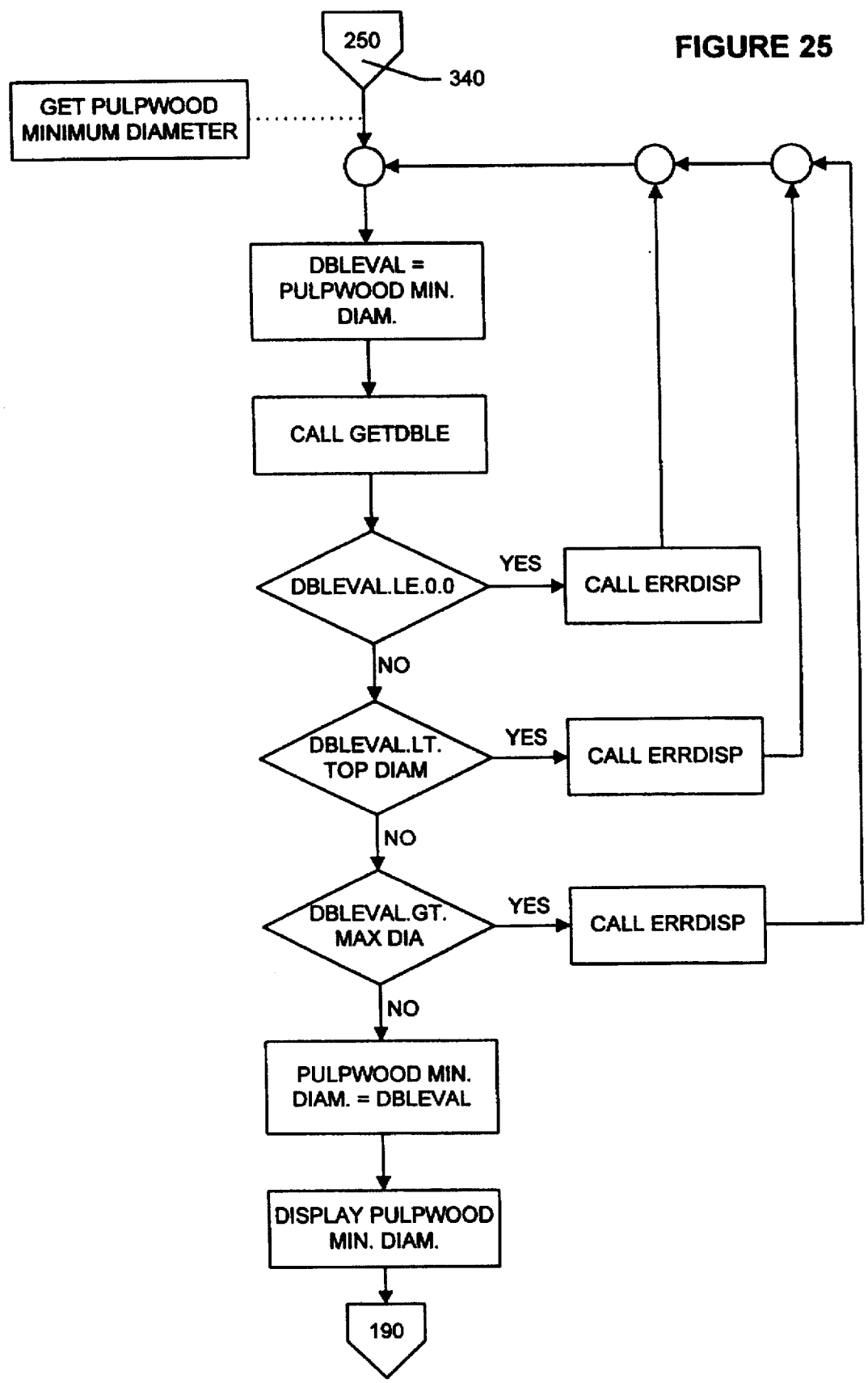
Figure 26:
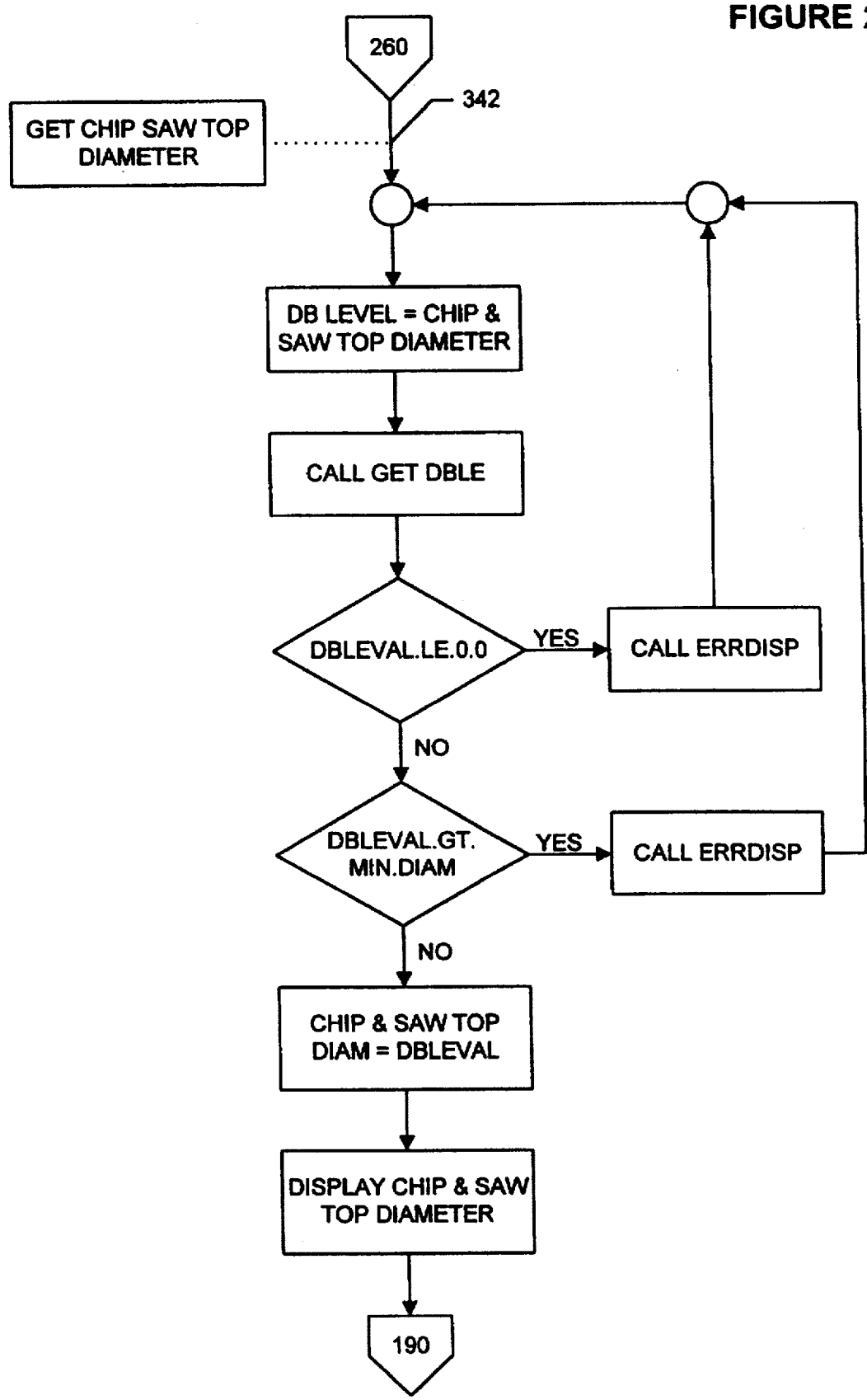
Figure 27:
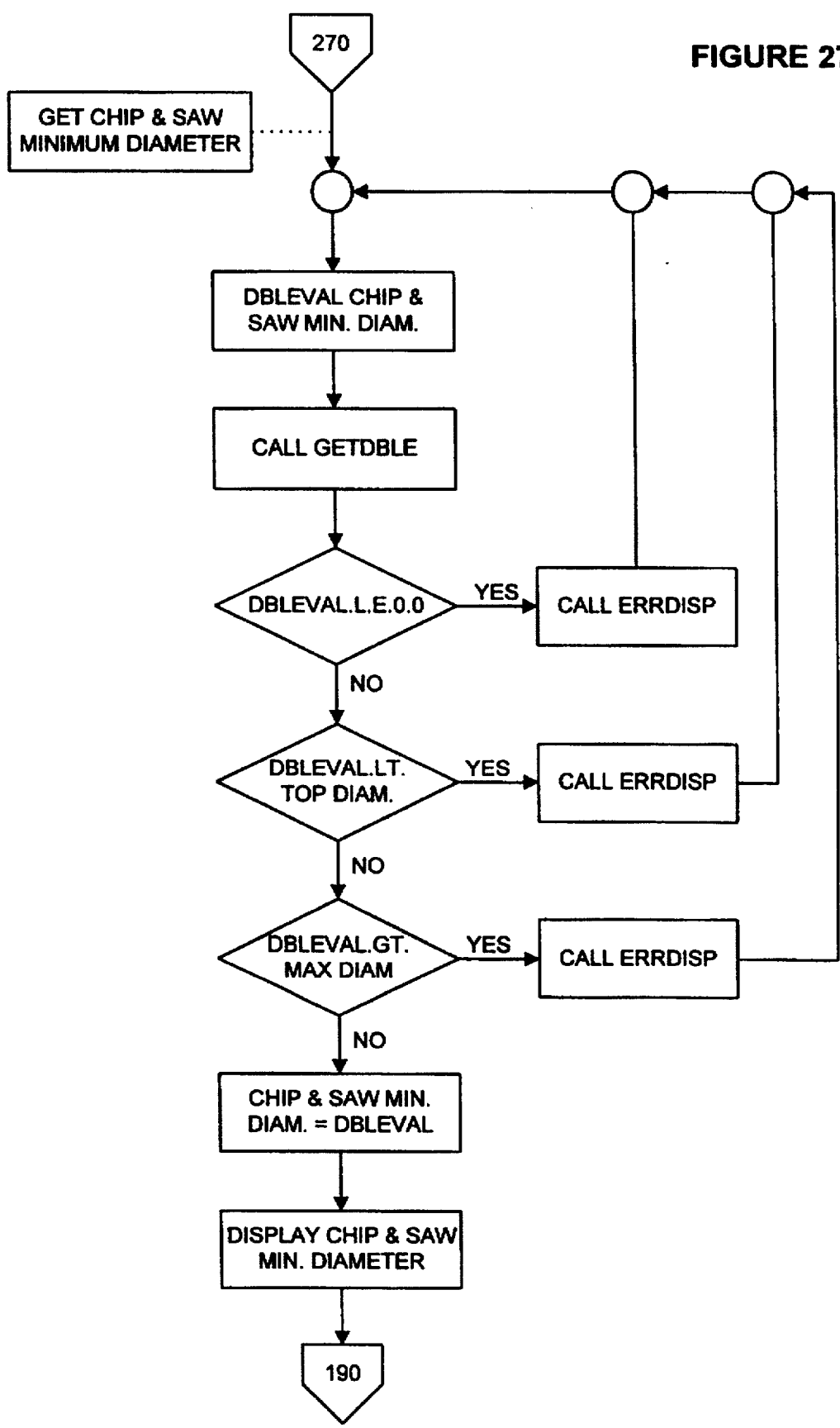
Figure 28:
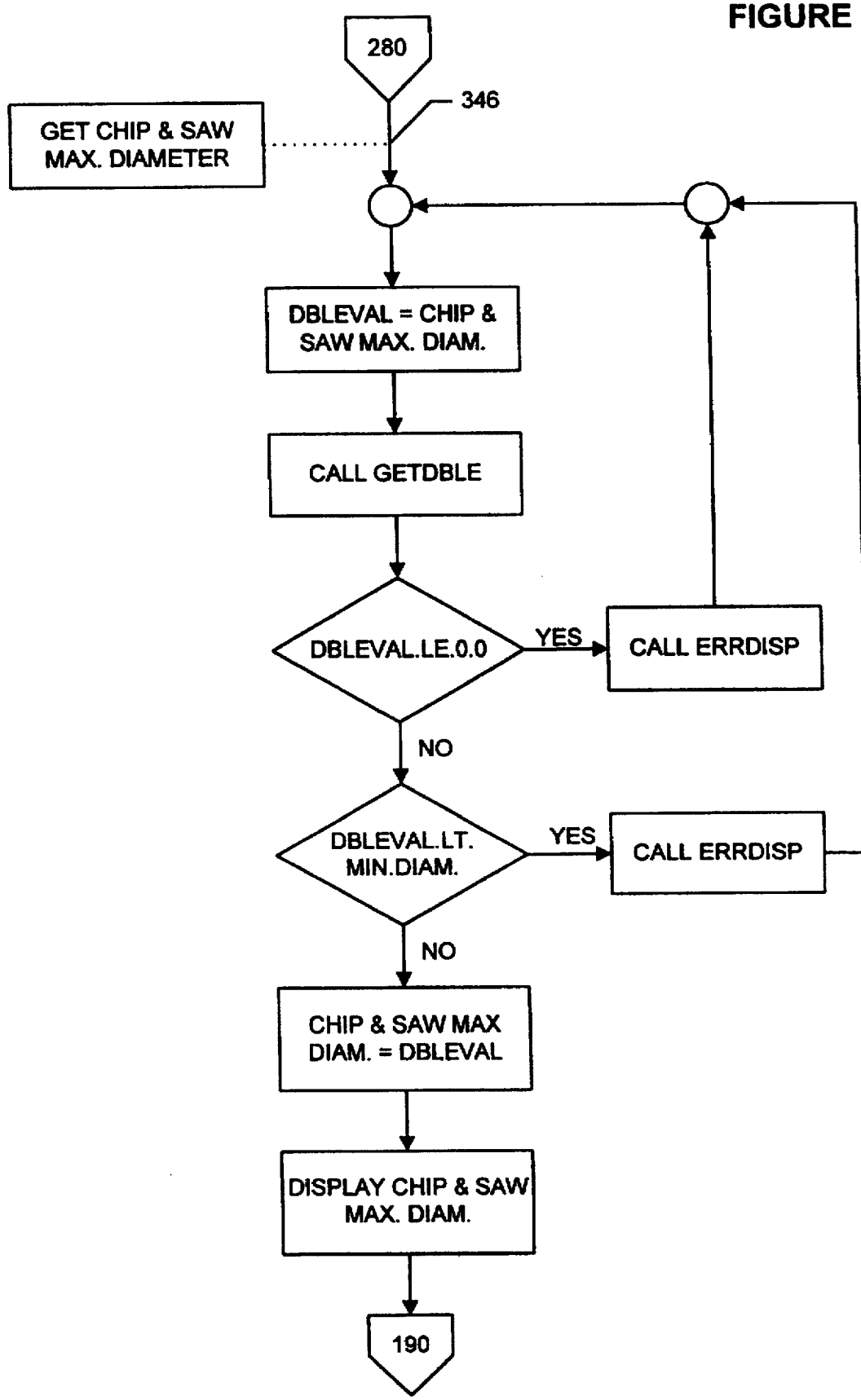
Figure 29:
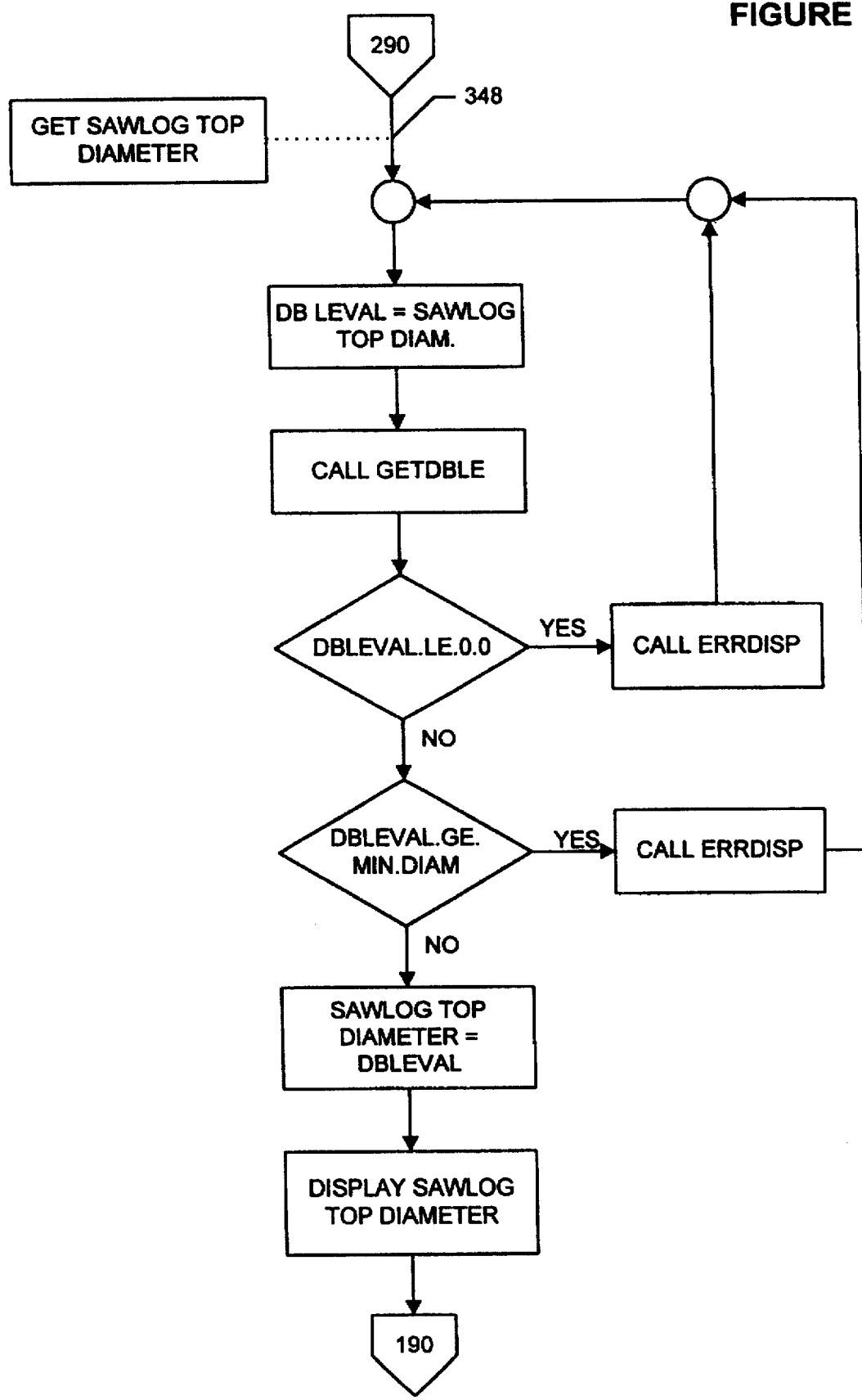
Figure 30:
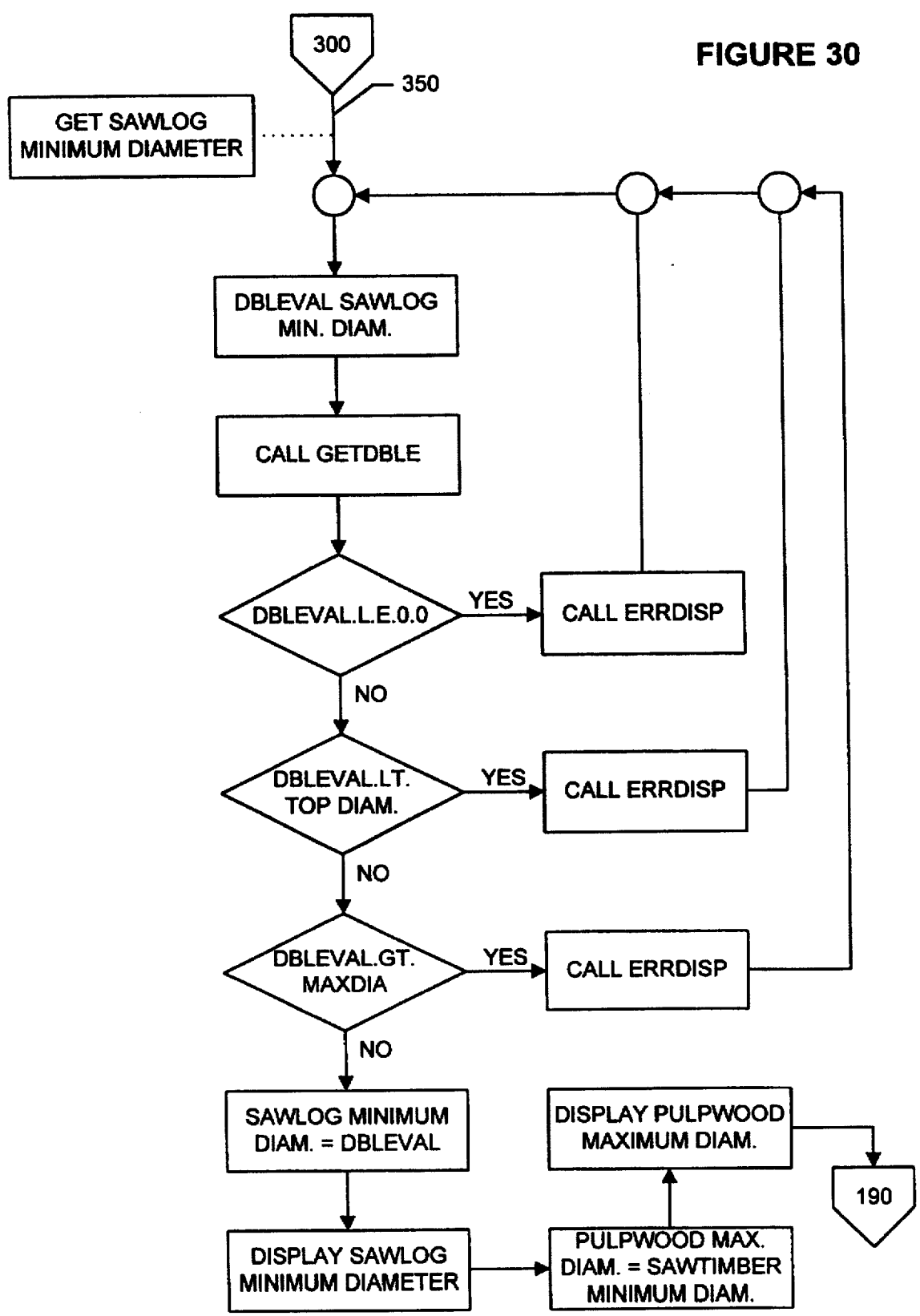
Figure 31:
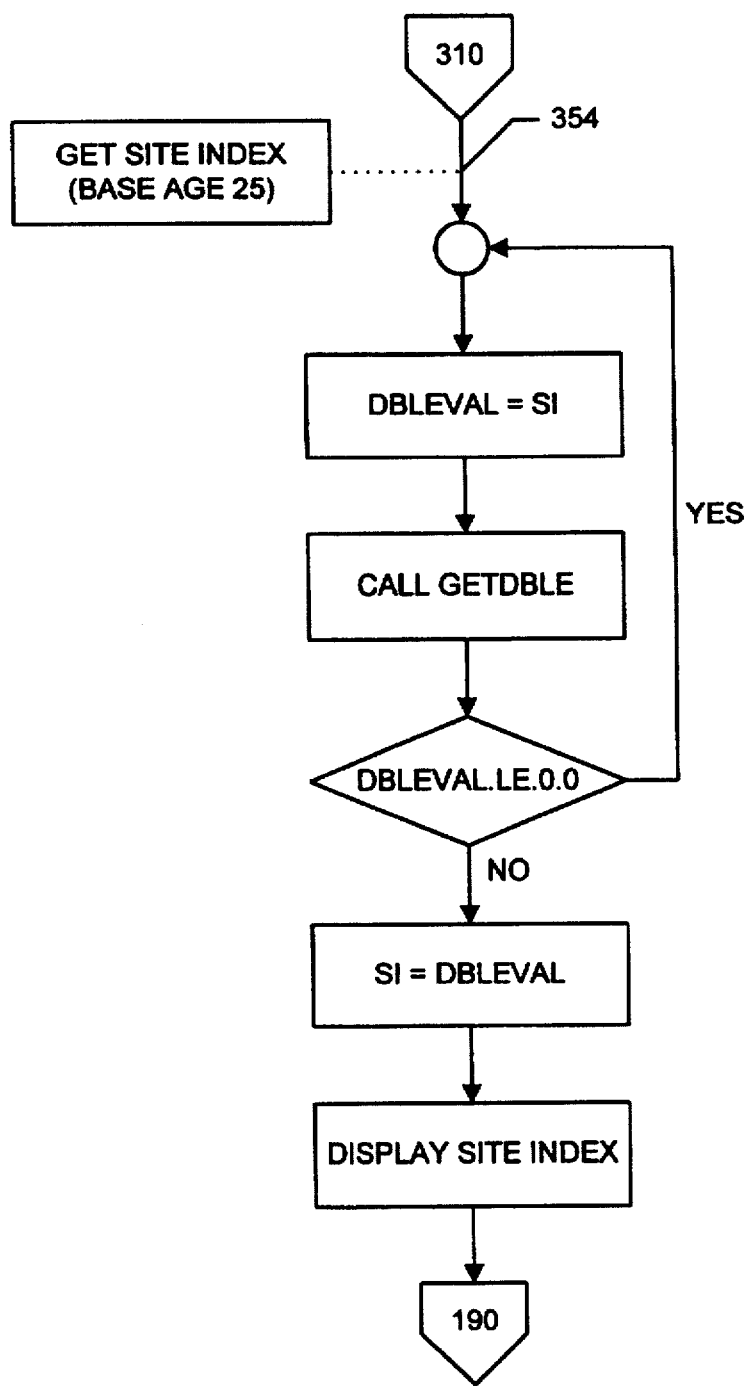
Figure 32:
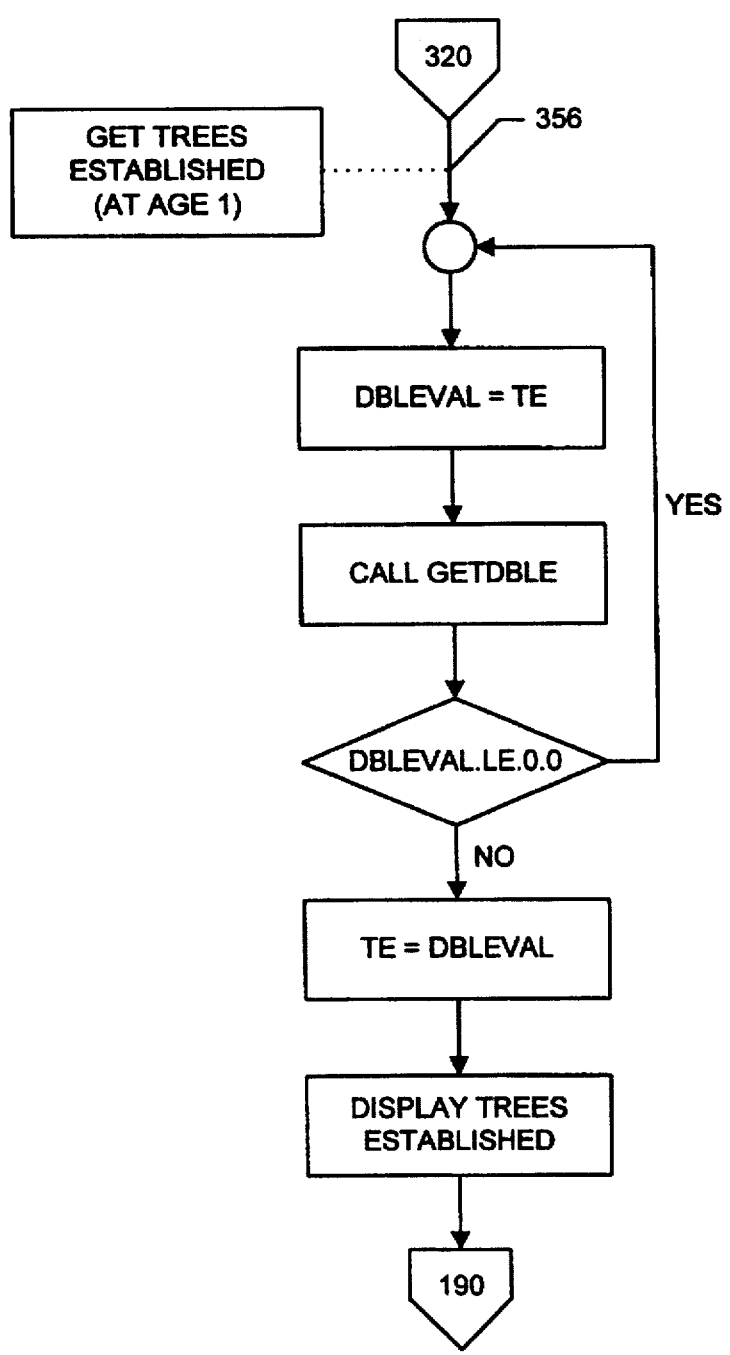

FIGS. 19 and 20 illustrate the get values for settings variables flow diagram of the present invention. After some initial operations (boxes 327a–327c), variable labels and current values of variables are displayed (box 328). In box 330, a prompt for new value settings occurs. Decision boxes 332 thru 358 are then executed. As a result of each decision or situation, an appropriate routine from FIGS. 20–32 is executed.

Referring to FIG. 19, box 332 is for saving calculations to a print file, and for blanking out the filename prompt. In box 334, the system gets a specified user identification field for a captured file. There is a question, in box 336, for stand establishment model. In the following boxes, the system gets the indicated parameter: box 338—pulpwood top diameter; box 340—pulpwood minimum dbh; box 342—chip & saw top diameter; box 344—chip & saw minimum dbh; box 346—chip & saw maximum dbh; box 348—sawlog top diameter; box 350—sawlog minimum diameter. Box 352 is a check to determine if pulpwood maximum diameter is equal to sawtimber minimum diameter. Then the following data are obtained: box 354—site index base age twenty-five; box 356—number of trees established at age one. Box 358 is to use the Calculator. In box 360, there is a call for the calculator subroutine.

Figure 33:
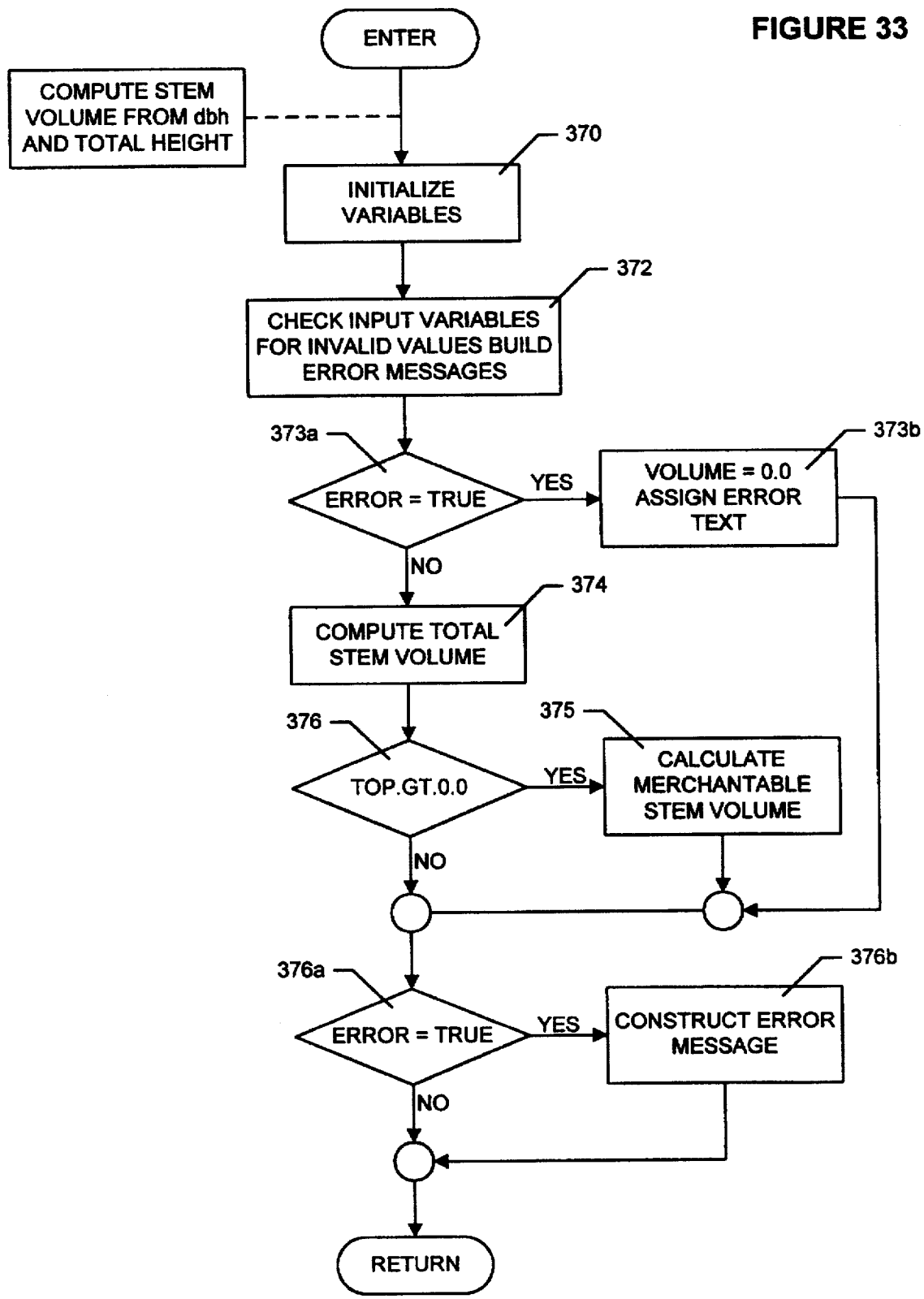
FIG. 33 illustrates a flow diagram for determining total stem volume, inside the bark, or merchantable volume from dbh and total height for the present invention.

FIG. 33 illustrates a flow diagram for determining total stem volume, inside the bark, or merchantable volume from dbh and total height for the present invention. To begin, box 370 initializes variables. Box 372 checks input variables for invalid values and builds an error message or messages. If there is an error (box 373a), volume=0.0 and error text is assigned (box 373b). Otherwise, box 374 calculates volume. Box 375 reduces the Total Stem Volume to a specified Merchantable Stem Volume as a function of the Top Diameter. If the Top Diameter is not greater than zero, this step is bypassed (see box 376). In the event of an error, an error message is constructed (boxes 376a and 376b).

Figure 34:
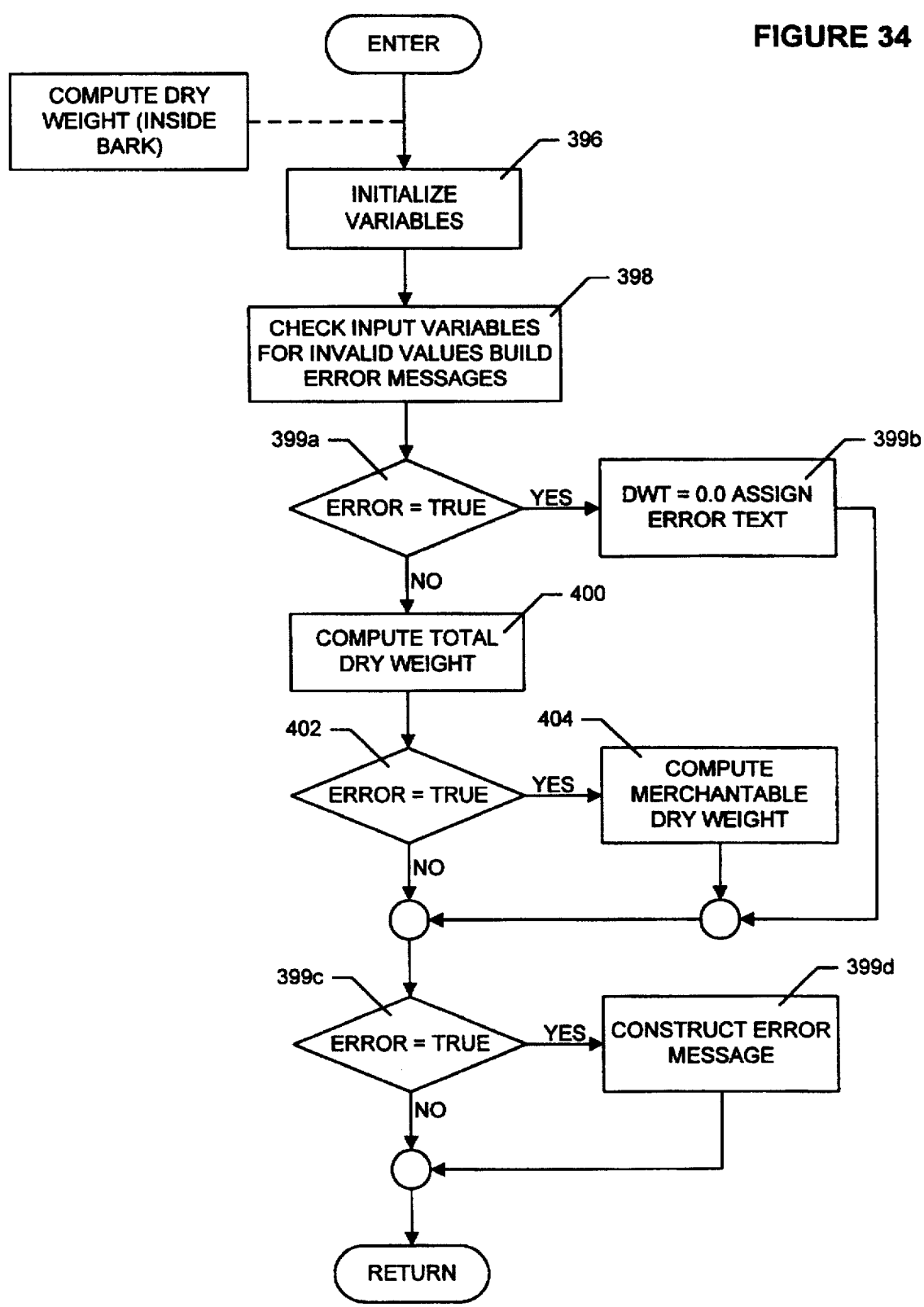
FIG. 34 illustrates a flow diagram for providing an equation which calculates total stem dry weight, inside the bark, and if top diameter is not equal to zero, then merchantable dry weight is calculated using this total stem estimate and a predetermined Flowers' ratio equation for the present invention.

FIG. 34 illustrates a flow diagram for providing an equation which calculates total stem dry weight inside the bark. The system checks to determine if top diameter is not equal to zero. If not, the system calculates merchantable dry weight using this total stem estimate and a Flowers Ratio equation for the present invention. In box 396, variables are initialized. In box 398, the input variables are checked for invalid values and an error message or messages are built (see boxes 399a–399d). In box 400, total dry weight in pounds inside bark is calculated. In box 402, a decision is made as to whether or not top diameter is specified (i.e., >0); if so, then the system calculates dry weight as merchantable dry weight using the equation by Flowers (box 404).

Figure 35:
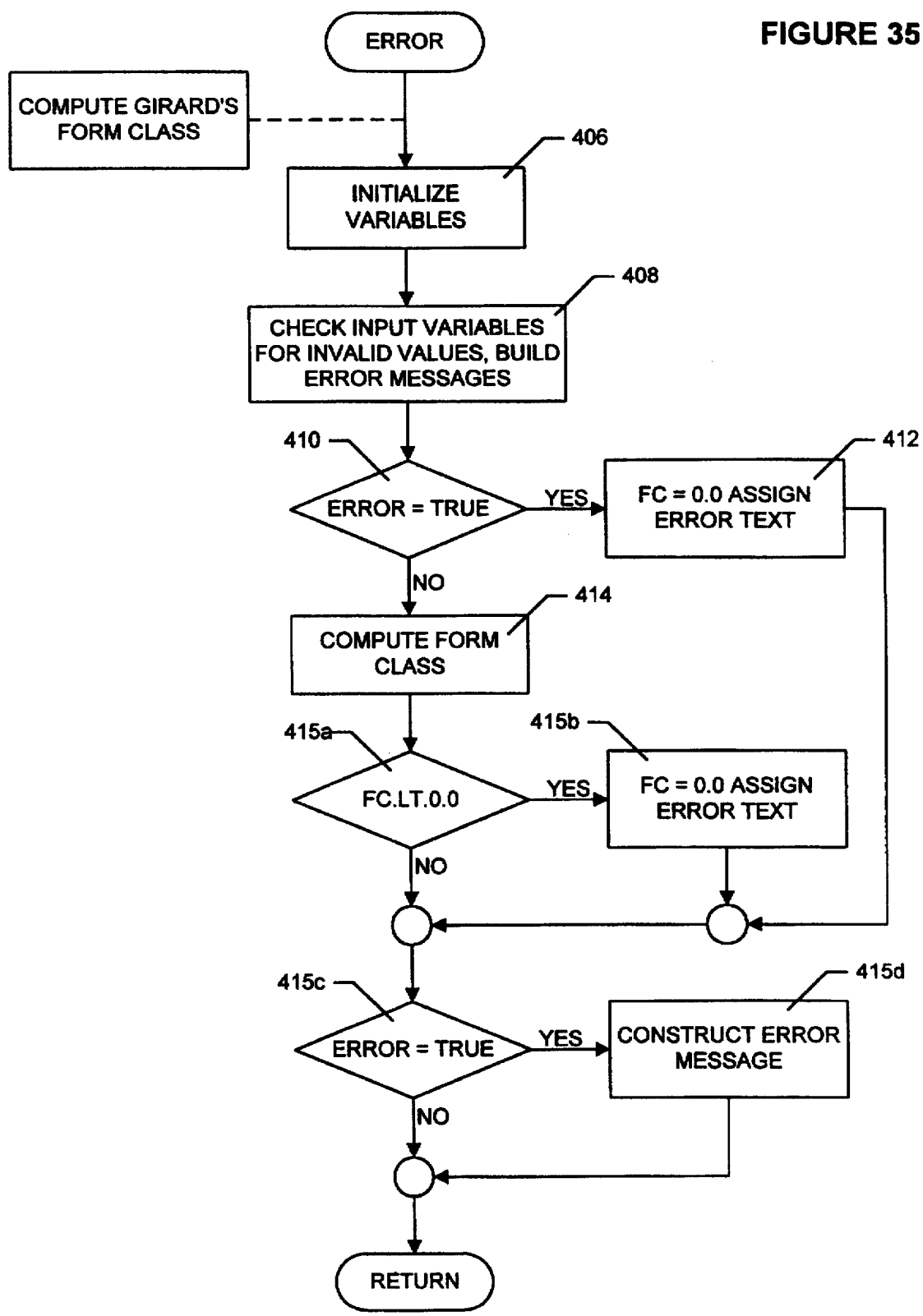
FIG. 35 illustrates a flow diagram for calculating Girard's form class, the ratio of the diameter at the top of the first log to dbh, for an individual planted loblolly pine from an unthinned, unfertilized stand as used by the present invention.

FIG. 35 illustrates a flow diagram for calculating Girard's form class (the ratio of the diameter at the top of the first log to dbh) for an individual planted loblolly pine from an unthinned, unfertilized stand. This equation was developed for unfertilized, unthinned, planted loblolly pine. It has been found to slightly, but not significantly, overpredict form class. Ages less than eight can generate strange results, since this is outside the range of the dataset used to develop the equation. The equation was developed using trees with an age>7, dbh>4.5 inches, and total height>24 inches. The total height should be for an unbroken tree. In box 406, variables are initialized. Box 408 relates to checking input variables for invalid values and building error message or messages. Box 410 relates to deciding if ERROR is TRUE and, if so, setting the output values to zero in box 412. If ERROR IS FALSE, the system performs the calculations in box 414 and returns after making a value check and an error check (boxes 415a–415d).

Figure 36:
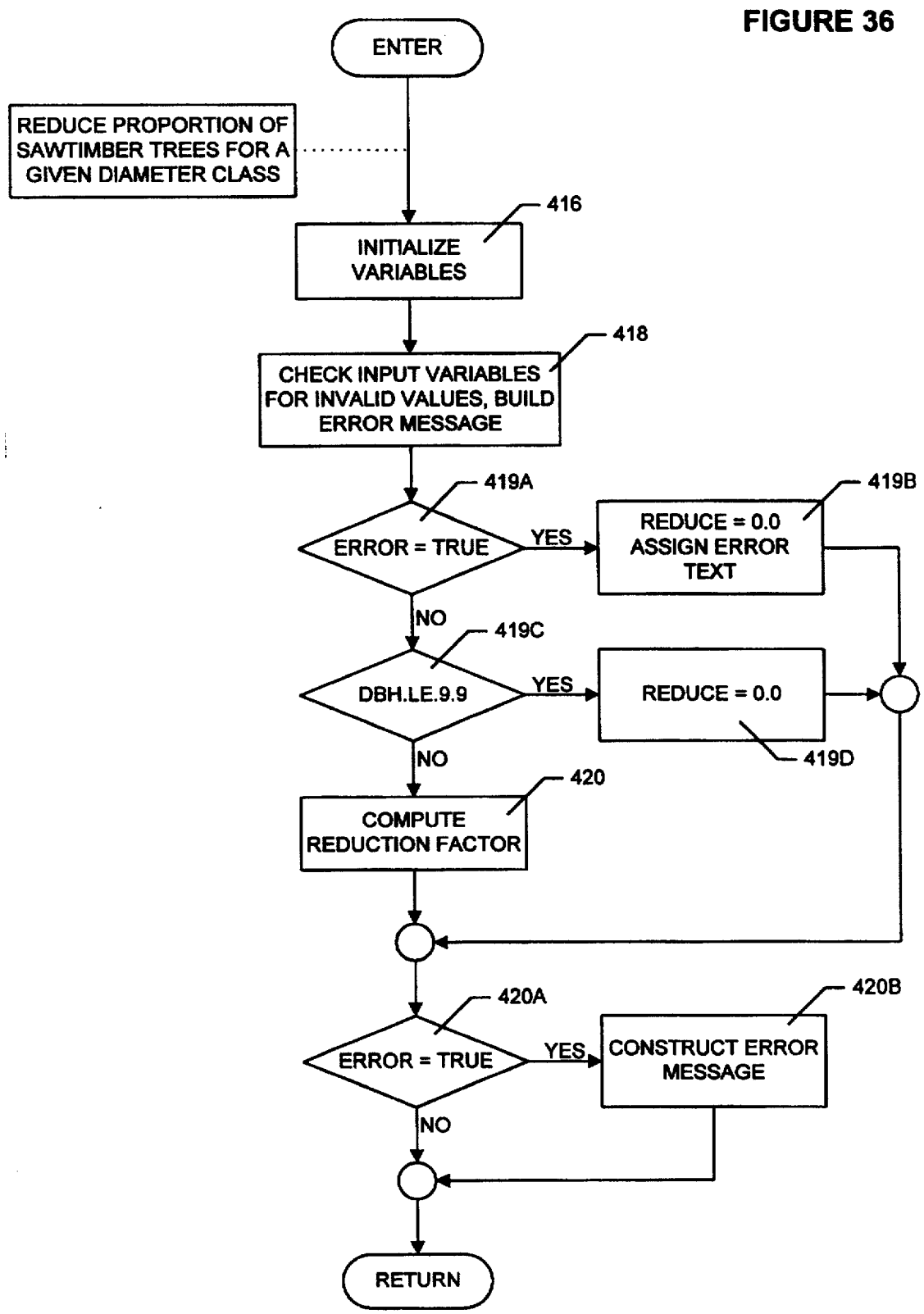
FIG. 36 illustrates a flow diagram for reducing proportion of sawtimber trees for a given dbh class in the present invention.

FIG. 36 illustrates a flow diagram for reducing the proportion of sawtimber trees for a given dbh class in the present invention. Box 416 relates to declaring and initializing variables. Box 418 relates to checking the input variables for invalid values and building an error message or messages (boxes 419a–419d). Box 420 relates to computing reduction factor, after which an error check is made (boxes 420a and 420b).

Figure 37:
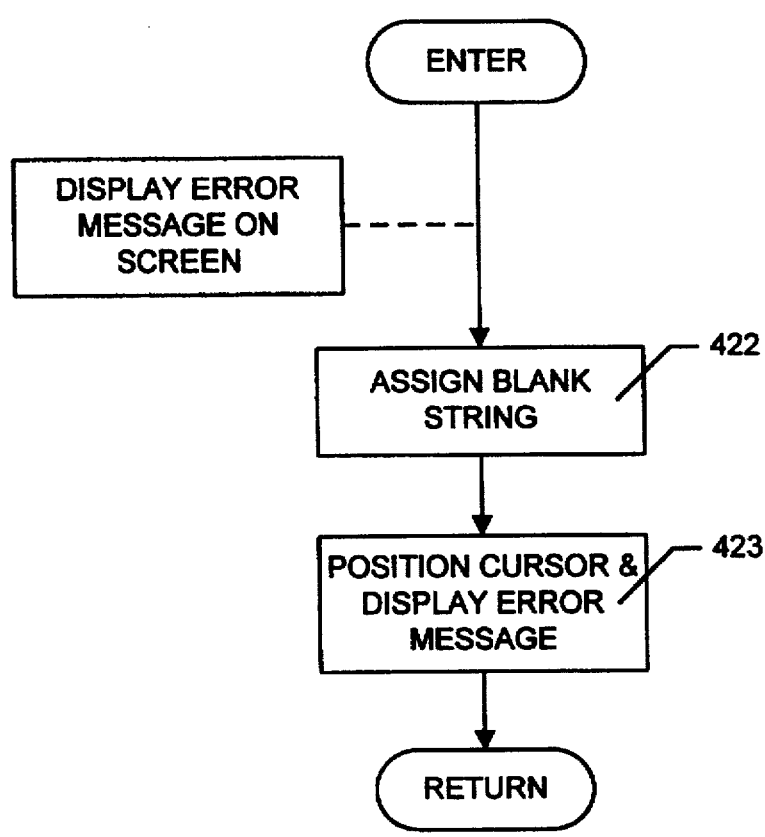
FIG. 37 illustrates a flow diagram for displaying error messages for the present invention.

FIG. 37 illustrates a flow diagram for displaying error messages for the present invention. Box 422 relates to assignment of blank strings. Box 423 relates to positioning of the cursor on the screen and writing the error message.

Figure 38:
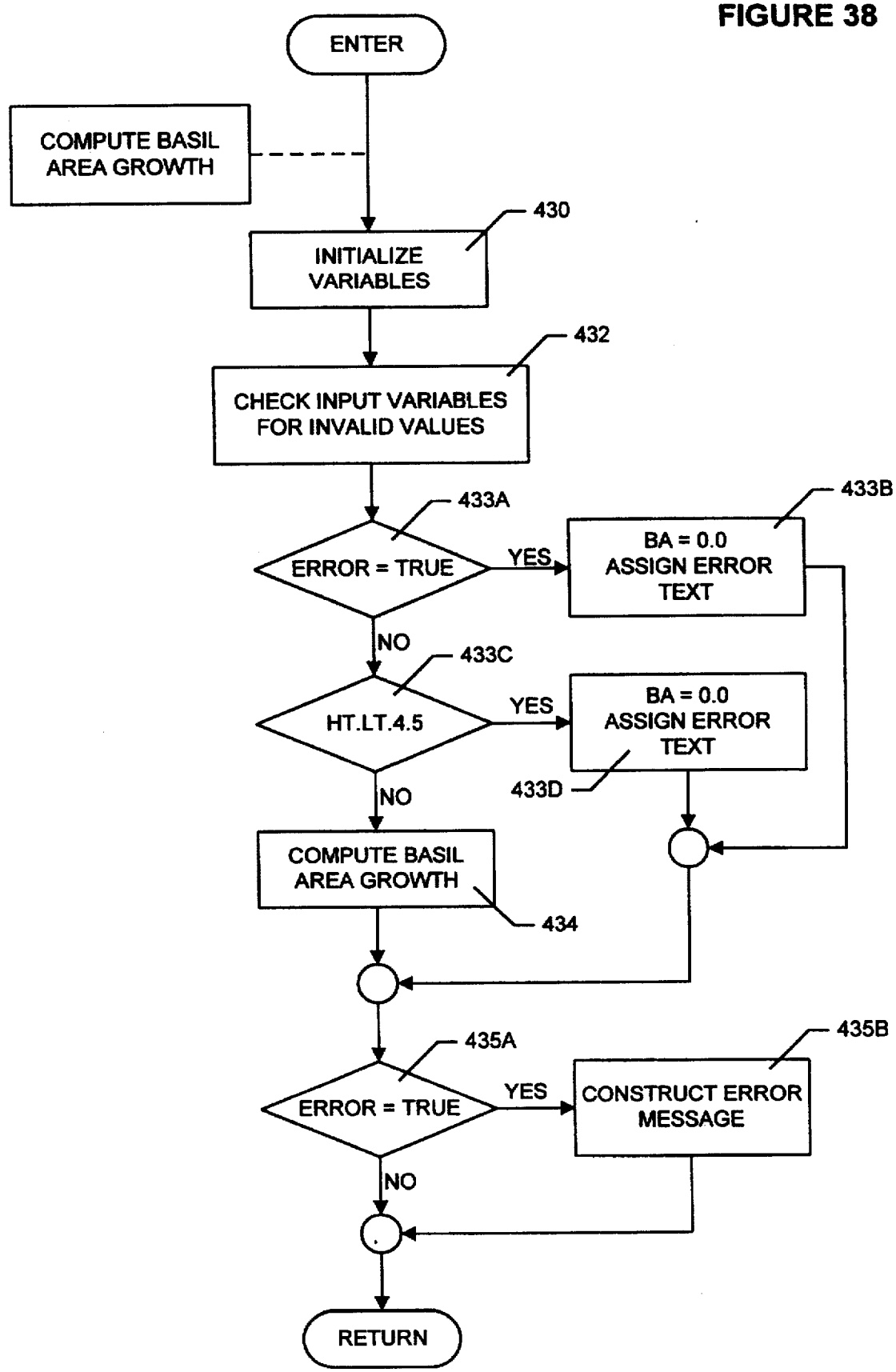
FIG. 38 illustrates a flow diagram for determining basal area growth for the present invention.

FIG. 38 illustrates a flow diagram for determining basal area growth for the present invention. The Basal area growth equation is an asymptotic estimate only, because there is no crash due to high densities. Accordingly, box 430 is for initializing variables. Box 432 relates to checking the input variables for invalid values and building an error message or error messages (boxes 433a–433d). Box 434 relates to computing basal area in square feet per acre if there are no errors or warnings, followed by an error message routine if appropriate (boxes 435a and 435b).

Figure 39:
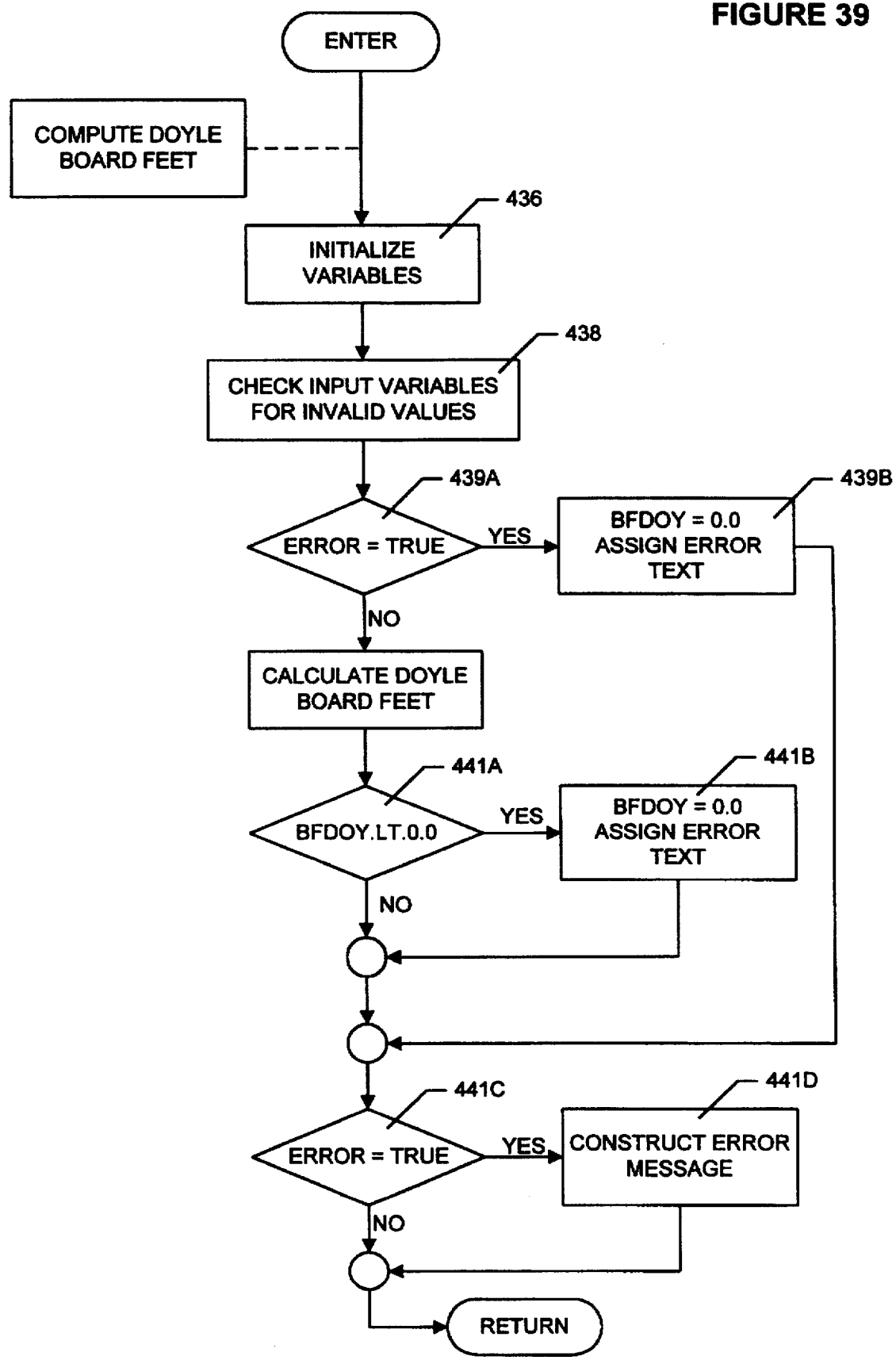
FIG. 39 illustrates a flow diagram for computing board foot volume for one log, according to the Doyle log rule as utilized by the present invention.

FIG. 39 illustrates a flow diagram for computing board foot volume for one log, according to the Doyle Log Rule, as utilized by the present invention. Box 436 relates to declaring and initializing variables. Box 438 relates to checking the input variables for invalid values and building an error message or messages (boxes 439a and 439b). Box 440 relates to calculating Doyle board feet, and is followed by certain value and error checks (boxes 441a–441d).

Figure 40:
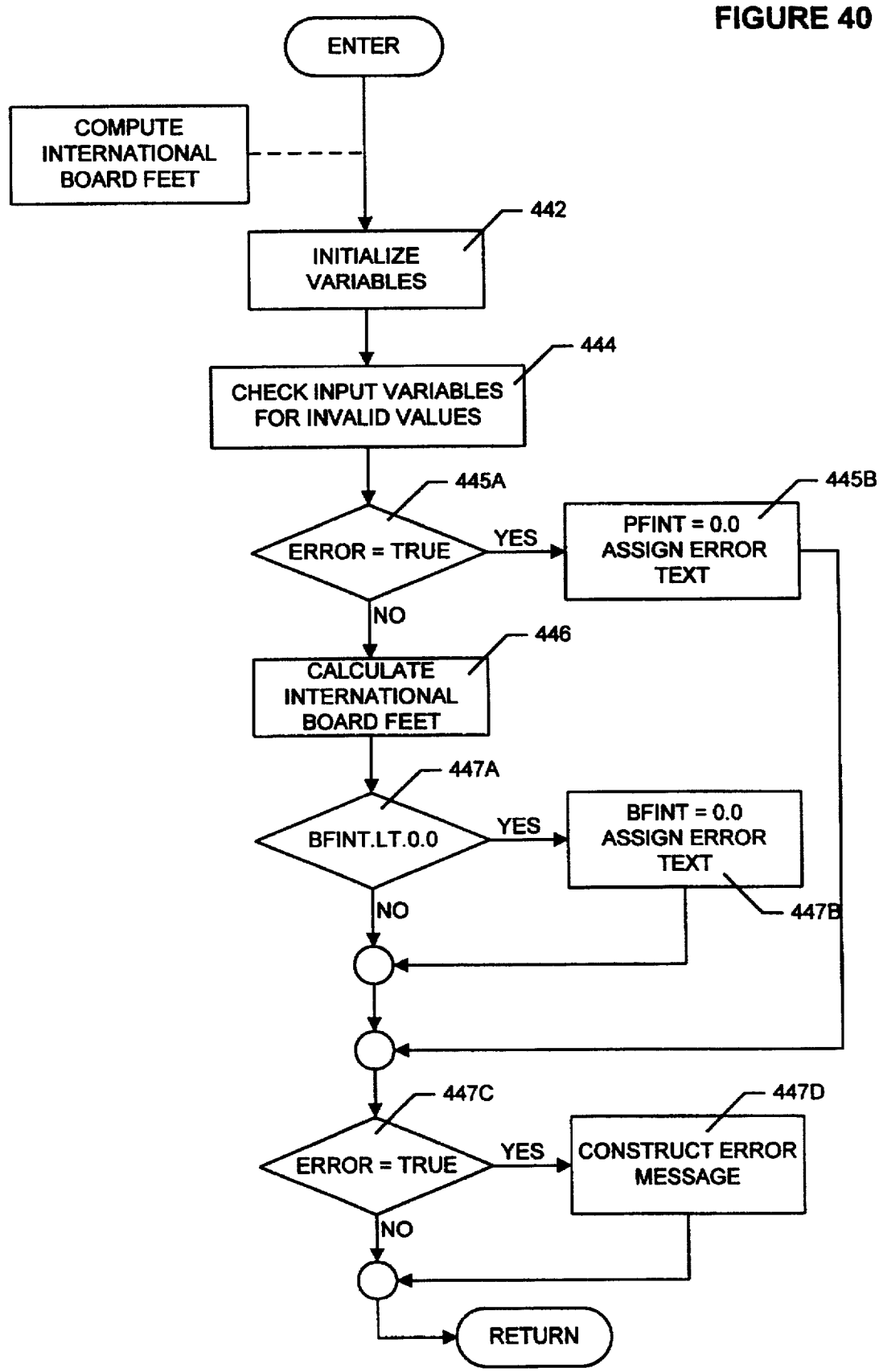
FIG. 40 illustrates a flow diagram for computing board foot volume for one log, according to the International quarter inch rule as utilized by the present invention.

FIG. 40 illustrates a flow diagram for computing board foot volume for one log, according to the International Quarter Inch Log Rule, as used by the present invention. Box 442 relates to declaring and initializing variables. In box 444, the input variables are checked for invalid values and an error message or messages are built (boxes 445a–445b). Box 446 relates to calculating International board feet, and is followed by value and error checks (boxes 447a–447d).

Figure 41:
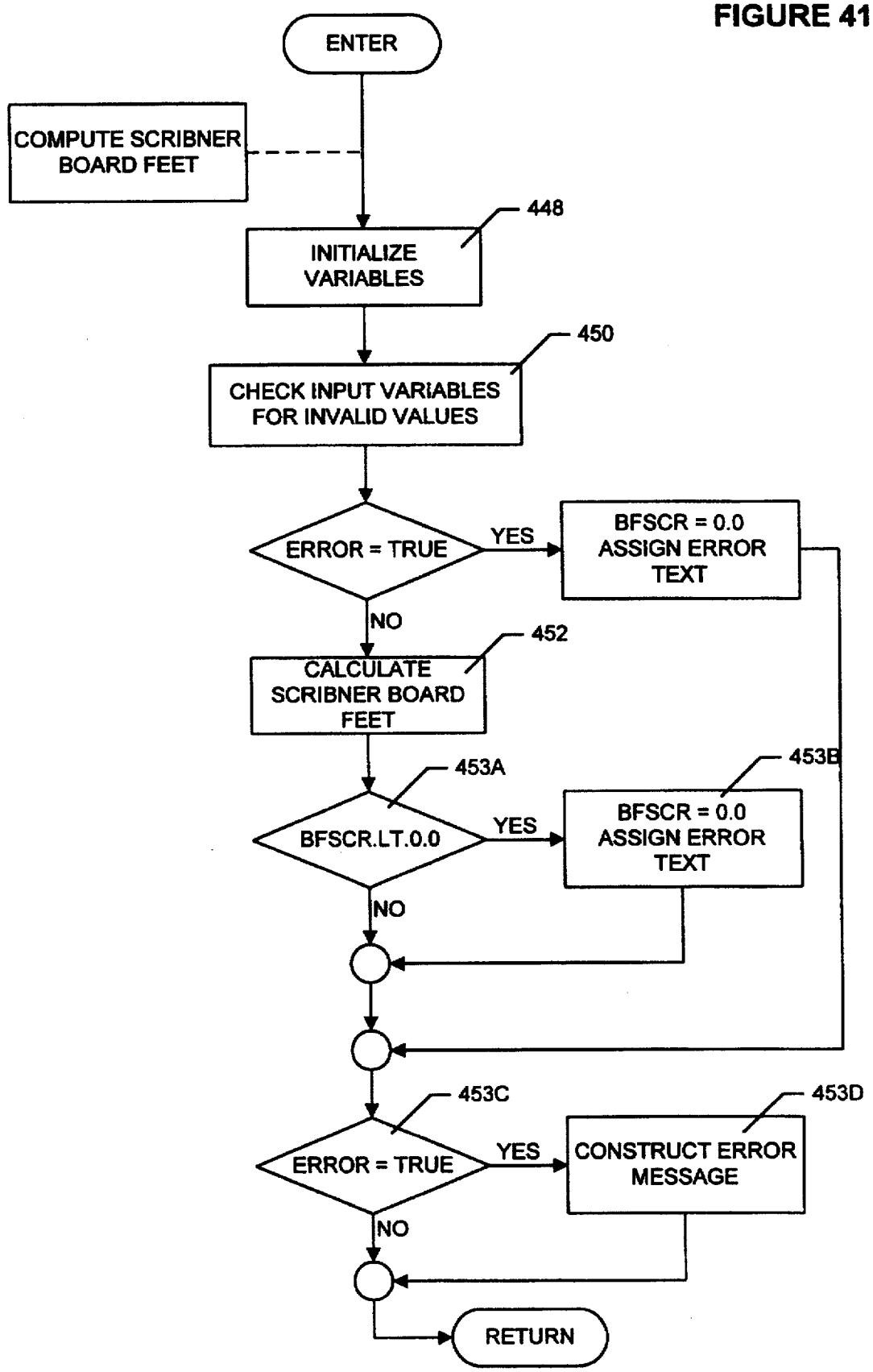
FIG. 41 illustrates a flow diagram for computing board foot volume for one log according to a least squares equation, which approximates the Scribner log rule as utilized by the present invention.

FIG. 41 illustrates a flow diagram for computing board foot volume for one log according to a least squares equation, which approximates the Scribner Log Rule as used by the present invention. Box 448 relates to declaring and initializing variables. Box 450 relates to checking the input variables for invalid values and building an error message or messages (boxes 451a–451b). Box 452 relates to calculating Scribner board feet, and is followed by a value check and an error check (boxes 453a–453d).

Figure 42:
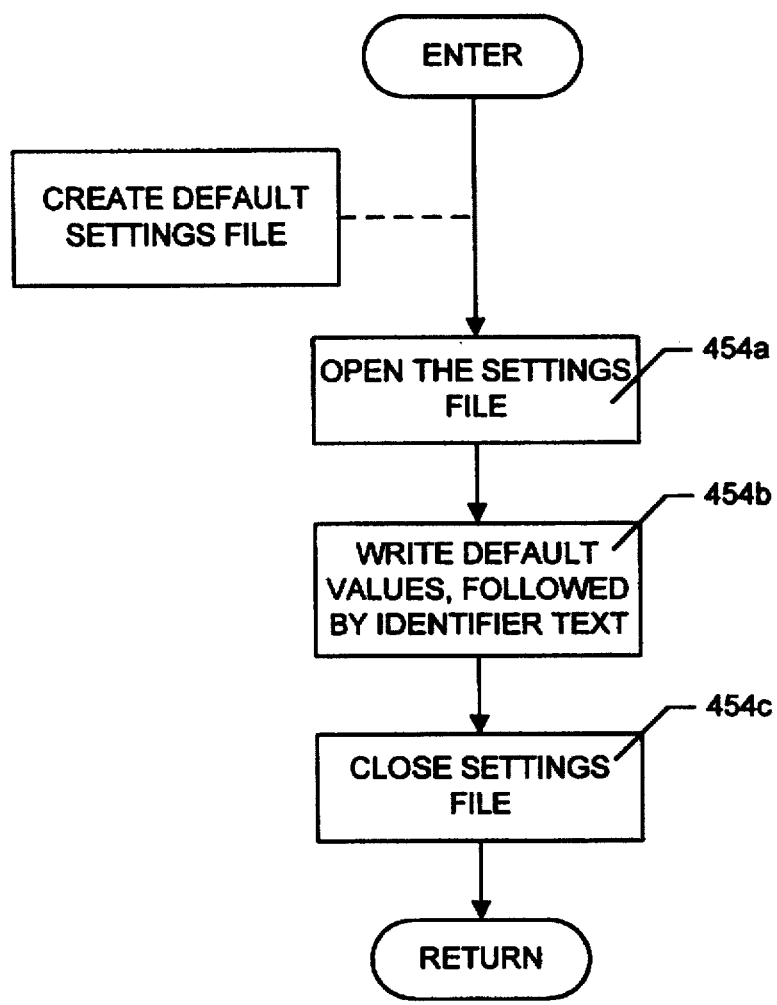
FIG. 42 illustrates a flow diagram for opening nonexistent settings files and writing the default settings to the file, along with identifiers for the values according to the present invention.

FIG. 42 illustrates a flow diagram for creating a default settings file if one does not exist. The system begins by opening the file (box 454a), and then writes the default settings to the file (box 454b). Additionally, the system writes identifiers for the values according to the present invention. The system then closes the file (box 454c).

Figure 43:
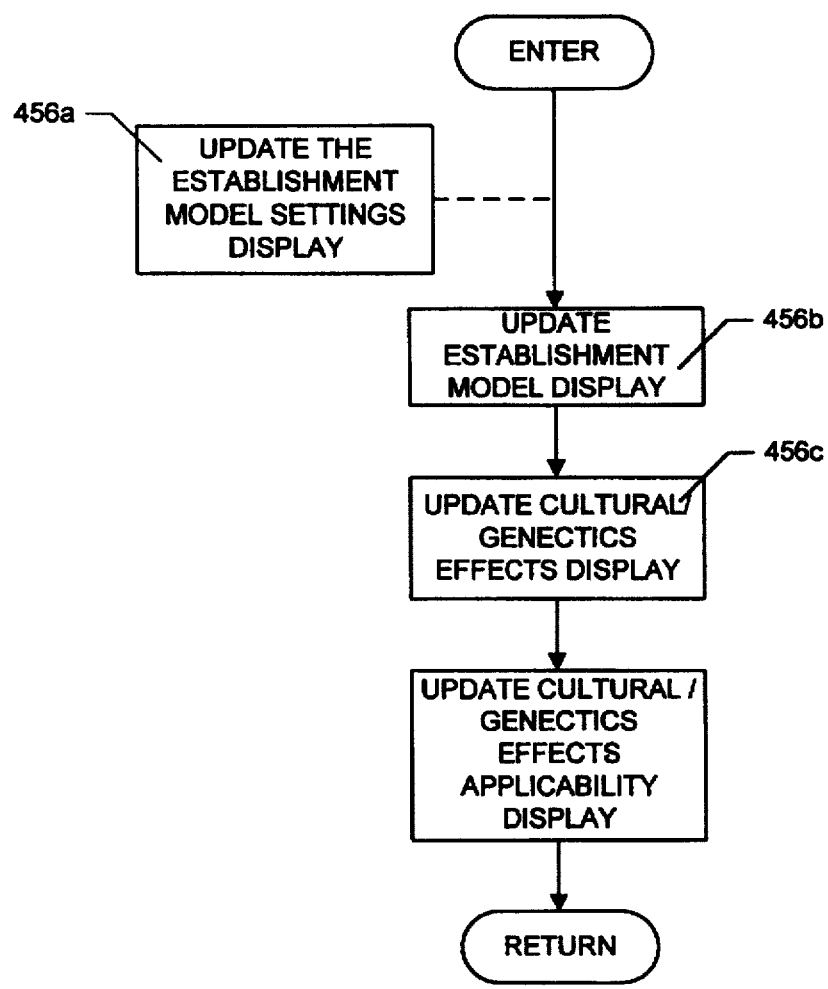
FIG. 43 illustrates a flow diagram for updating the establishment model settings according to the present invention.

FIG. 43 illustrates a flow diagram for updating the establishment model settings according to the present invention, and for writing the accumulated value for the response (boxes 456a–456c).

Figure 44:
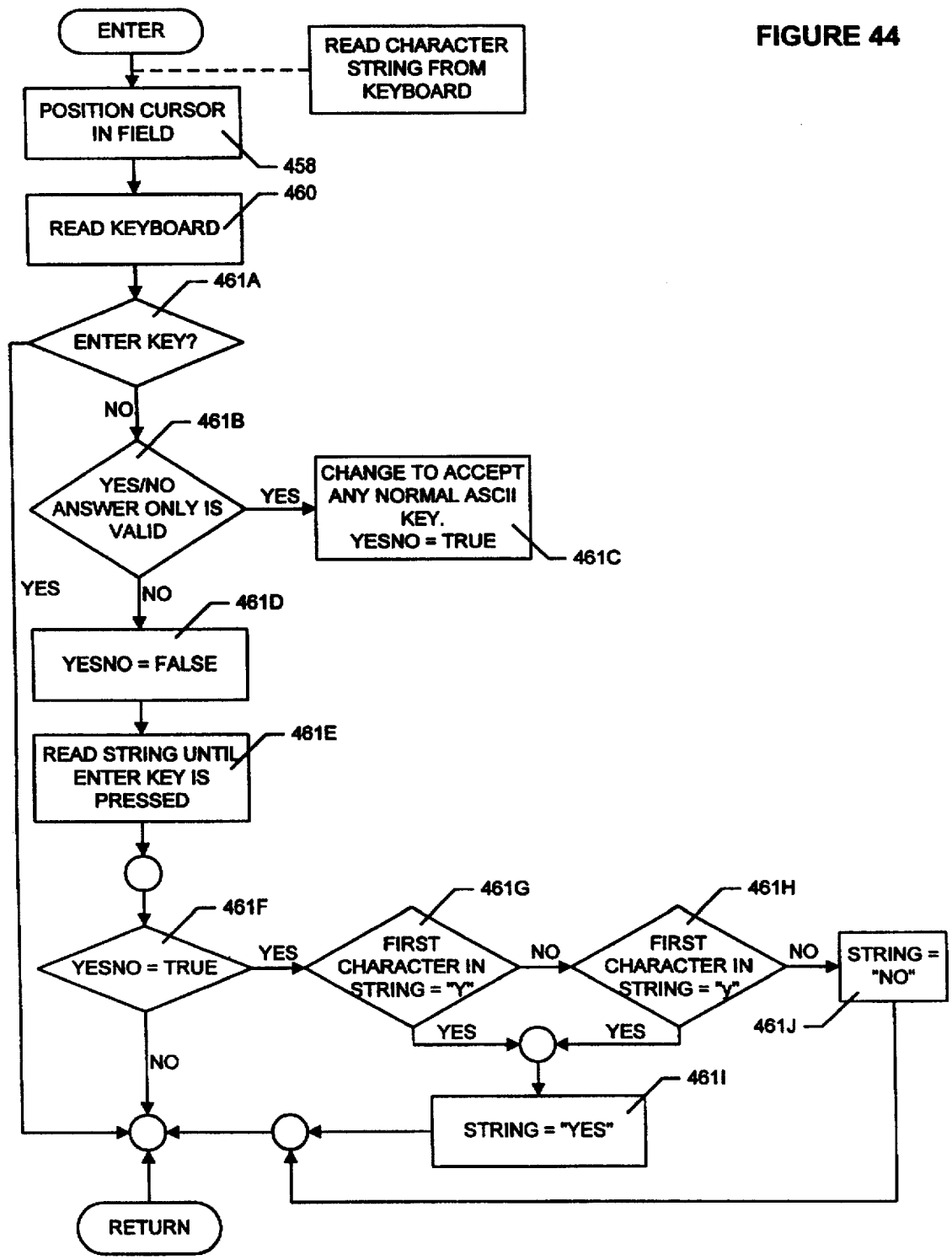
FIG. 44 illustrates a flow diagram for obtaining a character string from an input according to the present invention.

FIG. 44 illustrates a flow diagram for obtaining a character string from an input device according to the present invention. The field width is displayed in reverse video and the current value of the string is inserted. The cursor is positioned at the beginning of the field, awaiting input (box 458). The variable keyboard code is read and interpreted (box 460) with the following meanings:

0=all characters are allowed, including control and graphics,

1=check for DOS filename protocols, but no pathnames,

2=allow only normal ASCII characters (32–126),

3=check for DOS filename and pathname protocols,

4=Yes/No answer, and

ASCII Code 13=<Enter> key (Carriage Return).

The system then assembles the character string as indicated (boxes 461a–461j).

Figure 45:
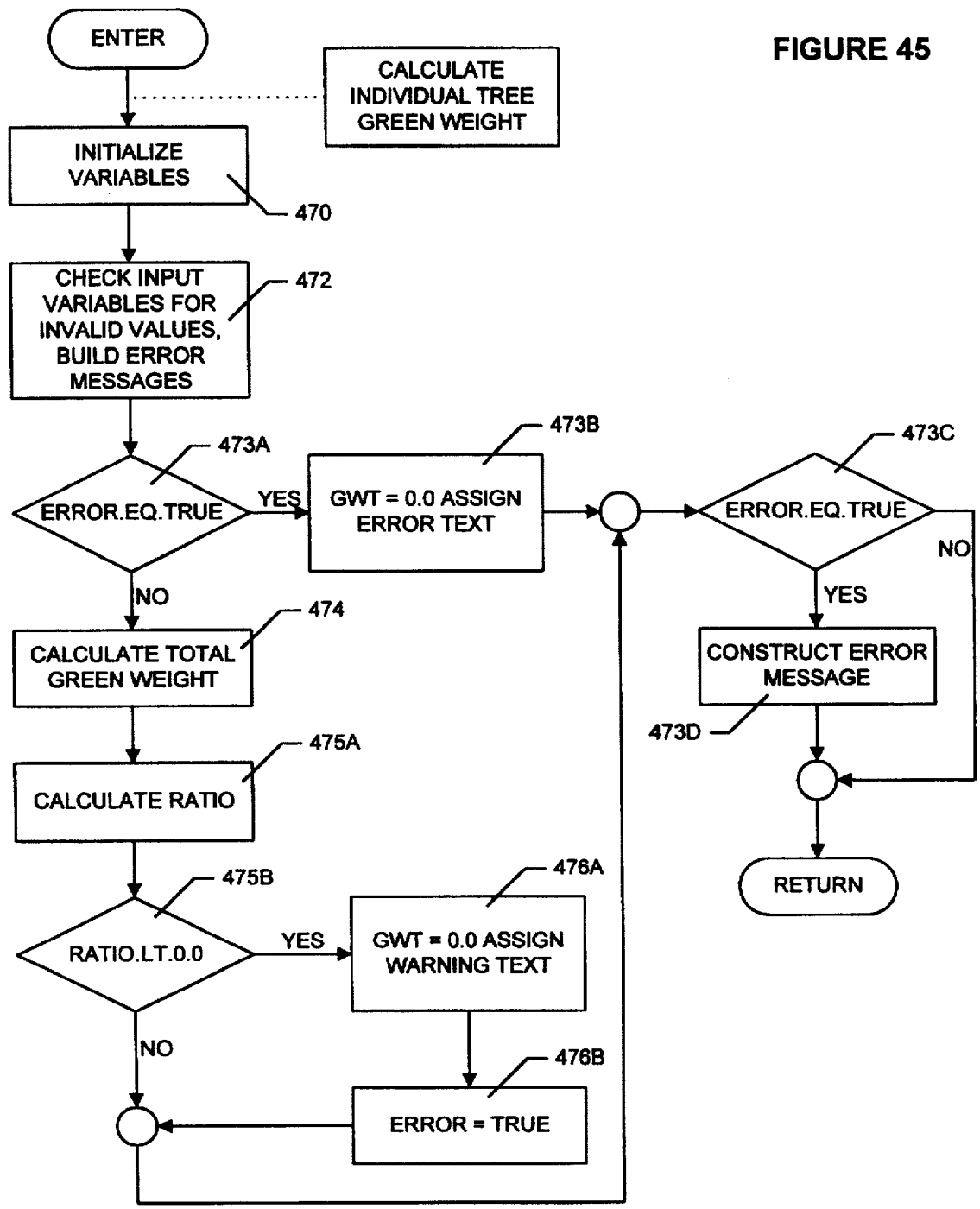
FIG. 45 illustrates a flow diagram for calculating individual tree green weight equation for plantation-grown loblolly pine according to the present invention.

FIG. 45 illustrates a flow diagram for calculating individual tree green weight equations for plantation-grown loblolly pine according to the present invention. Box 470 is for declaring and initializing variables. Box 472 is for checking the input variables for invalid values and building an error message or messages. If ERROR is "true" (box 473a), GWT is set to 0.0, error text is assigned, and an error message is constructed (boxes 473b–473d). If ERROR is not "true", box 474 is carried out in order to calculate total green weight, followed by calculation and value check of RATIO (boxes 475a–475b). If RATIO is less than zero, GWT is set to 0.0 and ERROR is set to "true" (boxes 476a and 476b) and an appropriate error message is constructed (boxes 473c and 473d).

Figure 46:
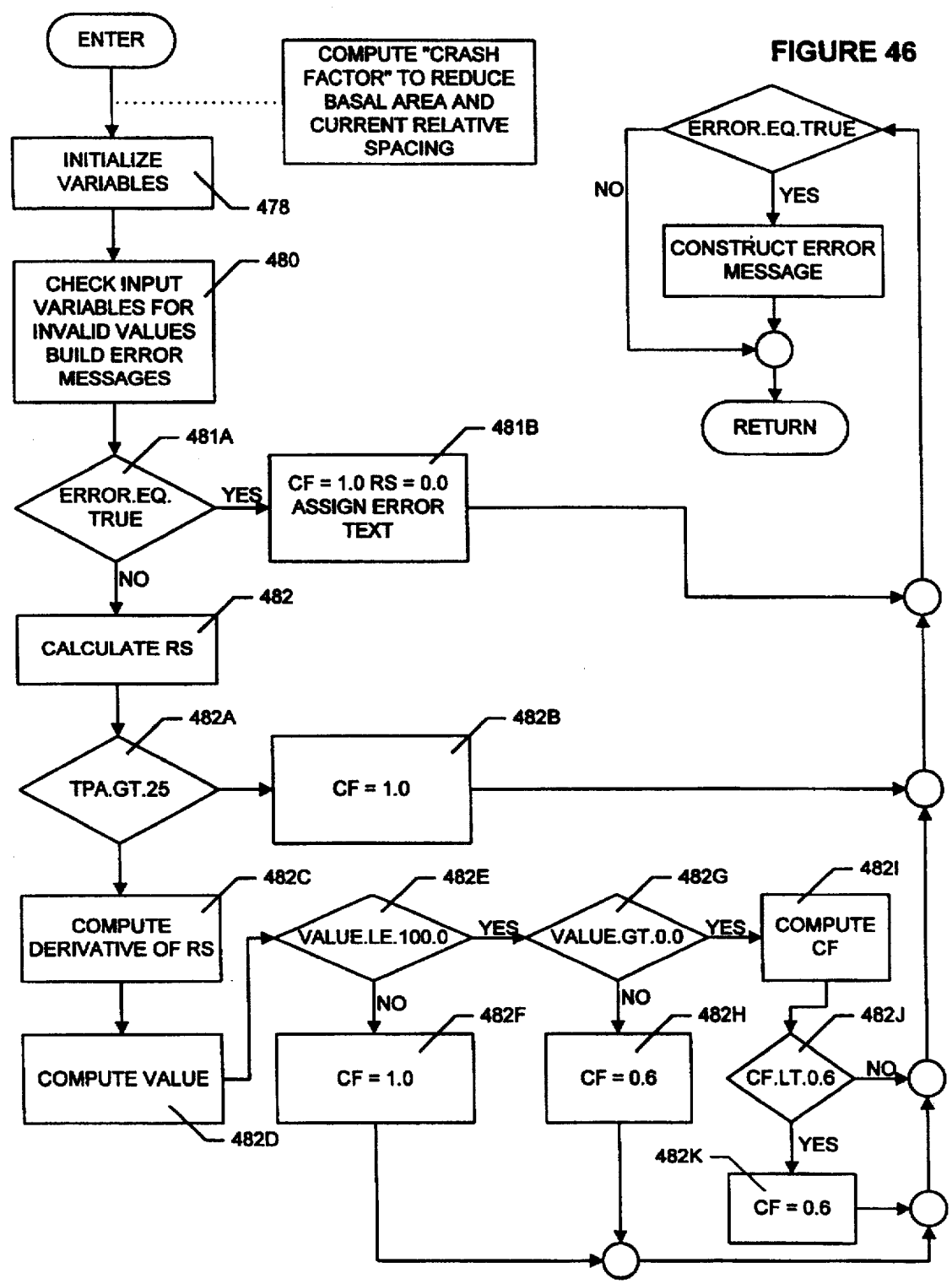
FIG. 46 illustrates a flow diagram for calculating crash factor and relative spacing wherein the crash factor reduces basal area in high-density stands according to the present invention.

FIG. 46 illustrates a flow diagram for calculating crash factor and relative spacing wherein the crash factor reduces basal area in high-density stands according to the present invention. The relative spacing is the ratio of the inter-tree distance to the mean height of dominant-codominant trees. The crash-factor in an unrestrained equation could occasionally be negative which would imply the number of stems was increasing, particularly in dense, self-thinning stands. To prevent this from occurring, a lower limit is imposed on the crash-factor. In fitting the data, the minimum value encountered was about 0.64, hence the chosen value of 0.6. Box 478 relates to declaring and initializing variables. In box 480, the input variables are checked for invalid values and an error message or messages are built (boxes 481a–481b). Boxes 482a–482k relate to calculating relative spacing and crash-factor, where the crash-factor is between 0.6 and 1.0 inclusive. The value to be used in the exponential function is tested to prevent floating point exceptions (divide by zero, overflow). If OK, then calculating and testing for the crash factor lower limit, otherwise just setting crash factor equal to lower limit.

Figure 47:
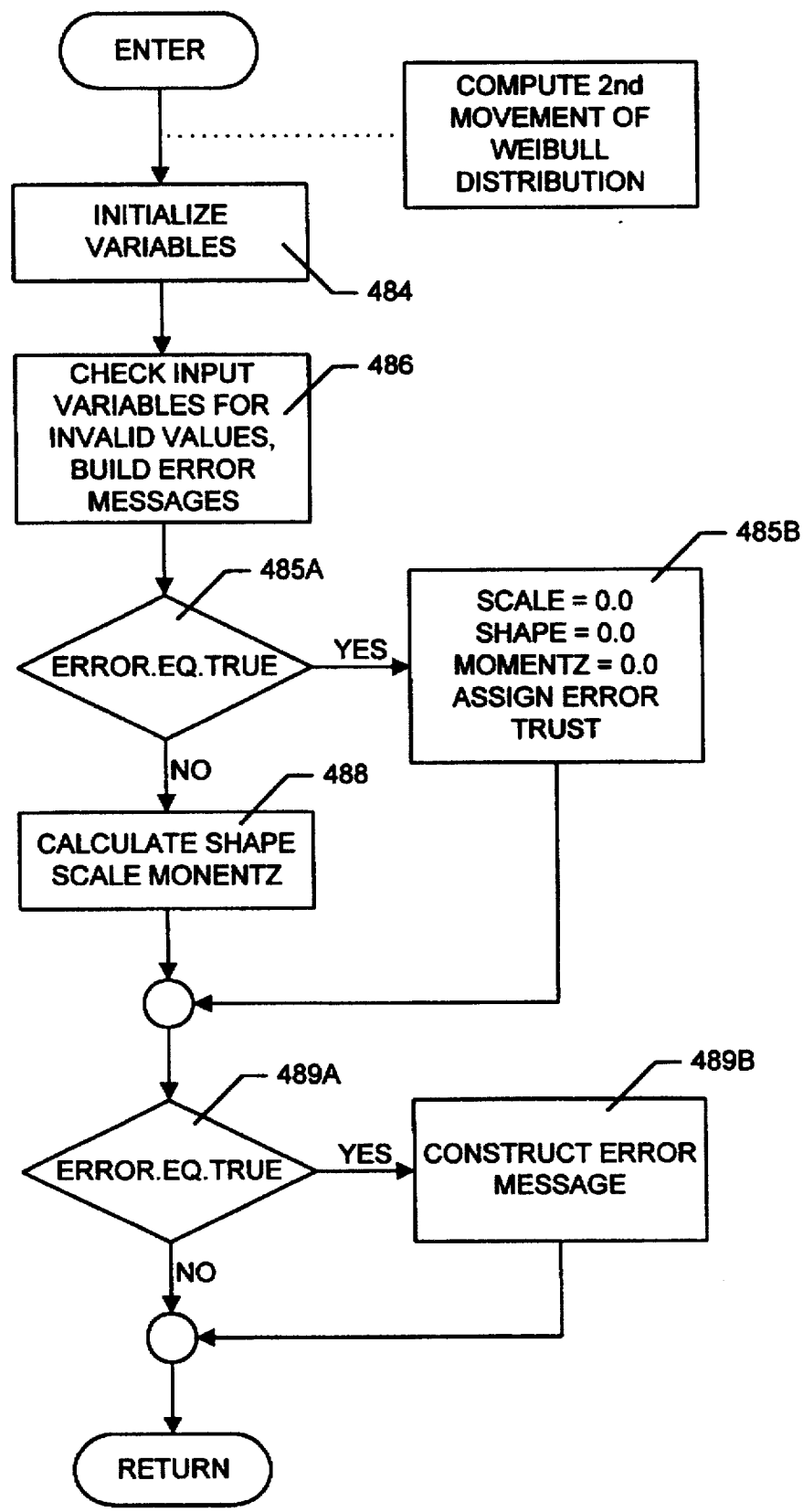
FIG. 47 illustrates a flow diagram for evaluating the expression for the second non-central moment of the Weibull distribution when the location parameter and the 93rd percentile are known for the present invention.

FIG. 47 illustrates a flow diagram for evaluating the expression for the second non-central moment of the Weibull distribution when the location parameter and the 93rd percentile are known for the present invention. Box 484 relates to declaring and initializing variables. Box 486 relates to checking the input variables for invalid values and building an error message or messages (boxes 485a–485b). Box 488 relates to calculating the shape, scale, and second non-central moment, followed by error routine (boxes 489a–489b).

Figure 48:
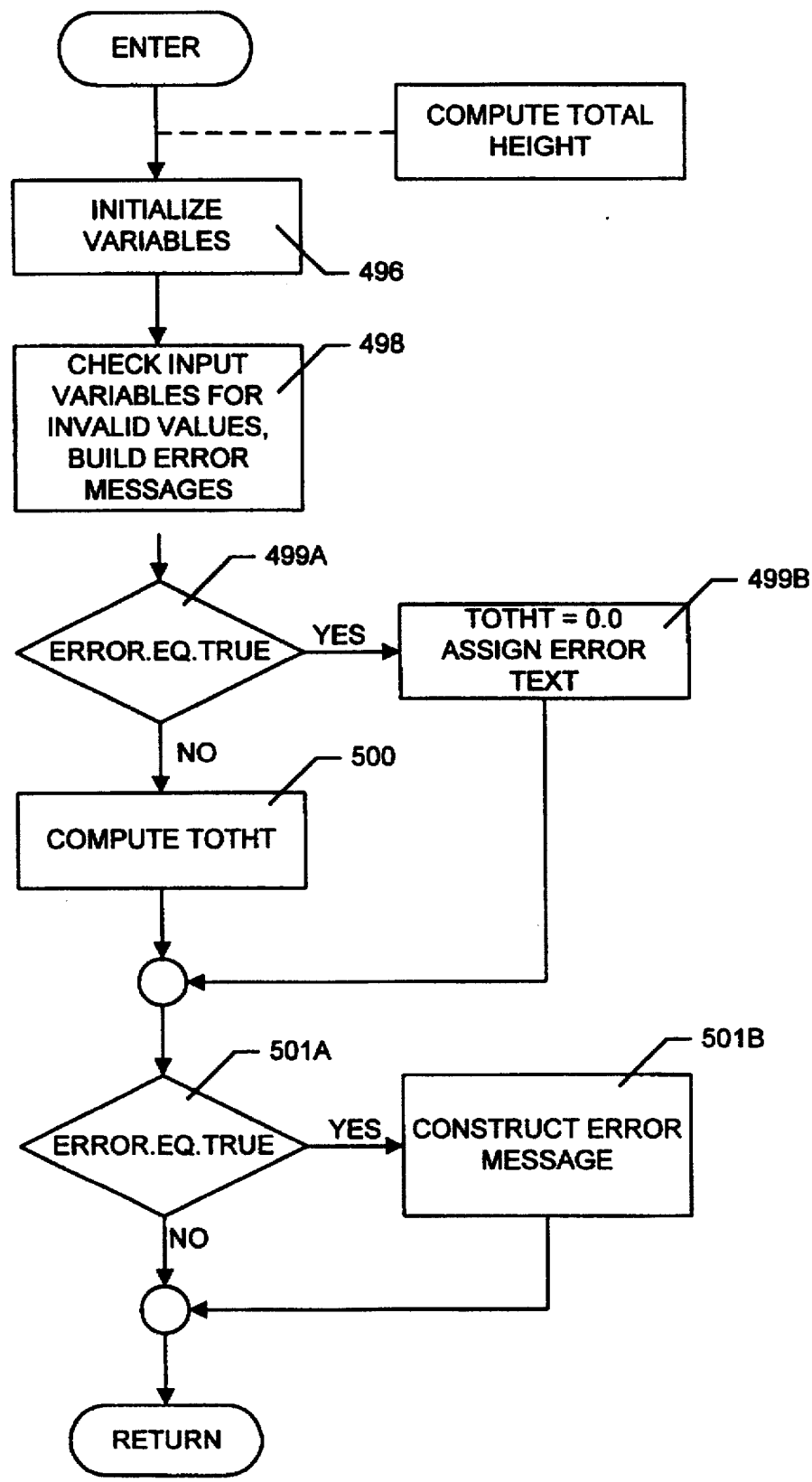
FIG. 48 illustrates a flow diagram for determining the total height for plantation-grown loblolly pine according to the present invention.

FIG. 48 illustrates a flow diagram for determining the total height for plantation-grown loblolly pine according to the present invention. Box 496 relates to declaring and initializing variables. Box 498 relates to checking the input variables for invalid values and building an error message or messages (boxes 499a–499b). Box 500 relates to calculating total height, and is followed by an error routine (boxes 501a–501b).

Figure 49:
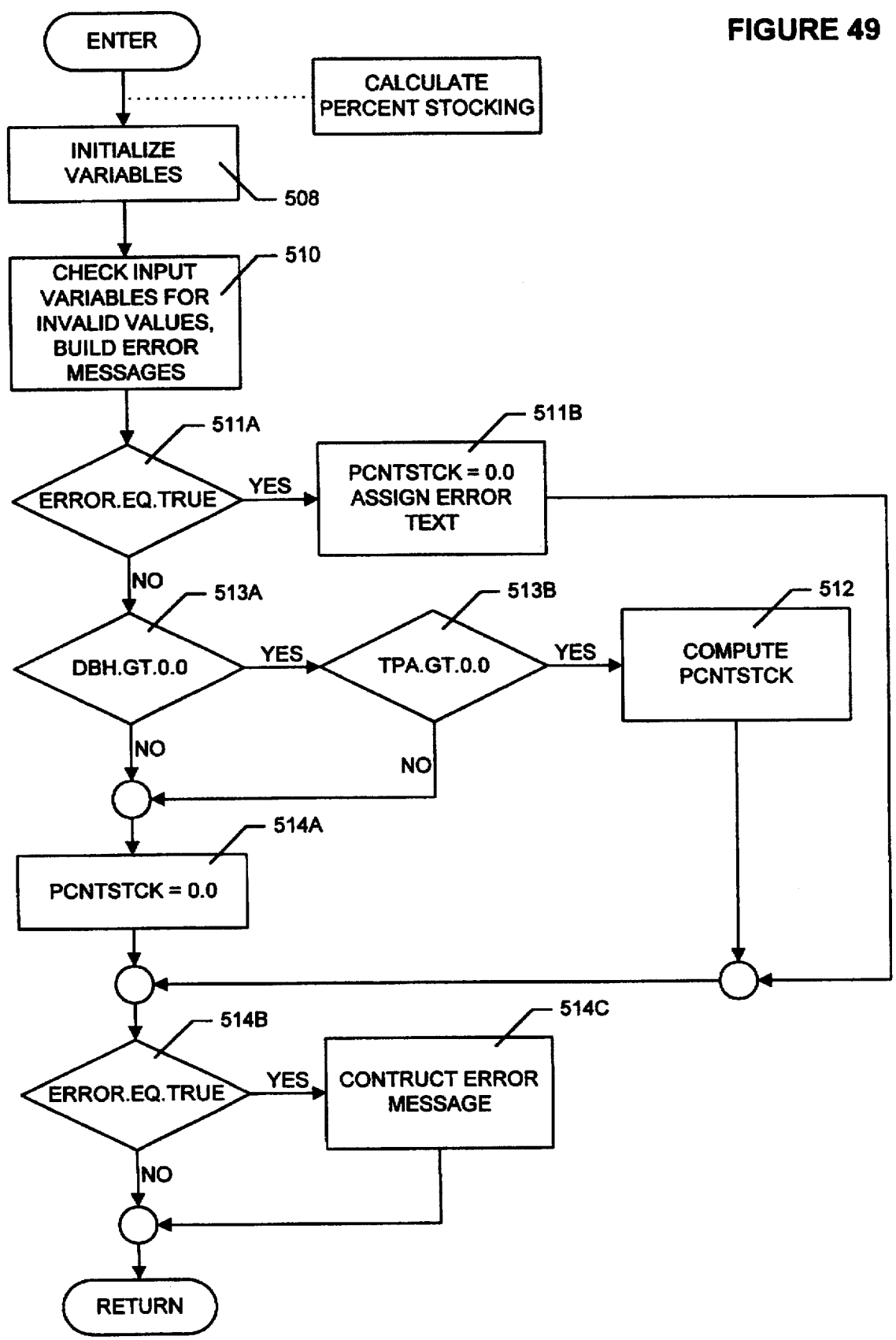
FIG. 49 illustrates a flow diagram for calculating percent stocking for the present invention.

FIG. 49 illustrates a flow diagram for calculating percent stocking for the present invention. Box 508 relates to declaring and initializing variables. Box 510 relates to checking the input variables for invalid values and building an error message or messages (boxes 511a and 511b). Box 512 relates to calculating percent stocking based on the result of certain value checks (boxes 513a–513b). Under certain conditions, percent stocking is set to zero and an error message may be generated (boxed 514a–514c).

Figure 50:
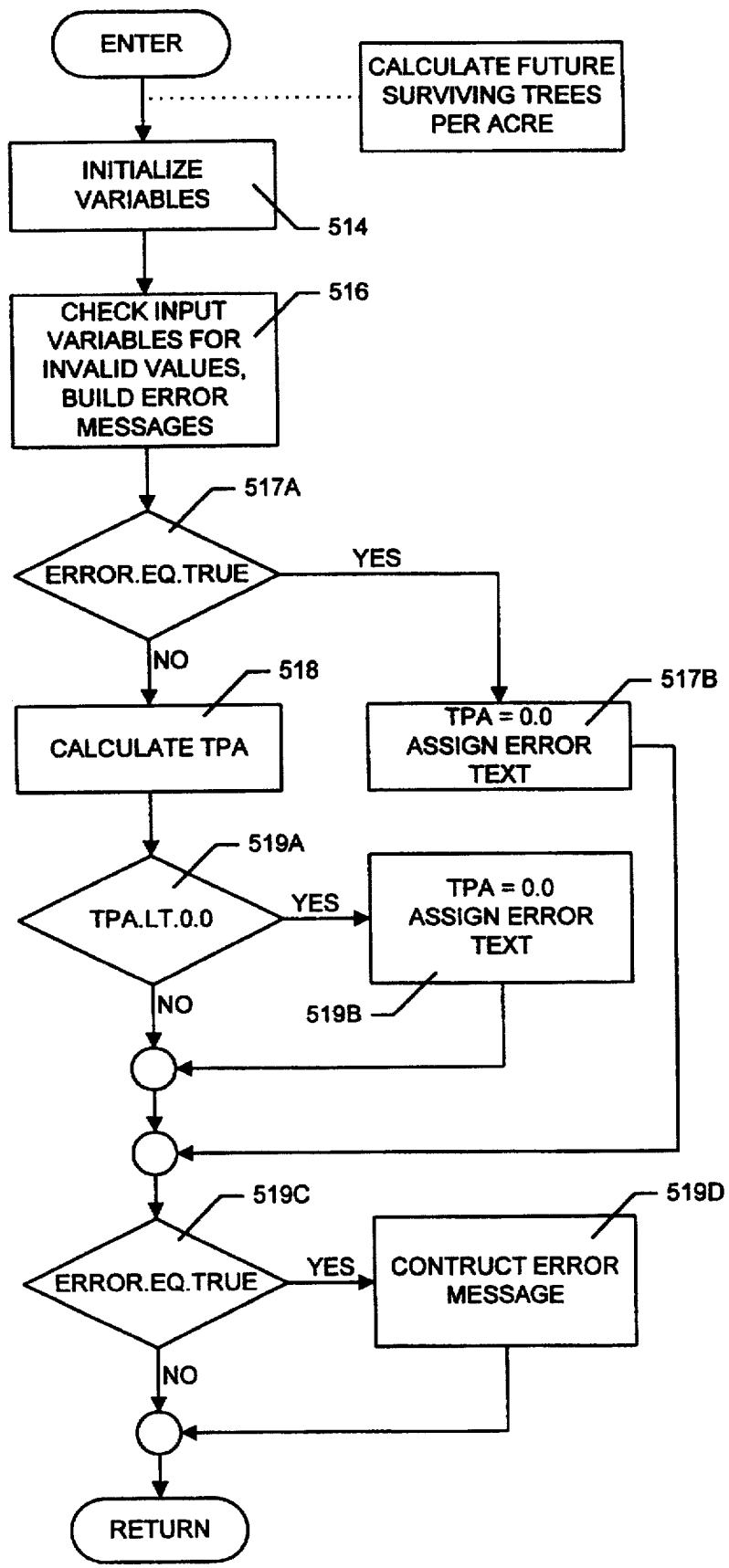
FIG. 50 illustrates a flow diagram for predicting survival by projecting the number of trees from one time, using height of dominant-codominants as a surrogate, to another according to the present invention.

FIG. 50 illustrates a flow diagram for predicting survival by projecting the number of trees from one time, using the height of the dominant-codominant trees as a surrogate, to another time according to the present invention. Box 514 relates to declaring and initializing variables. Box 516 relates to checking the input variables for invalid values and building an error message or messages (boxes 517a–517b). Box 518 relates to calculating trees per acre surviving, followed by certain error checks (boxes 519a–519d).

Survival is the second component of the stand level core equations. Four mortality phases in loblolly pine plantations were considered. The first typically covers the first year after planting, during which weather and other factors before and after planting may cause survival to be highly variable from year to year. The second phase is the more-or-less random mortality from establishment until competition related mortality begins. The third phase of mortality is the density-dependent or self-thinning mortality. This phase is considered to begin around the time of crown closure. Mathematically, the inflection point of the basal area growth curve was chosen to estimate this point. The surviving number of trees per unit area is a monotonic decreasing function of time. The steepness of the survival curve is related to initial density; closely spaced stands suffer mortality more rapidly than wider spaced stands. The phase of mortality described as the crash, which can occur at high stand densities, is reflected in the steepness of the survival curve when establishment density is extremely high. Also, the survival curve should approach a lower asymptote, interpreted as the fewest number of trees of maximum size which fully utilize the site. The fourth phase of mortality occurs when factors other than self-thinning drive survival below this lower limit and is not considered in the model.

For situations where information on a stand's initial size structure is available, the individual tree growth and mortality models provide a means of distributing the stand-level estimates of basal area growth and survival among individual trees or size classes. This approach avoids the assumption that tree diameters follow a particular distribution such as the Weibull, without loss of simplicity.

For any particular stand, the cumulative proportion of total stand mortality (M) is predicted as an asymptotic function of tree dbh in inches, scaled between its minimum (Dmin) and maximum (Dmax):

$$M=(1-e^{-bX})/(1-e^{-b}),$$

where
    $X=(dbh-a)/(Dmax-a),$
    $a=Dmin-0.1,$ b=rate of approach toward asymptote.

The proportion of mortality represented by each individual tree or size class is the difference between successive values of the cumulative mortality distribution (M). Note that dbh is actually scaled between (Dmin−0.1) and Dmax. This convention prevents the smallest tree on a sample plot from representing zero cumulative mortality. Clearly, it would be expected that part of the population represented by the smallest sample tree would suffer substantial mortality. The denominator $(1-e^b)$ conditions the equation to give M=1 when dbh=Dmax. The rate parameter b determines the extent to which mortality is related to tree size (dbh), and is generalized across stands in terms of the number of trees per acre (N) and dominant height in feet (H):

$$b=b1\ N^{b2}\ H^{b3},$$

where b1=410.1, b2=3.108, b3=7.181.

Note that large values of trees per acre and dominant height, which imply that trees are closely competing with each other, result in large values of b (mortality heavily skewed toward low dbh's). Similarly, small values of tree per acre and dominant height imply stands with little competition, resulting in small values of b (mortality more uniformly distributed across dbh).

The mortality distribution given by this equation may require adjustment to fit the original diameter distribution or tree list. When the model implies more mortality trees for a given size than actually exists, the excess mortality would be applied to the smallest surviving sample trees or size classes, until all stand mortality has distributed.

Within any particular stand, basal area growth of a survivor tree (ΔB) is expressed as a linear function of its initial basal area (B):

$$\Delta B=a+bB.$$

The intercept a of this linear function was chosen based on available stand level estimates. This was most readily accomplished by centering the linear growth equation on the mean survivor basal area growth (ΔB'), and the mean initial basal area (B'). Centering removes the intercept of the equation, leaving only the slope b to be estimated. In the expressions below, note that total basal area in survivor trees $(BA_s)$ and total basal area in mortality trees $(BA_m)$ can be obtained from applying the equations for mortality M and rate parameter b to initial stand data, and that projections of stand basal area $(BA_2)$ and survival $(N_2)$ are available from the core models:

$$(\Delta B-\Delta B')=b(B-B')$$

where $\Delta B'=(BA_2-BA_1+BA_m)/N_2$ $B'=BA_s/N_2$.

The slope coefficient b may then be generalized across stands in terms of site index (SI) and dominant height (H):

$$b=b1\ e^{b2\ SI}\ H^{b3}$$

where b1=49.91 b2=0.02917 b3=−2.167.

This equation generates a family of time-dependent basal area increment lines for a given stand. The model reduces the slope of the basal area increment line as a stand develops. In this way, stand basal area growth is distributed across a larger and larger range of sizes.

It is evident that the intercept of the basal area increment lines can be negative, especially when individual tree growth varies greatly for small changes in dbh. In such cases, computed predictions of basal area increment for small trees can be negative, and should be set to zero. Compatibility with stand level basal area growth is then maintained by selecting the smallest trees for which positive growth was predicted, and reducing their growth until compatibility is achieved. This procedure is analogous to the one recommended for survival prediction in cases where the model predicts that more trees of a given size will die than actually exist.

Together, the models for individual tree survival and basal area growth provide a mechanism for projecting individual trees or stand tables consistent with stand-level estimates of basal area growth and survival.

Figure 51:
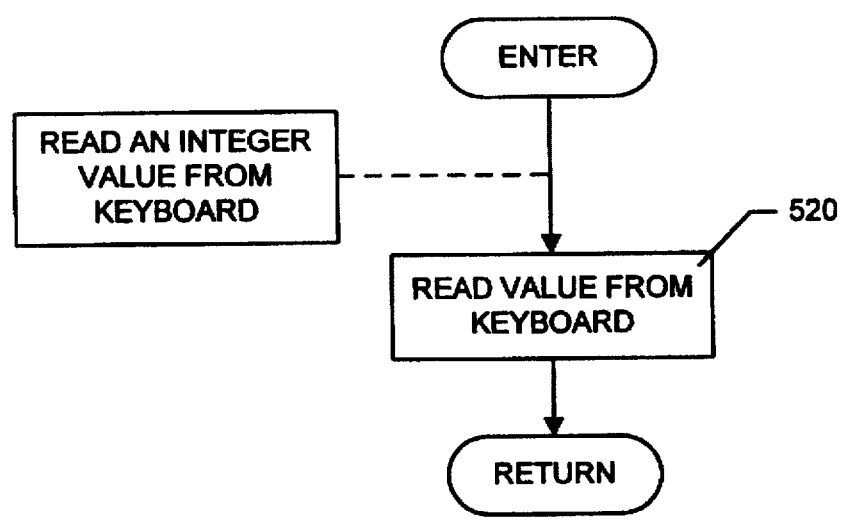
FIG. 51 illustrates a flow diagram to get an integer from an input according to the present invention.

FIG. 51 illustrates a flow diagram to get an integer from an input according to the present invention. The field width is displayed in reverse video, and the current value of the variable is inserted (box 520), after which the cursor is positioned at the beginning of the field, awaiting input.

Figure 52:
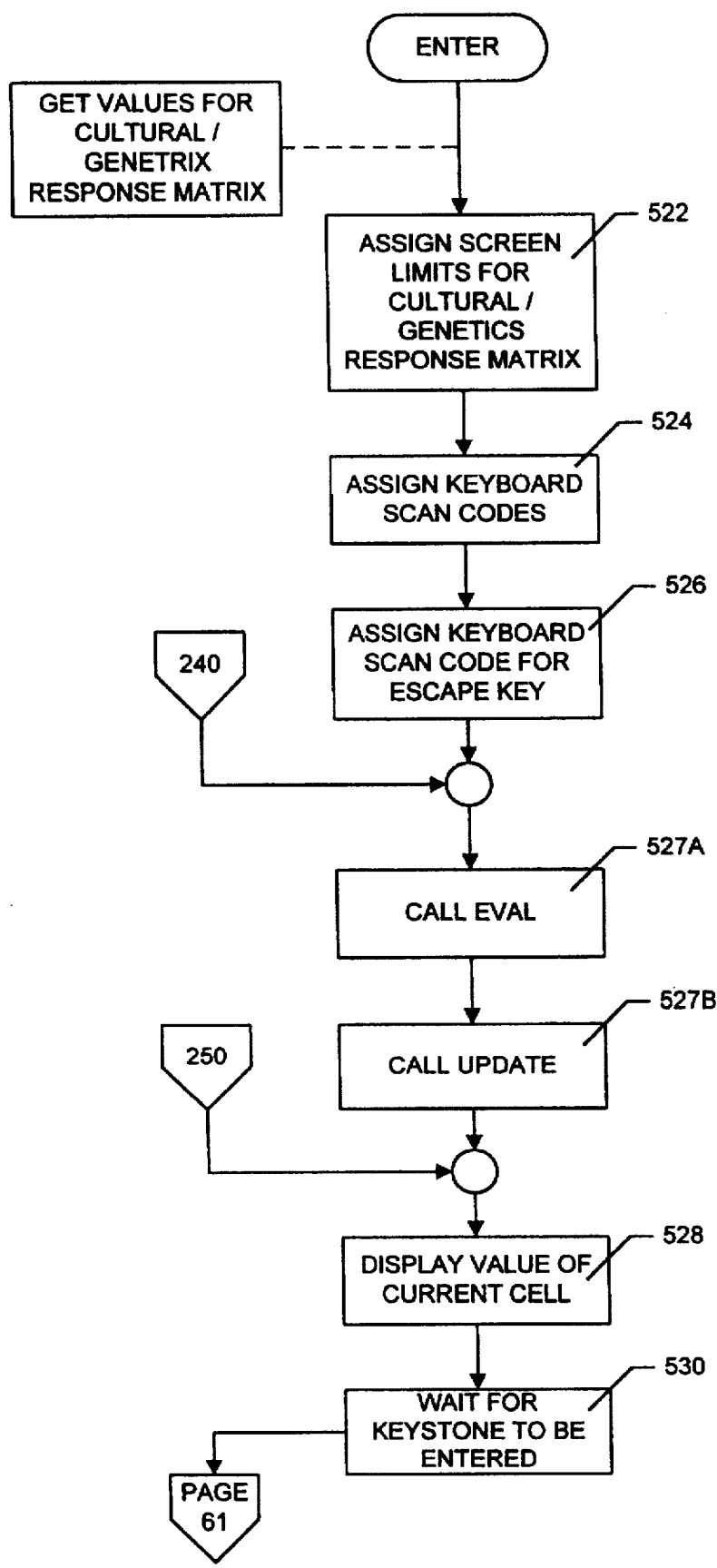
FIGS. 52–54 illustrate a flow diagram to get values for the cultural/genetics response adjustment matrix according to the present invention.
Figure 53:
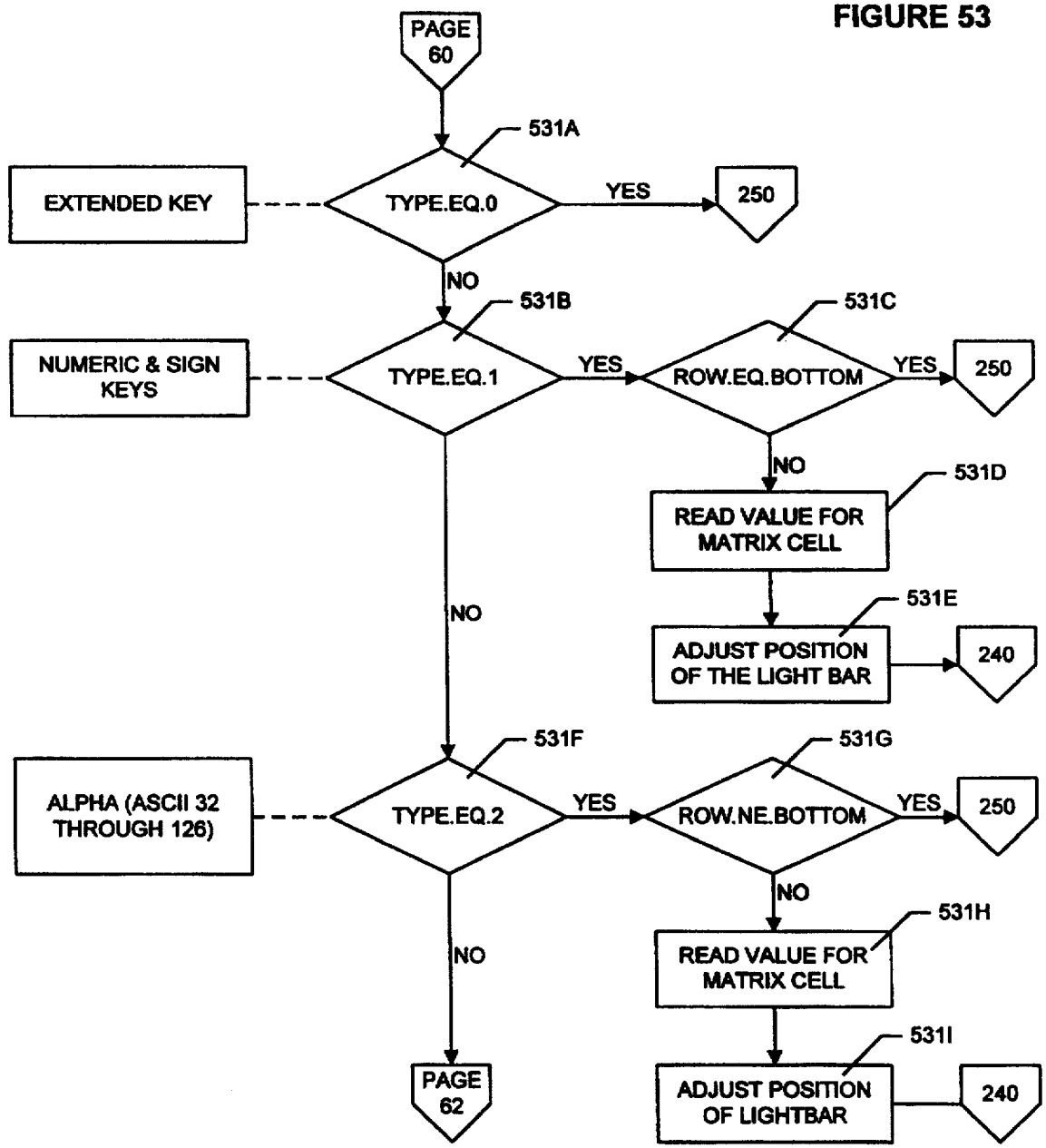
Figure 54:
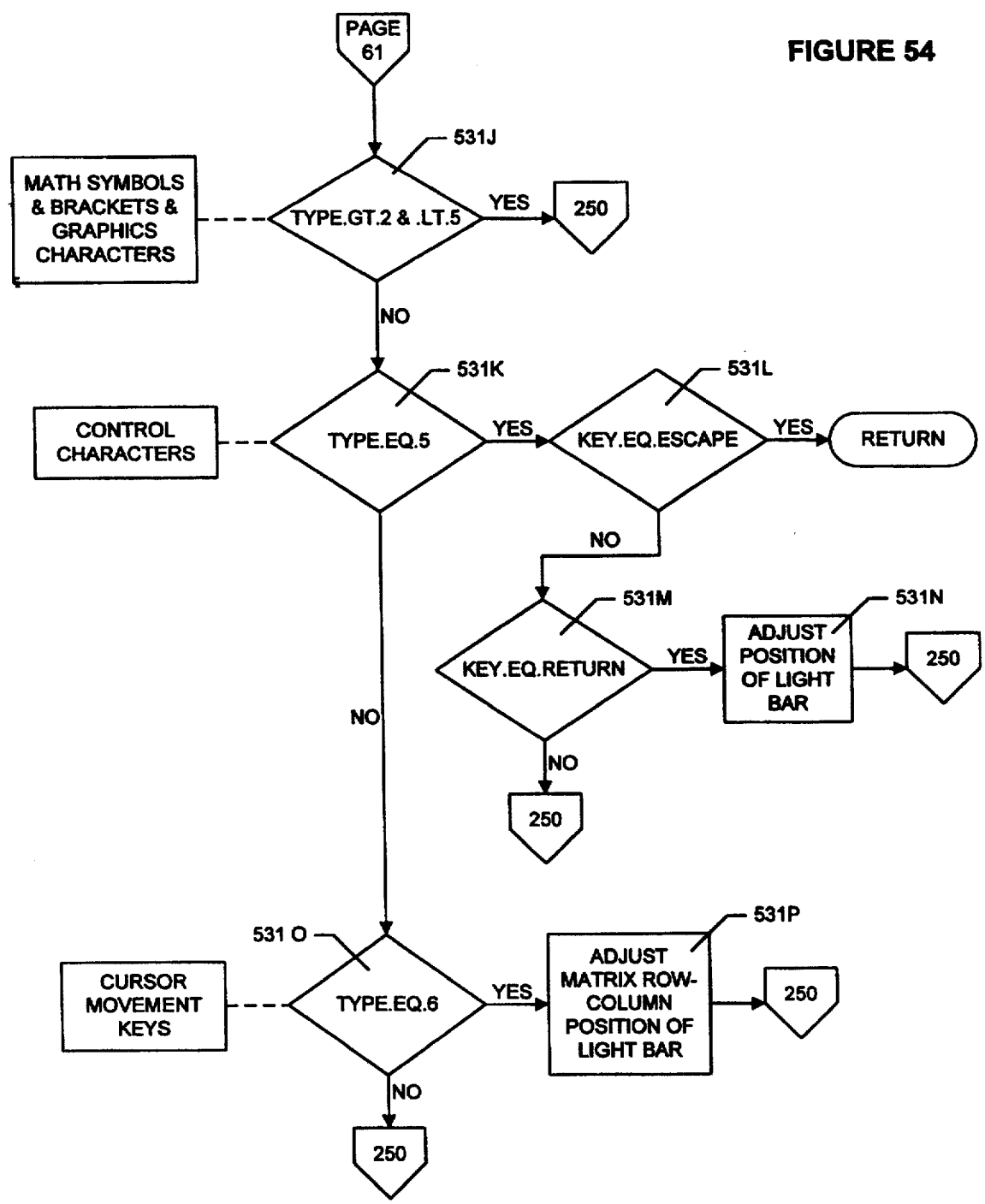

FIG. 52 illustrates a flow diagram to get values for the cultural/genetics response adjustment matrix according to the present invention. Box 522 relates to assigning screen limits of the cultural/genetic adjustment matrix. Box 524 relates to assigning keyboard scan codes for the cursor control keys. Box 526 relates to assigning a keyboard scan code for the Escape key. After EVAL and UPDATE are called (boxes 527a–527b), box 528 relates to display of the value of the current cell. Box 530 relates to waiting for a keystroke to be entered, then determining its type wherein the keystrokes can be one or more of the following:

Type 0=Extended key functions (box 531a);

Type 1=Numeric keys (and signs) (box 531b);

Check if on bottom row of matrix. If so, numeric is invalid, so ignore. Otherwise, read value for this cell in the matrix and then adjust the position to the lightbar (boxes 531c–531e);

Type 2=Alpha (ASCII 32–126) (box 531f);

If not bottom row of matrix, alpha keys are invalid, so ignore. Otherwise, read value for matrix cell and then adjust the position of the lightbar (boxes 531g–531i);

Type 3=Math symbols and brackets, so ignore (box 531j);

Type 4=Graphics characters (ASCII 128–254), so ignore (box 531j);

Type 5=Control characters (ASCII 1–31) (box 531j);

ASCII Code 27 is escape, so exit (box 531l);

ASCII Code 13 is carriage return, so adjust position of lightbar (boxes 531m–531n); and Type 6=Cursor movement keys, so update position in matrix accordingly (boxes 531o–531p).

Figure 55:
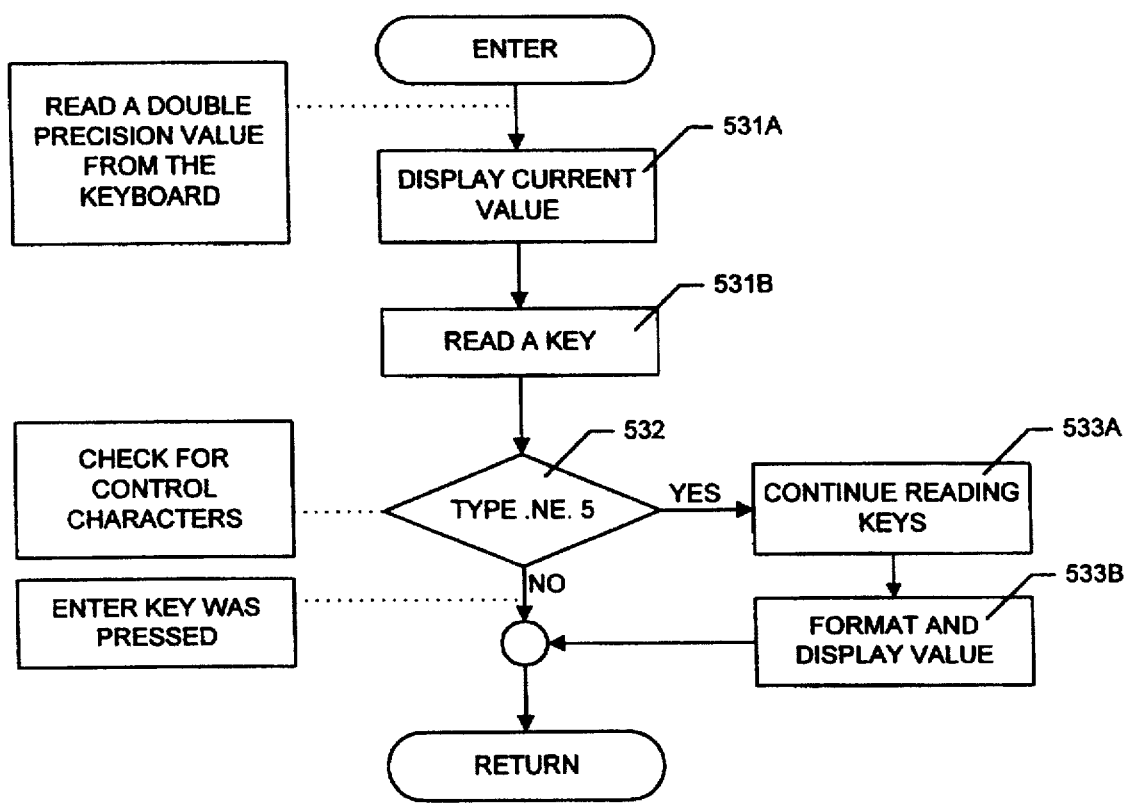
FIG. 55 illustrates a flow diagram to obtain a double precision value from the input according to the present invention.

FIG. 55 illustrates a flow diagram to obtain a double precision value from the input according to the present invention. The field width is displayed in reverse video, and the current value is inserted and read (boxes 531a–531b). Box 532 is for Type 5=Control characters (ASCII 1–31), when the <Enter> key is not pressed (see also boxes 533a–533b).

Figure 56:
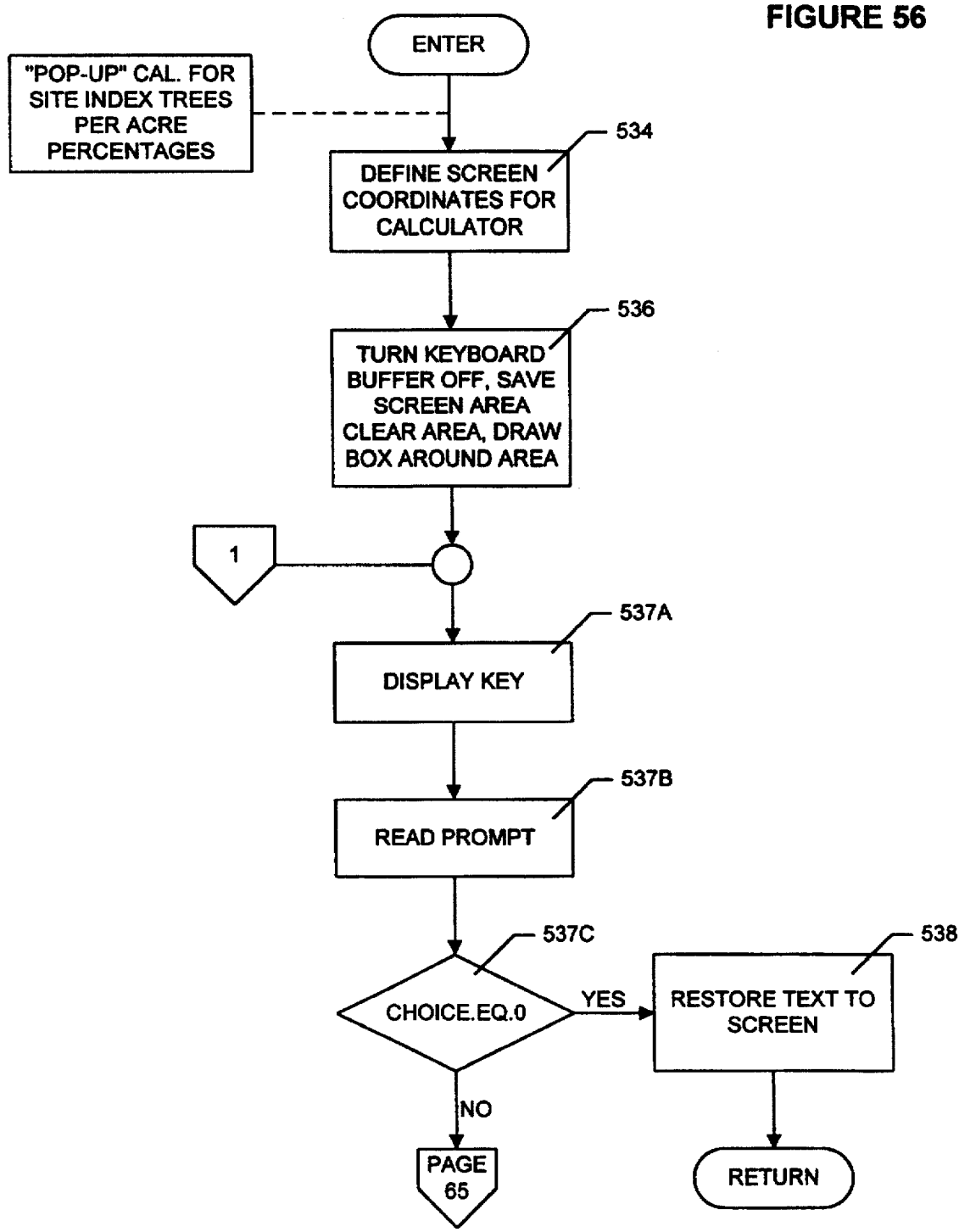
FIGS. 56–57 illustrate a flow diagram to retrieve a pop up calculator according to the present invention.
Figure 57:
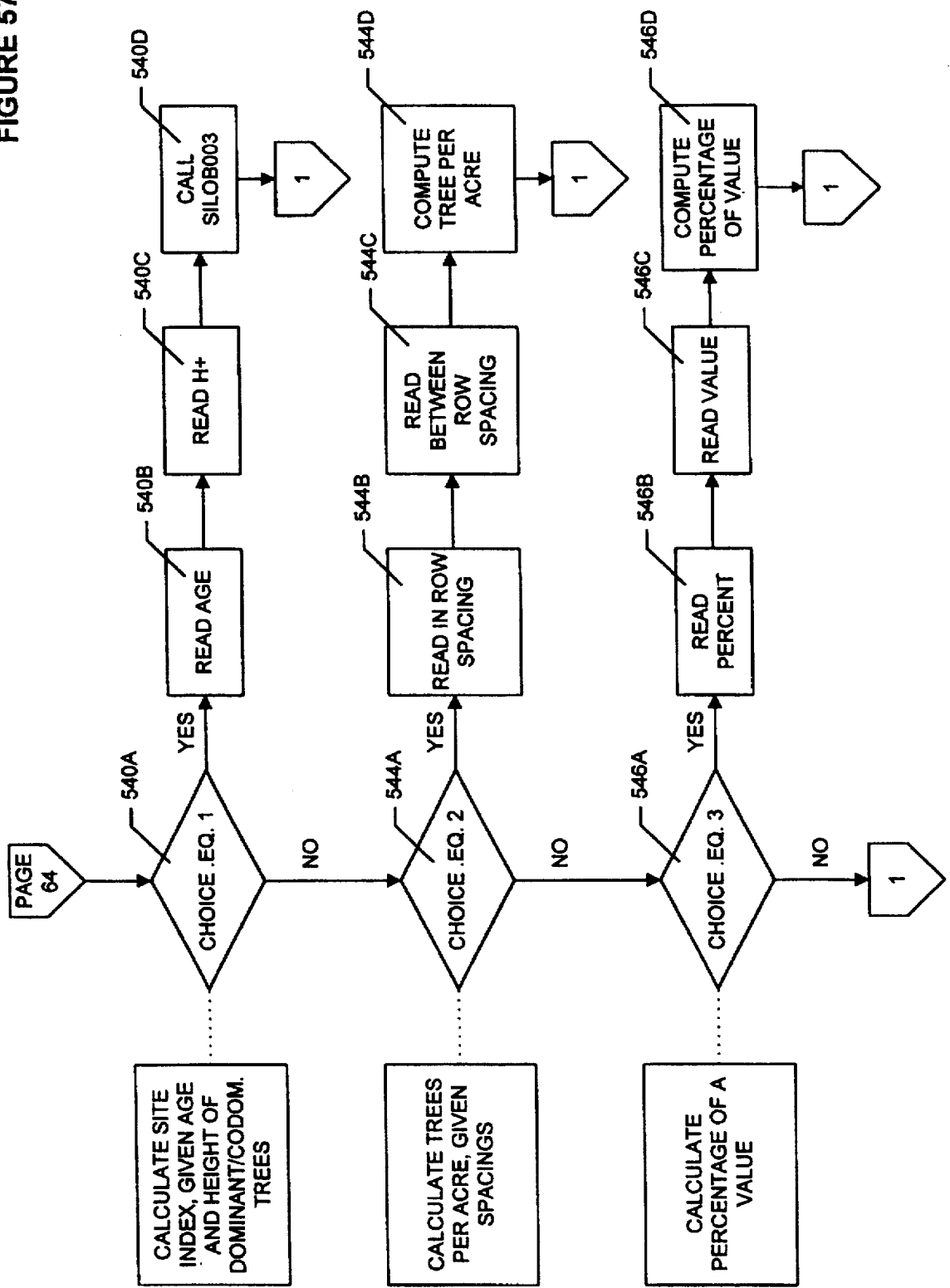

FIG. 56 illustrates a flow diagram to call a pop-up calculator according to the present invention. The pop-up calculator for calculating site index base age twenty-five, trees per acre surviving, and percentages has its screen coordinates defined in box 534. Next, in box 536, are the steps of turning the keyboard buffer off, saving current text in window area for the calculator, clearing the window, and drawing a box around the window. After a prompt is displayed and a key is read (boxes 537a–537b), a decision is made (box 537c), and the saved text is restored to the screen (box 538), turning the keyboard buffer back on, and exiting. Boxes 540a–540d relate to calculating site index, given the age of plantation in years and height of dominant-codominant tree or trees. Boxes 544a–544d relate to calculating trees per acre surviving, given spacing within rows, and between rows. Boxes 546a–546d relate to calculating a percentage value.

Figure 58:
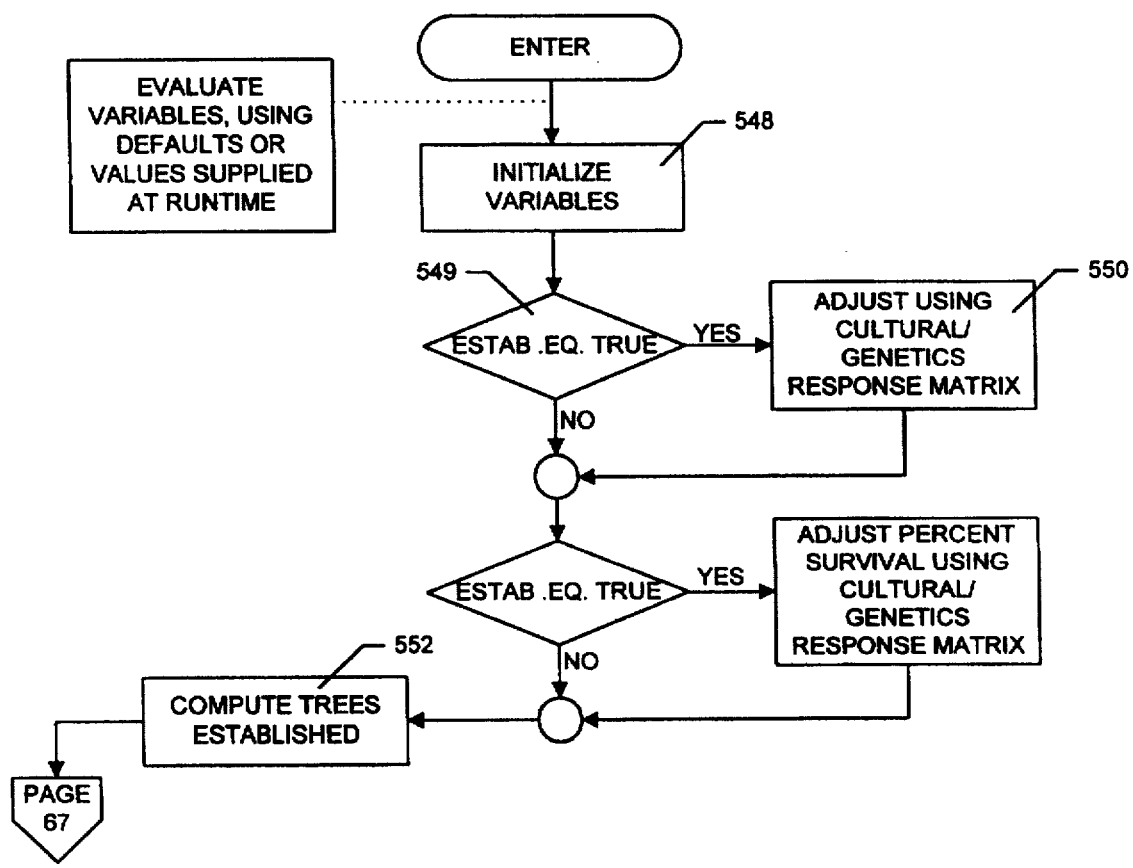
FIGS. 58–59 illustrate a flow diagram for evaluating variables using defaults or values supplied according to the present invention.
Figure 59:
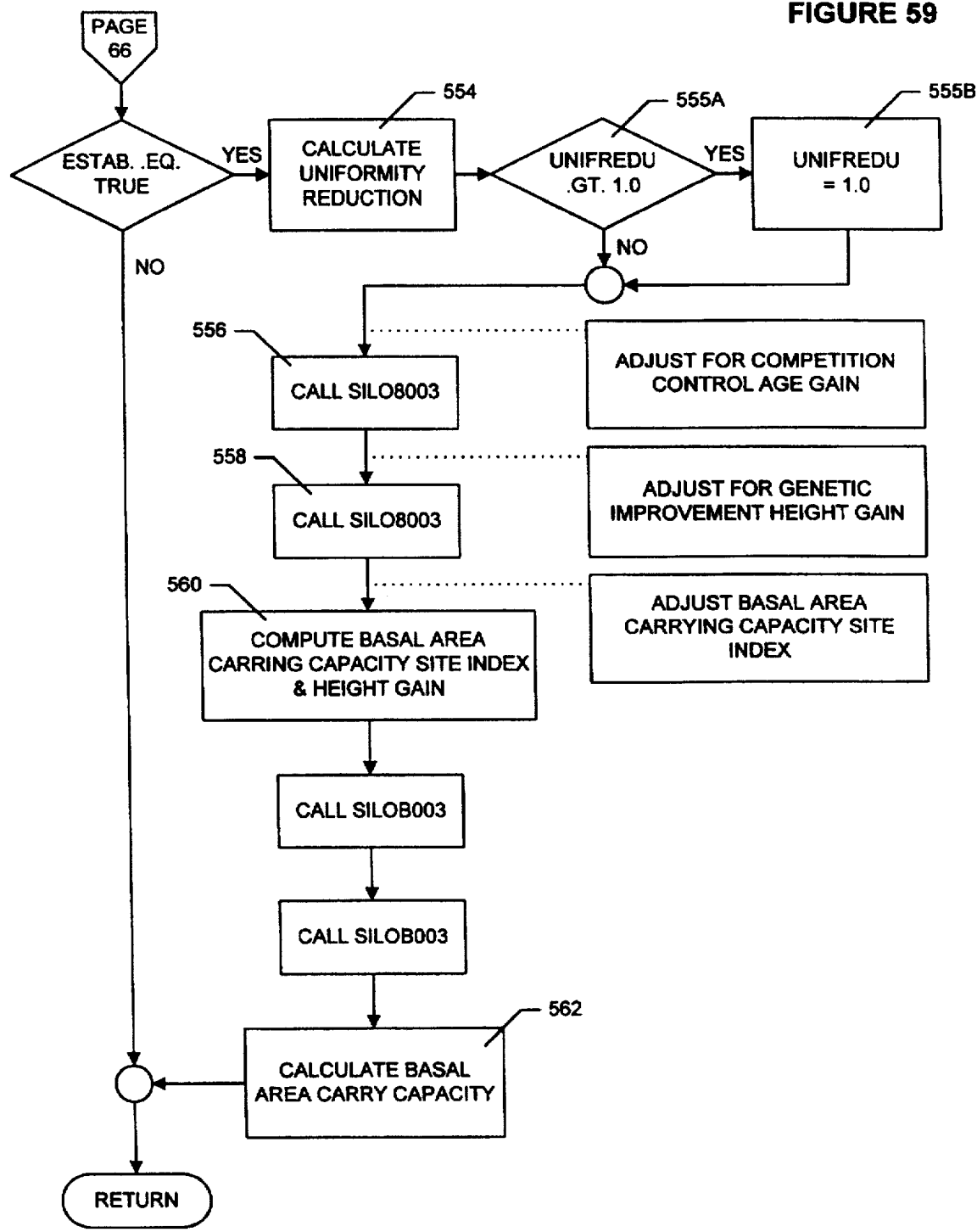

FIGS. 58 and 59 illustrate a flow diagram for evaluating variables using defaults or values supplied according to the present invention. Box 548 (FIG. 58) relates to initializing variables, using either defaults or values supplied at run-time. Presuming ESTAB is true (box 549), boxes 550 and 551 relate to adjusting percent survival, based on genetic/cultural values, while box 552 relates to calculating trees established (age one). Box 554 (FIG. 59) relates to calculating uniformity reduction, if the adjusted coefficient of variation for 0.01 acre survival plots at age one is greater than zero. Uniformity reduction may not be greater than 1.0 or less than 0.0 (boxes 555a–555b). Box 556 relates to adjusting for age gain from control of competing vegetation. Box 558 relates to adjusting for height gain from genetics improvement. Box 560 relates to adjusting basal area carrying capacity site index, using height gain (%) and calculated site index with a base of age 25 years adjusted. Boxes 561a and 561b relate to certain subroutines, while box 562 relates to calculating the basal area carrying capacity.

Figure 60:
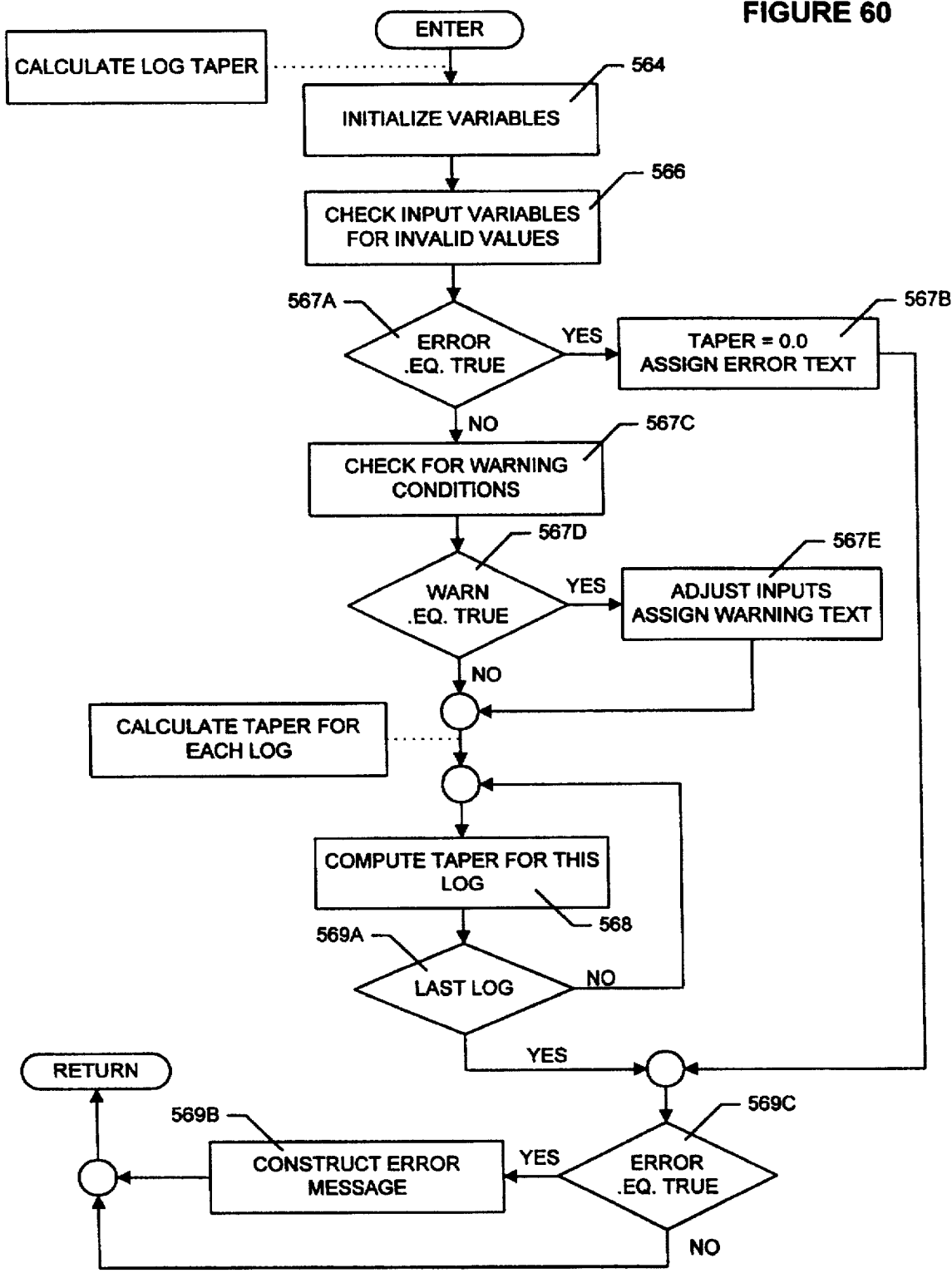
FIG. 60 illustrates a flow diagram for estimating taper reduction for calculating diameter inside bark at the top of each sixteen foot log wherein up to six logs with up to forty inch diameter (at the base) can be handled according to the present invention.

FIG. 60 illustrates a flow diagram for estimating taper reduction for calculating diameter inside bark at the top of the each sixteen foot log wherein up to six logs with up to forty inch diameter can be handled according to the present invention. Box 564 relates to declaring and initializing variables. In box 566, the input variables are checked for invalid values and an error message or messages are built (boxes 567a–567b). After various checks, decisions and other operations (boxes 567c–567e), box 568 relates to calculating the taper of the log followed by other decisions and actions (boxes 569a–569c).

Figure 61:
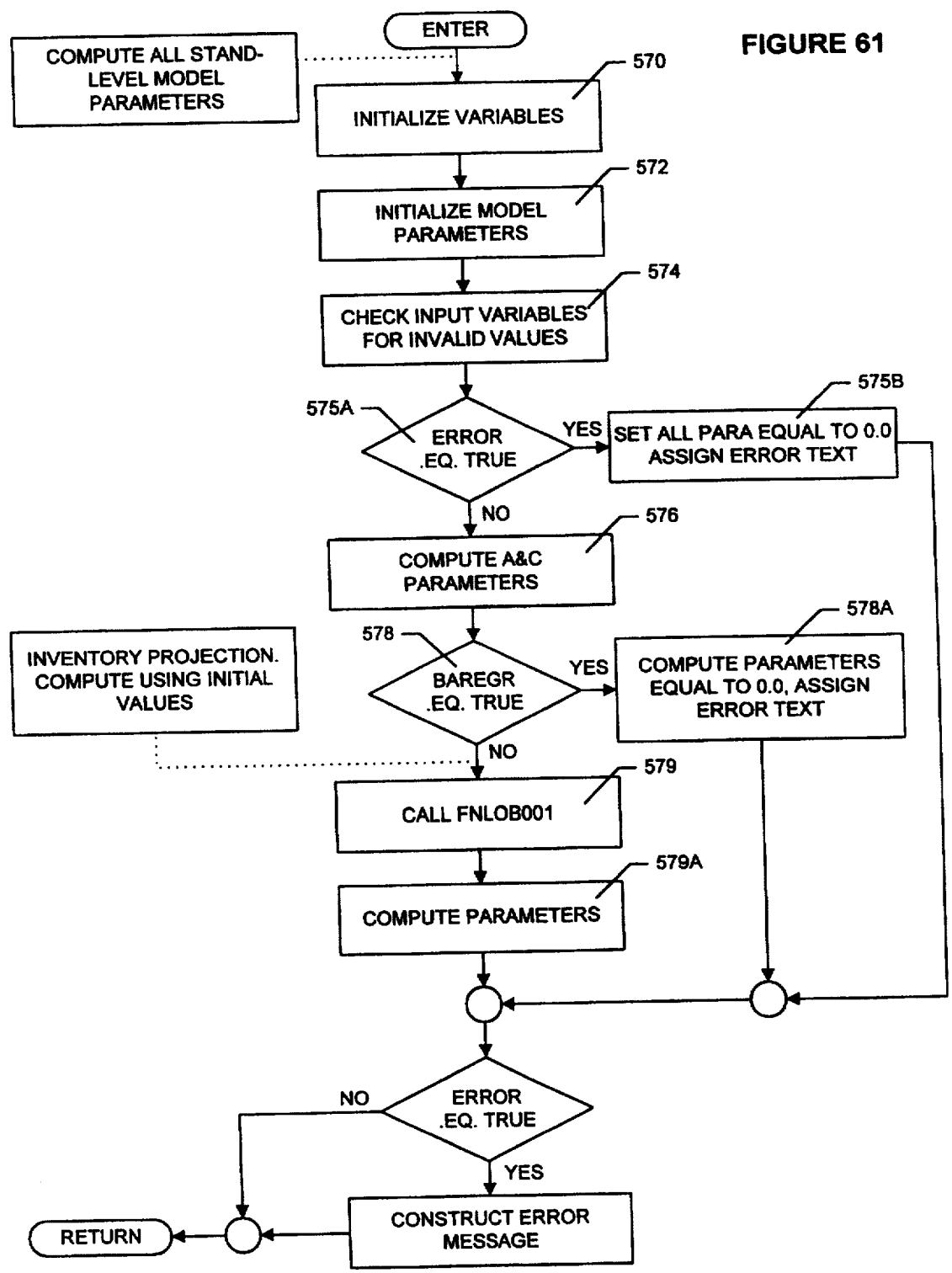
FIG. 61 illustrates a flow diagram for performing intermediate computations using stand-level model parameters for the basal area and survival equations of the loblolly pine plantation growth and yield model according to the present invention.

FIG. 61 illustrates a flow diagram for performing intermediate computations using stand-level model parameters for the basal area and survival equations of the loblolly pine plantation growth and yield model according to the present invention. This routine is designed to work for both bare ground projections and inventory projections. The number of trees established (age one survival per acre) only needs to be entered if bare ground is true. If bare ground is false, but basal area has not been measured, the number of trees established (age one survival per acre) may be entered to project basal area as if from bare ground, while survival will be projected from its observed value. In this case, the number of trees established (age one survival per acre) defaults to 600 if it is not entered. If both initial basal area and initial survival are entered (>0) and bare ground is false, the number of trees established (age one survival per acre) is ignored. Box 570 relates to declaring and initializing variables. In box 572, values for model parameters are assigned. Box 574 relates to checking the input variables for invalid values and building an error message or messages (boxes 575a–575b). In box 576, the A and C parameters for basal area are computed in square feet per acre. Box 578 relates to a determination as to whether bare ground projection is used, then computing B (for basal area in square feet per acre model) and T1 and T2 (for trees per acre surviving model) based on number of trees established (age one survival per acre) (see box 578a). If the system determines an inventory projection (bare ground is "false"), then the system computes B (for basal area in square feet per acre model) based on an initial basal area in square feet per acre and initial mean height in feet of dominant-codominant trees as projected by the site index equation (box 579). Next, the system computes T1 and T2 (for trees per acre surviving model) based on initial trees per acre surviving and initial mean height in feet of dominant-codominant trees as projected by the site index equation (box 579a). Initial basal area in square feet per acre must be "uncrashed" to maintain projection period invariance. If initial basal area in square feet per acre is ≧A (carrying capacity), the system decreases basal area in square feet per acre so that basal area in square feet per acre is 99% of A. This is an arbitrary convention to prevent an arithmetic error. If input basal area in square feet per acre is zero (i.e. data containing survival estimate but no basal area), then the system projects basal area in square feet per acre as if a bare ground projection, and uses an estimate of establishment density (number of trees established [age one survival per acre]). The number of trees established (age one survival per acre) will default to 600 trees per acre if it was not specified. The resulting estimate of basal area in square feet per acre is not used because basal area in square feet per acre is not "initialized" until it is actually measured. However, the implied value of HIP is used so that the survival curve may be entered. Alternatively, the user may enter a small value (e.g. 1.0) for basal area in square feet per acre, rather than using zero, in which case the model will always assume that the "juvenile" portion of the survival curve is appropriate. This would imply little or no mortality between age three and crown closure. The initial mean height in feet of dominant-codominant trees as projected by the site index equation≦HIP, T1 and T2 are estimated as if from bare ground. The number of trees established (age one survival per acre) are estimated from initial trees per acre surviving and initial mean height in feet of dominant-codominant trees as projected by the site index equation. HIP is the join (inflection) point between the juvenile part of the survival curve and the self-thinning part.

Figure 62:
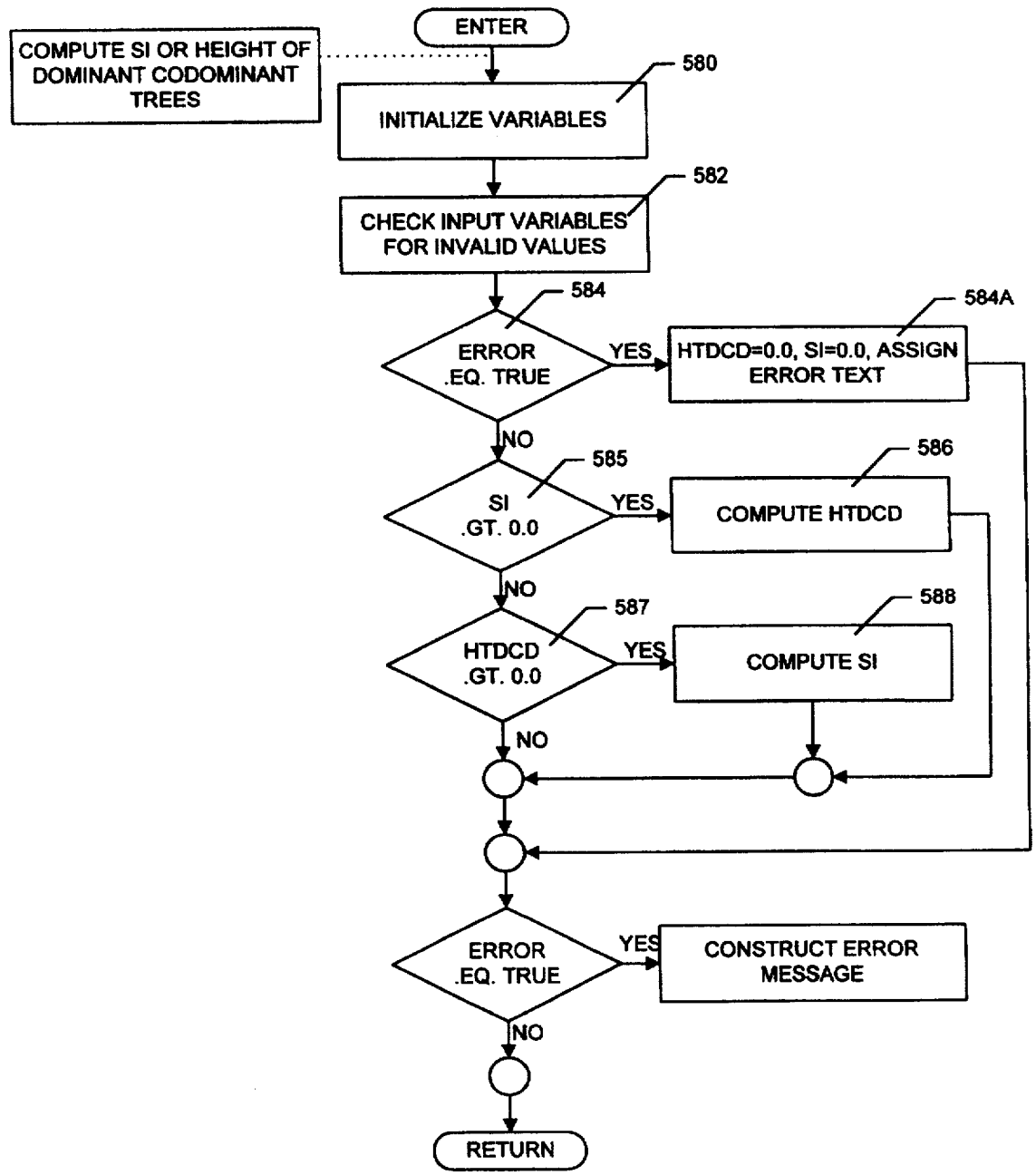
FIG. 62 illustrates a flow diagram for calculating either site index or mean height in feet of dominant-codominant trees as projected by the site index equation depending on which is less than or equal to 0.

FIG. 62 illustrates a flow diagram for calculating either site index or mean height in feet of dominant-codominant codominant trees as projected by the site index equation depending on which is≦0, wherein the calculation utilizes a modified Clutter & Lenhart site index curve according to the present invention. The system flow works for all ages, unlike the unmodified Clutter & Lenhart site index curve. In juvenile stands (prior to crown closure), this routine will project mean height in feet of dominant-codominant trees as projected by the site index equation (given site index and age of plantation in years). It is not recommended for predicting site index given mean height in feet of dominant-codominant trees as projected by the site index equation and age of plantation in years. The juvenile portion of the height-age curves implied by this routine asymptotically approaches the Clutter & Lenhart curves when the age of plantation in years is in the teens. Site index and mean height in feet of dominant-codominant trees as projected by the site index equation cannot both be set to zero at the start. Box 580 relates to declaring and initializing variables. In box 582, the input variables are checked for invalid values and an error message or messages are built. Box 584 relates to performing calculations if an error has not occurred, while box 584a relates to the setting of certain parameters and assigning of error text if an error has occurred. Box 586 relates to calculating height of dominant-codominant trees (HTDCD) provided site index (SI) is greater than zero (box 585). For ages of 13 years and greater, use the Clutter & Lenhart height predictions. For ages less than 13 years, the curve is defined by an allometric form of the Richards function, in which the equation is forced through three points; the origin, and the Clutter & Lenhart height predictions at ages 12 and 13 years. In box 588, site index is calculated provided HTDCD is greater than zero (box 587). If age of plantation in years is greater than 12, the system will use Clutter & Lenhart equation. If less than 12, the system will perform an iterative bisection on the range 30 to 110, until predicted height is within 0.1 foot of the true height. Accordingly, the system flow performs a bisect and begins to iterate.

Figure 63:
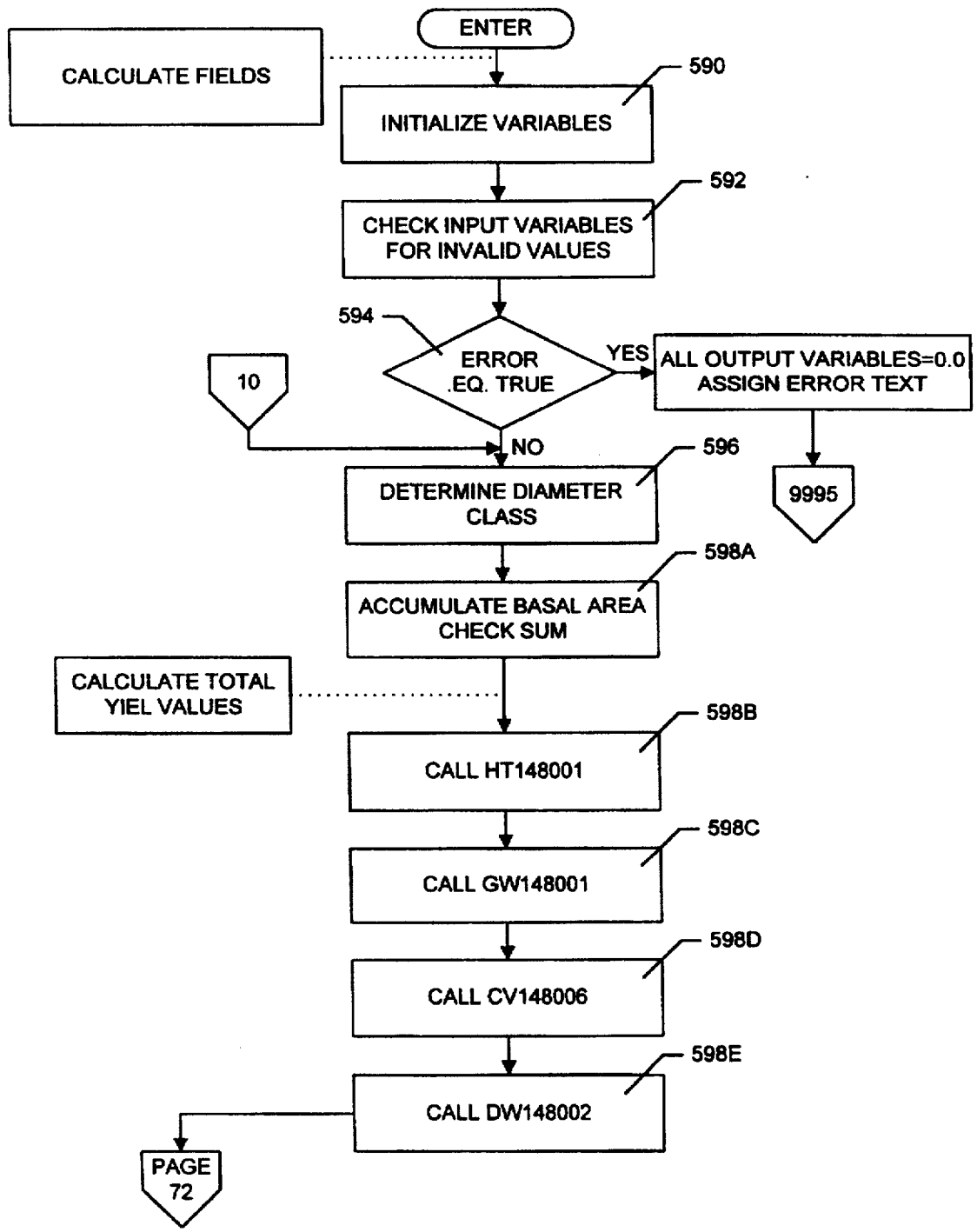
FIGS. 63–66 illustrate a flow diagram for receiving Weibull parameters and computing stand-level yields from three threshold dbh's for three different top diameters and calling for prediction of total height, individual tree green weights, dry weights, cubic foot volume, MBF Doyle, MBF International quarter inch, and MBF Scribner according to the present invention.

FIGS. 63–66 illustrate a flow diagram for receiving Weibull parameters and computing stand-level yields from three threshold dbhs for three different top diameters and calling for prediction of total height, individual tree green weights, dry weights, cubic foot volume, 1000 board feet using Doyle, 1000 board feet using QII, and 1000 board feet using Scribner according to the present invention. In the general case, the three values for threshold dbh and top diameter correspond to three different yield classes. Output yields corresponding to the first class (merchantable yield in green tons per acre, merchantable dry weight, merchantable cubic feet per acre) are for all material larger than threshold dbh (1) and top diameter (1). The second class (chip & saw, chip & saw dry weight, chip & saw cubic foot volume) is for all material larger than threshold dbh (2) and top diameter (2) but smaller than threshold (3) and top diameter (3), (e.g. chip & saw material, which excludes both pulpwood and sawtimber). The third class is the largest material (sawtimber) and excludes the others. Frequency of trees larger than threshold dbh (3) are reduced with the flow diagram illustrated in FIG. 36. By removing, changing, or modifying this routine, the third value of threshold dbh and top diameter can be entered to correspond to any desired product definition. As it stands, this material is assumed to be sawtimber, as defined in the flow diagram illustrated in FIG. 36. DXINC=1 inch is a recommended standard for accuracy and efficiency. Whatever the "accumulation interval" or diameter class width, it begins at 0. Class limits are defined as (0, DX, 2*DX, 3*DX, 4*DX, 5*DX, ... ). The class midpoints, ([i*DX+(i+1)*DX]/2), are used for the accumulation of basal area and yield. Classes proceed into infinity according to the definition of the Weibull, but for practicality the system imposes a stopping condition when a class is reached with less than 0.15 trees per acre surviving of larger size. At this point, the routine backs up exactly one inch (not one class) and places the remaining trees at that point. This convention is comparable with the traditional one, but minimizes the effect of changing DX on the size of the largest calculated tree. Values for threshold dbh should be specified so that their precision is compatible with DX, otherwise merchantable yields will be biased. For example, if DX=1, threshold dbh=(5, 8, 10) is acceptable since 4, 8, 10 all correspond to the beginning of a diameter class (as defined in this routine). For DX=1, threshold dbh=(4.6, 7.6, 9.6) would not work; DX=0.1 would be necessary. If accumulated basal area and input trees per acre surviving imply that the quadratic mean dbh is different from its input value, then a warning is issued. If the input Weibull parameters were recovered from stand parameters, (e.g. by way of the flow chart illustrated in FIG. 69), this condition would never occur. The routine will, however, provide yields for any Weibull parameter values. Merchantable dry weight is not calculated for any input top diameter (any element of top diameter) greater than eight inches. In FIG. 63, box 590 relates to declaring and initializing variables. Box 592 relates to checking the input variables for invalid values and building an error message or messages. Boxes 594 and 595 relate to marking the fallback position, so that the error message can be modified if there are too many inputs≦0. The system has already addressed output yields which were set to zero previously. The system checks if there is room to complete a normal error message about variables≦0. If not, the system substitutes a message of multiple errors, but does not overwrite any message about mean diameters being unequal. Box 596 relates to performing calculations. The system flags the stopping criterion, after which one last pass is made with left-over probability placed in the right tail exactly an inch back from the current unused value of X. With DX=1.0, this is the same as placing it in the previous last class. With DX larger or smaller, the effect is not so logical, but provides results that are comparable to each other. Accordingly, the effect of class size on yield predictions is minimized. Boxes 598a–598e relate to accumulating basal area checksum, and calculating total yield values.

Figure 64:
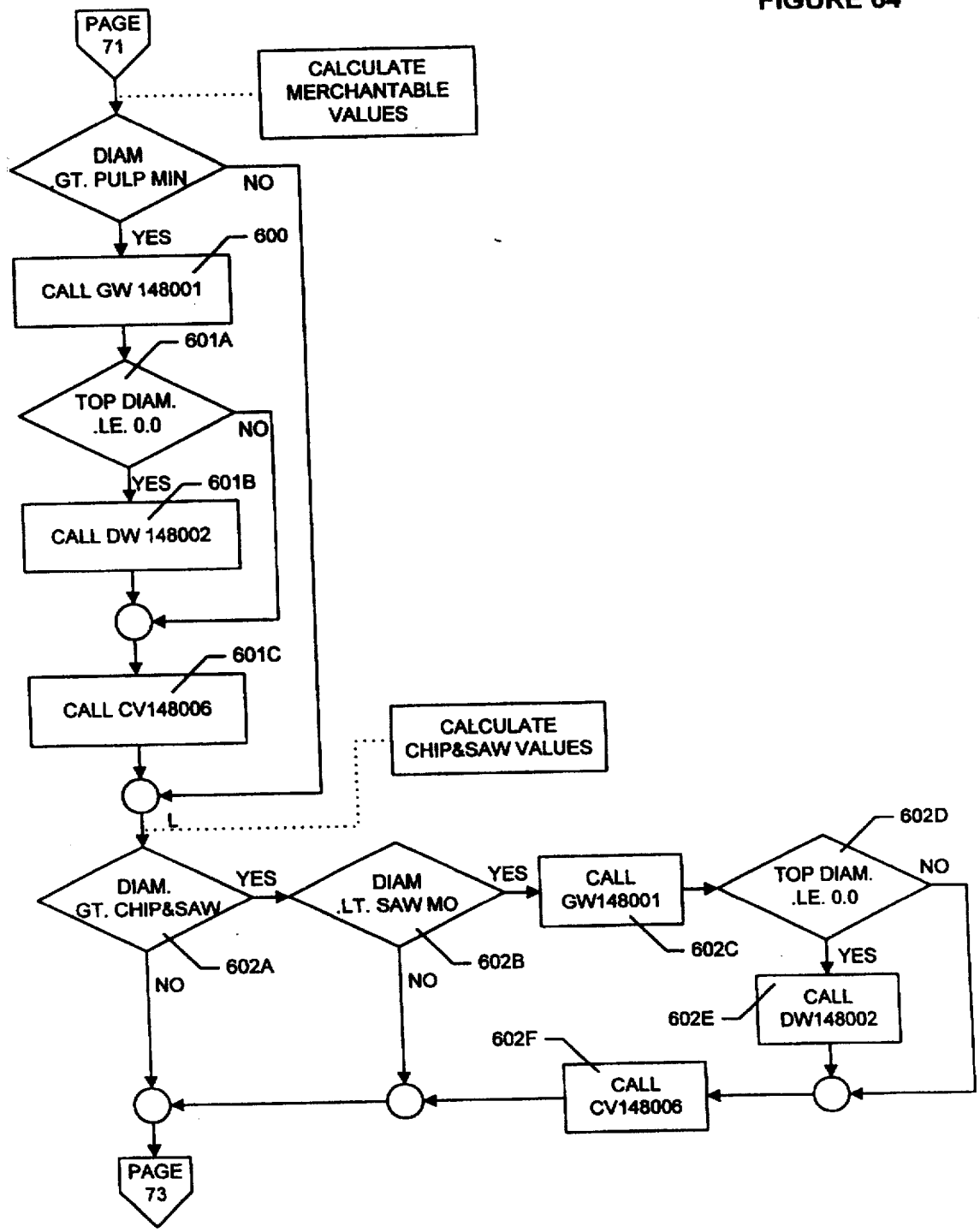
Figure 65:
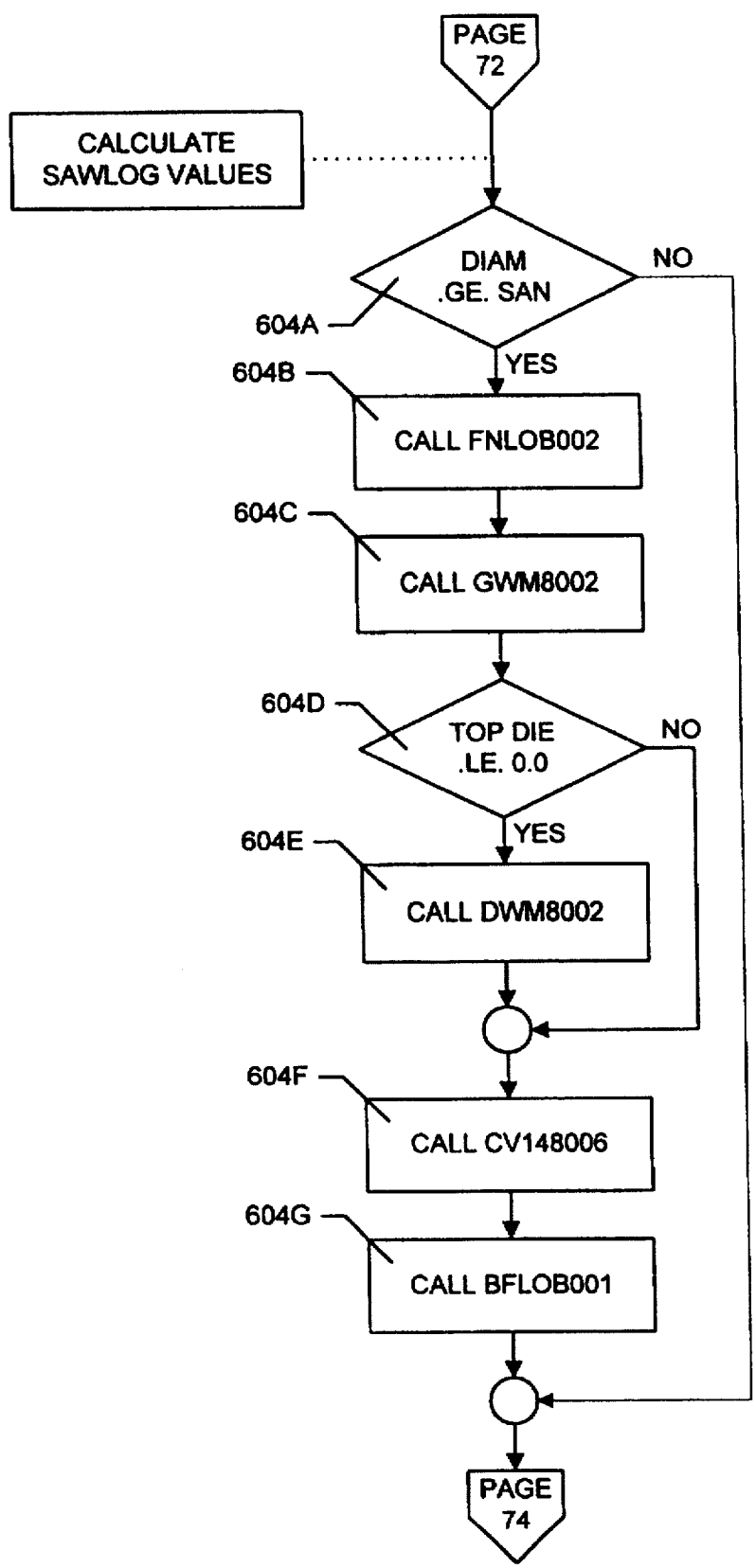
Figure 66:
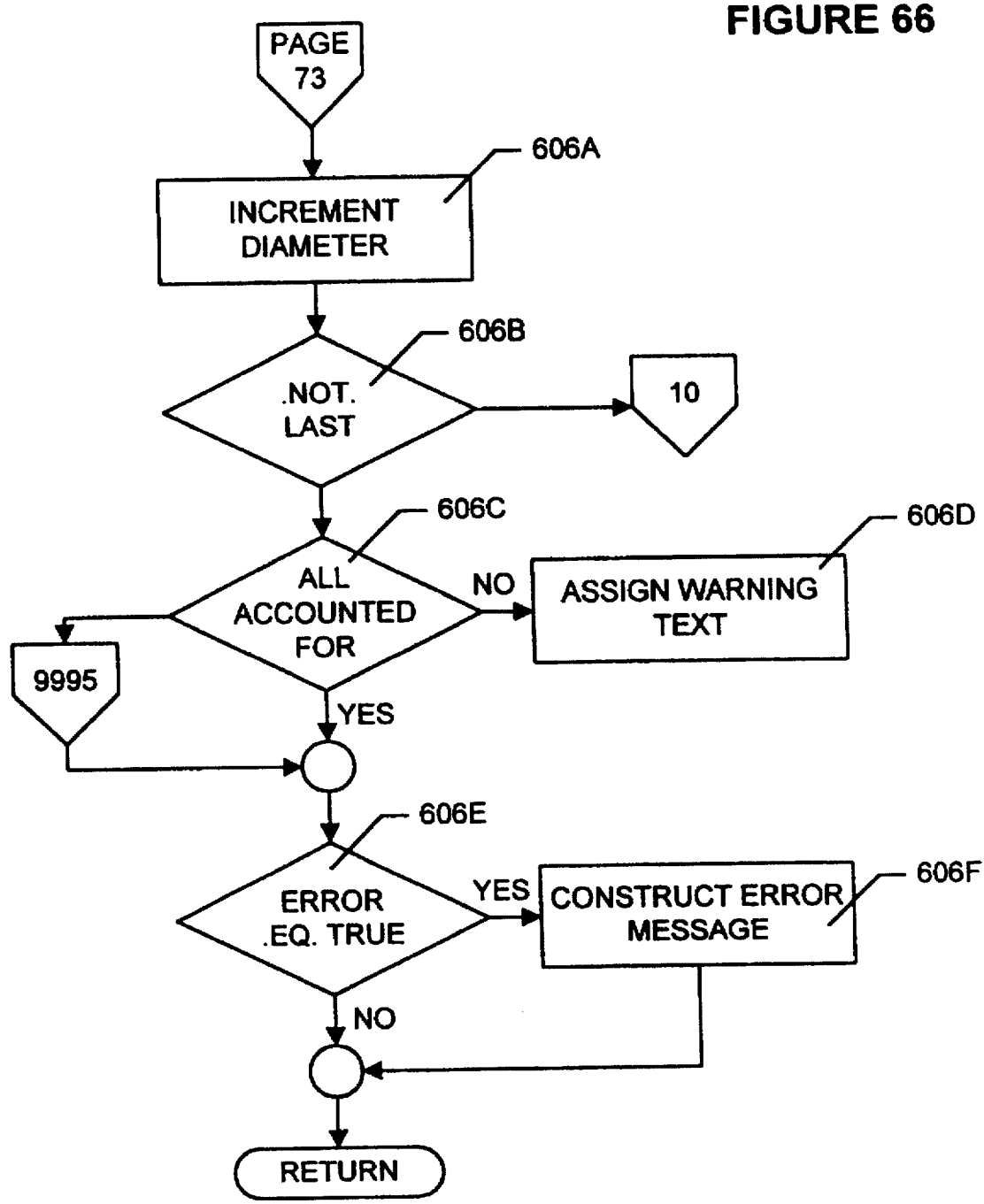

In FIG. 64, if diameter is greater than PULPMIN (box 599), merchantable values are calculated (box 600). The dry weight equation is invalid if the top diameter is>8.0 inches. After a top diameter value check and subroutine calls (boxes 601a–601c), boxes 602a–602f are for calculating chip & saw values. Dry weight equation is invalid if top diameter is >8.0 inches. In FIG. 65, boxes 604a–604g relate to calculating saw log values. First, the system calls the flow diagram illustrated in FIG. 36 to reduce proportion of sawtimber trees. The dry weight equation is invalid if sawtimber top diameter is>8.0 inches. In FIG. 66, boxes 606a–606f relate to incrementing diameter. The system makes sure all probability has been accounted for (box 606c) and, if not, builds a warning message (boxes 606d–606f).

Figure 67:
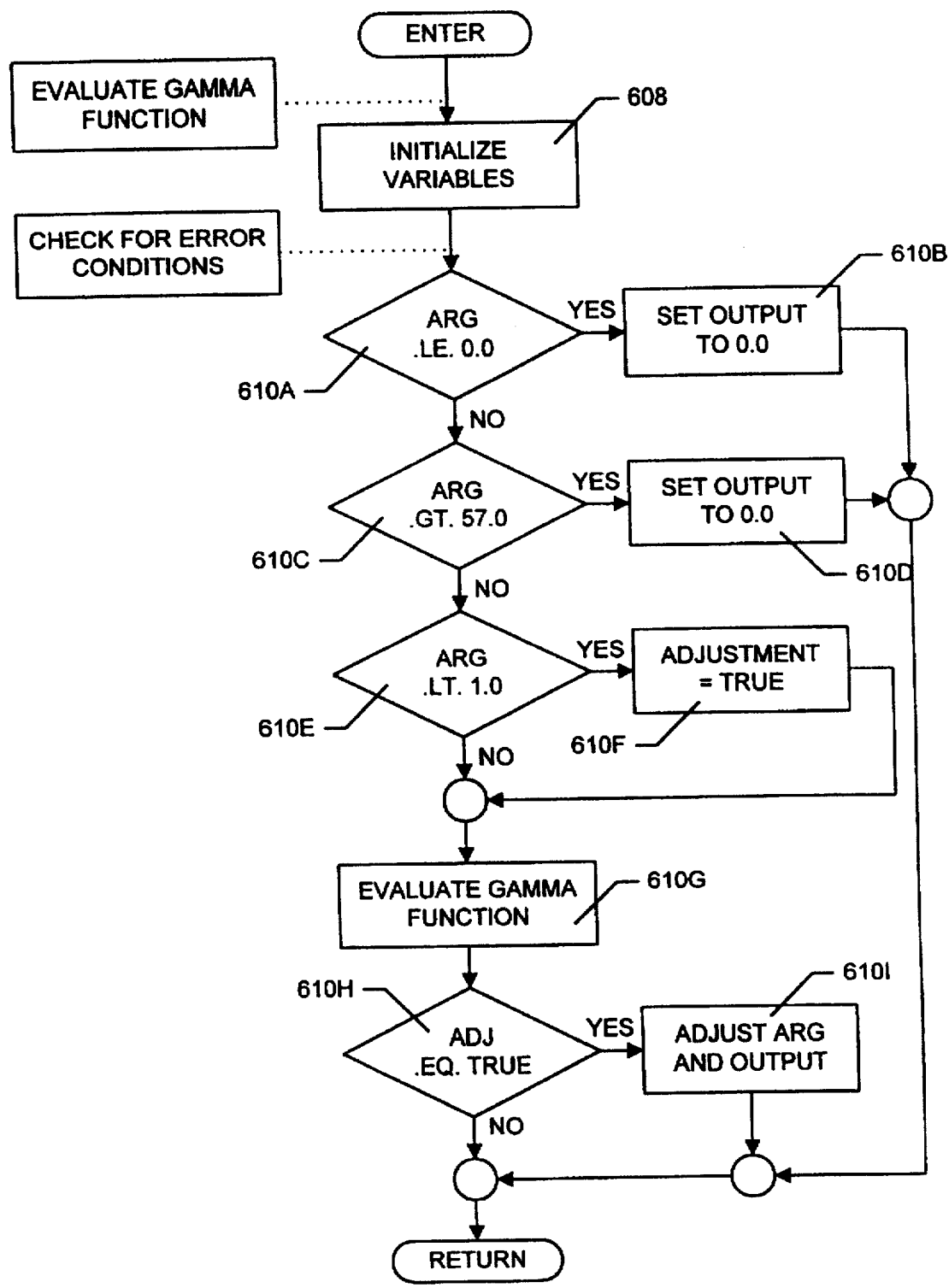
FIG. 67 illustrates a flow diagram for evaluating the Gamma function using a polynomial approximation for values greater than zero according to the present invention.

FIG. 67 illustrates a flow diagram for evaluating the Gamma function using a polynomial approximation for values greater than zero according to the present invention. If the argument to the function is a value which may cause a floating point error, the evaluation will not be performed. The function arguments which may cause an error condition are zero (divide by zero error), values greater than about 57 (floating point overflow error), and negative values (which just do not evaluate correctly). If the value to be evaluated falls within one of the above categories, the function result is set to zero, which the Gamma function will never evaluate to, and control is passed back to the calling routine. Since this is a Fortran FUNCTION, there is no good way to return and also provide an Error Message string. If one wishes to check for errors, one can inspect the FUNCTION value. If it is 0, then there was a problem. There is no error checking for invalid inputs. The function is undefined for zero. If ARG=0, the function returns to 0. In addition, if ARG has a value greater than 57, floating point overflow may occur. Again, the function returns to 0. If ARG is a cardinal number, GAMMA(ARG)=ARG! (factorial). The absolute value of the error of the polynomial approximation equation is≦3*10$^7$. Box 608 is for declaring variables and parameters and initializing variables. Boxes 610a–610i relate to checking for argument values which may cause a floating point exception (divide by zero, or floating point overflow).

Figure 68:
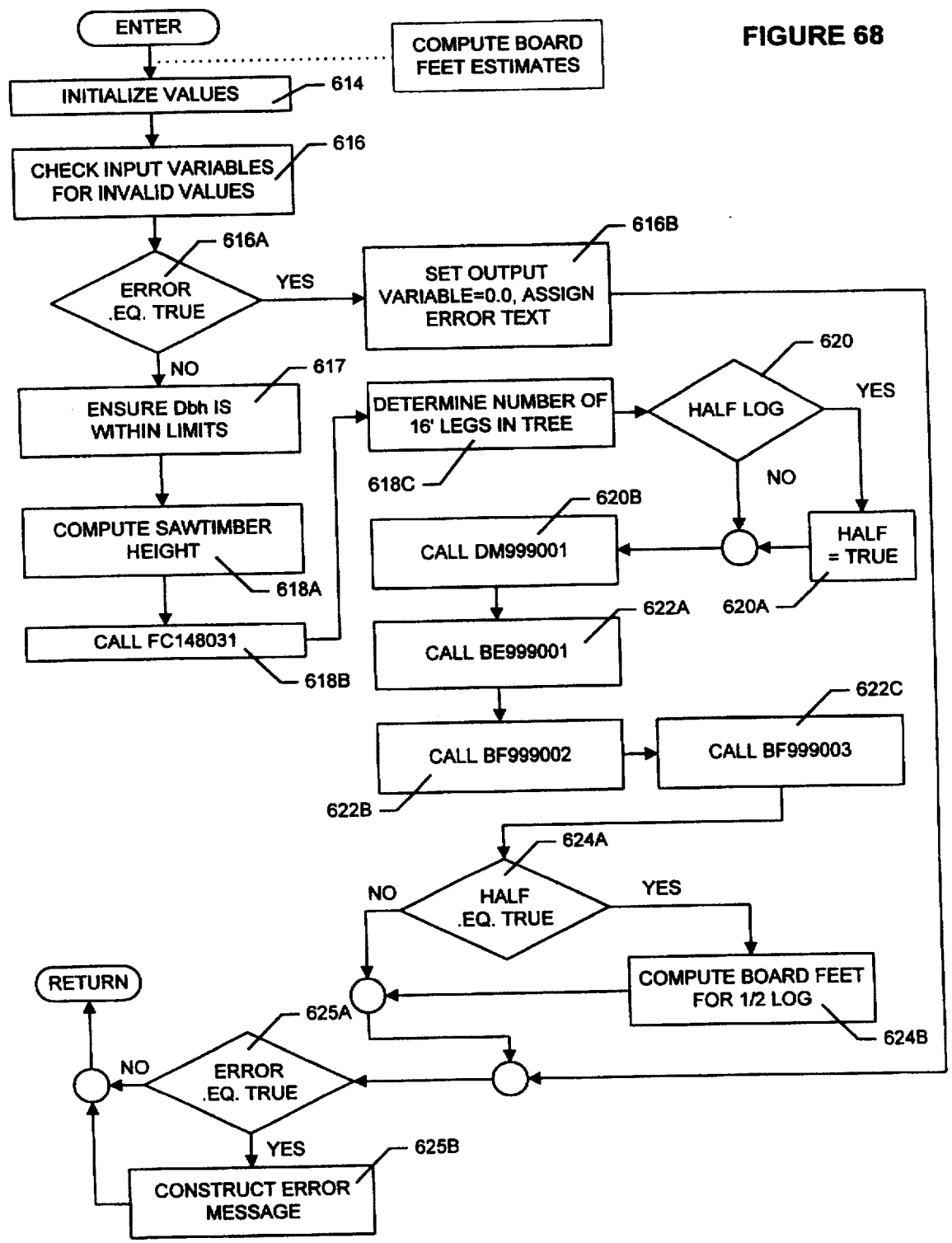
FIG. 68 illustrates a flow diagram for estimating individual tree board feet based on log rule definitions with upper log taper based on equations developed from predetermined tables and sawtimber height as estimated from a taper equation previously derived from Flowers' volume ratio equation for plantation loblolly pine according to the present invention.

FIG. 68 illustrates a flow diagram for estimating individual tree board based on log rule definitions with upper log taper based on equations developed from predetermined tables. Sawtimber height is estimated from a taper equation previously derived from Flowers' volume ratio equation for plantation loblolly pine according to the present invention. The Flowers derived taper equation is unsound for the lower bole, and so, it is not used to describe the entire tree's sawtimber content. Mesavage and Girard's taper estimates (as illustrated by the flow diagram in FIG. 42) limit the maximum sawtimber height to 96 feet or approximately six logs, and the maximum dbh to forty inches. If the sawtimber height is greater than six logs, then the board feet calculated is for six logs only. If the dbh is greater than forty inches, then the value of forty inches is used to calculate the scaling diameter. Box 614 relates to declaring and initializing variables. Box 616 relates to checking the input variables for invalid values and building an error message or messages (boxes 616a–616b). Box 617 serves to ensure that dbh is within limits, and boxes 618a–618c relate to calculating saw timber height, using Flowers' equation, then checking that there is at least one sixteen foot log, and not more than six logs. If there are more than six, the system uses six. Boxes 620a–620b relates to estimating form class and assuming that the stump subtracts one half foot, then divides up the stem into sixteen foot logs plus an eight foot half log if there is that much left over. The system calculates forty percent of dbh here, rather than each pass through loop. The system loops through each log in the tree to compute board foot per log. If there is an extra half-log, the system also loops through another tree, one with an extra whole log, and uses the mean board feet of the two trees. Now, the system calculates taper of the log. According to a statement in Mesavage and Girard, DIB for smooth trees should not be less than forty percent of dbh. Checking for this avoids some of the problems which arise from the way taper and dbh are calculated. Boxes 622a–622c relate to calculating the board feet for sixteen-foot log, using equations for: Doyle (see FIG. 25), International (see FIG. 26), and Scribner (see FIG. 27). Boxes 624a–624b relate to calculating mean board feet for a tree with a half-log, and are followed by an error routine (boxes 625a–625b).

Figure 69:
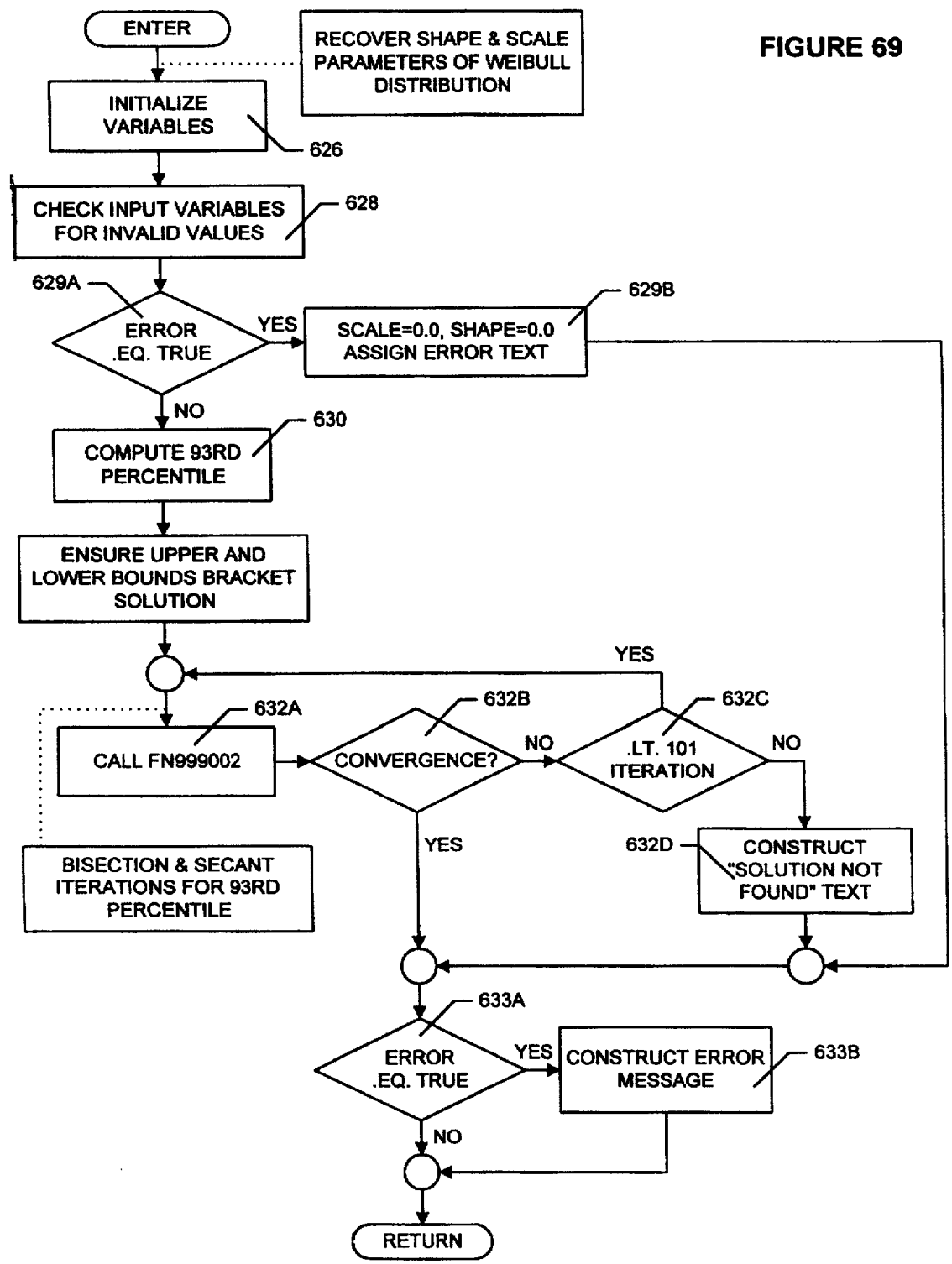
FIG. 69 illustrates a flow diagram to recover the shape and scale parameters of the Weibull using the second noncentral moment quadratic mean dbh and the 93rd percentile according to the present invention.

FIG. 69 illustrates a flow diagram to recover the shape and scale parameters of the Weibull using the second noncentral moment quadratic mean dbh and the 93rd percentile according to the present invention.

A combination of the bisection and secant methods are used to solve for the shape parameter, which is restricted to lie between 1 and 10. If the solution implied by the inputs lies outside this range, the 93rd percentile of dbh is perturbated in increments of 0.1 until the solution is bracketed by one and ten. FIG. 47 illustrates the flow diagram to solve for a second non-central moment. If the prediction of the 93rd percentile is adjusted during the calculations, a warning message is created. In FIG. 69, box 626 relates to declaring and initializing variables. Box 628 relates to checking the input variables for invalid values and building an error message or messages (boxes 629a–629b). Box 630 relates to calculating the 93rd percentile. In box 631, the system checks to insure that SHAPEL and SHAPEU bracket the solution (the flow diagram in FIG. 47 is a strictly decreasing function of the shape parameter in this case). If not, the system adjusts the 93rd percentile as necessary. Next, the system does five bisection iterations to get started (boxes 632a–632d). Box 632 is for beginning secant iterations, maximum of 100. If no convergence after 100 iterations, the system returns non-convergence parameters and implied value of quadratic mean dbh (boxes 633a–633b).

Figure 70:
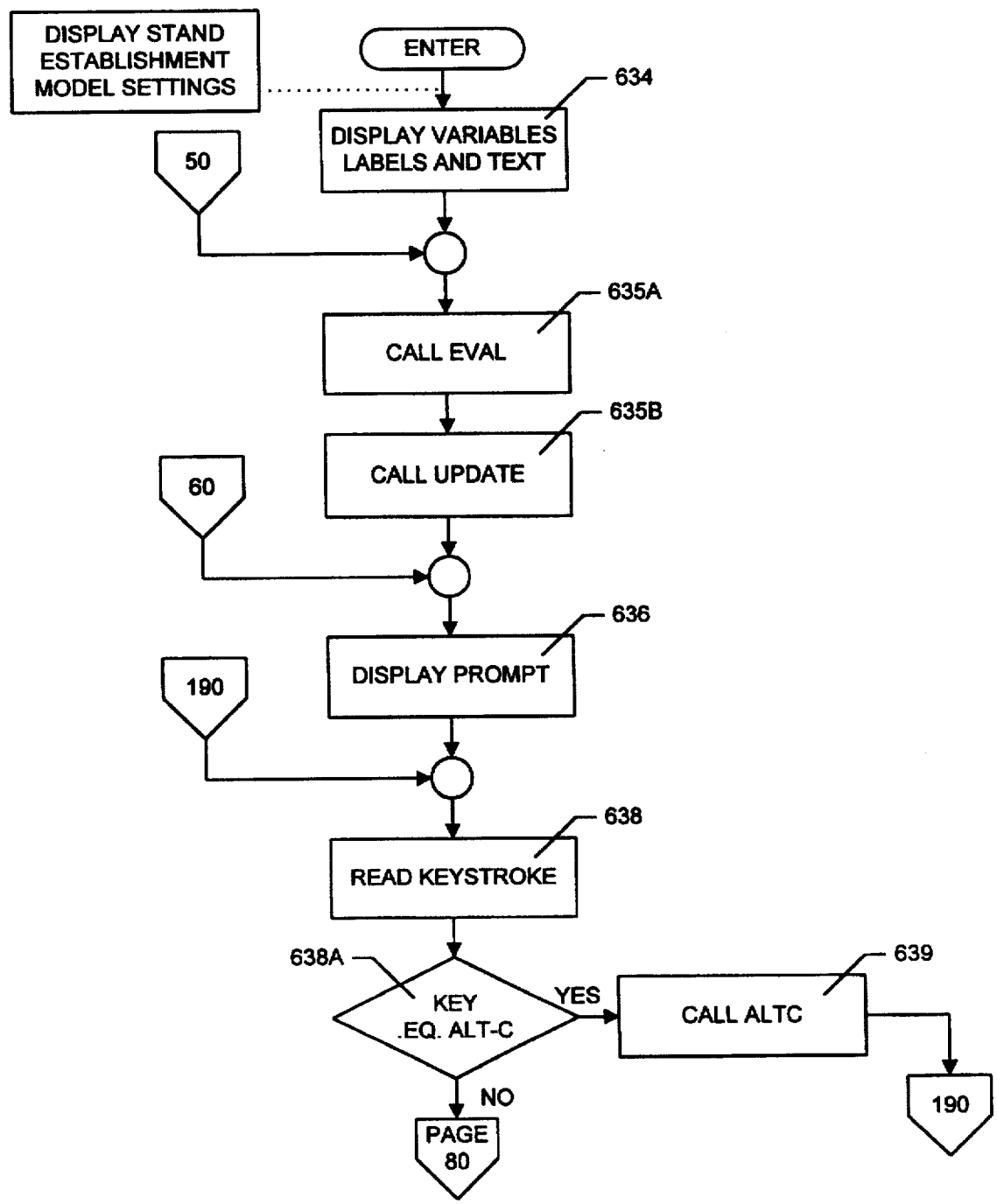
FIGS. 70–76 illustrate a flow diagram for displaying stand establishment model settings according to the present invention.
Figure 71:
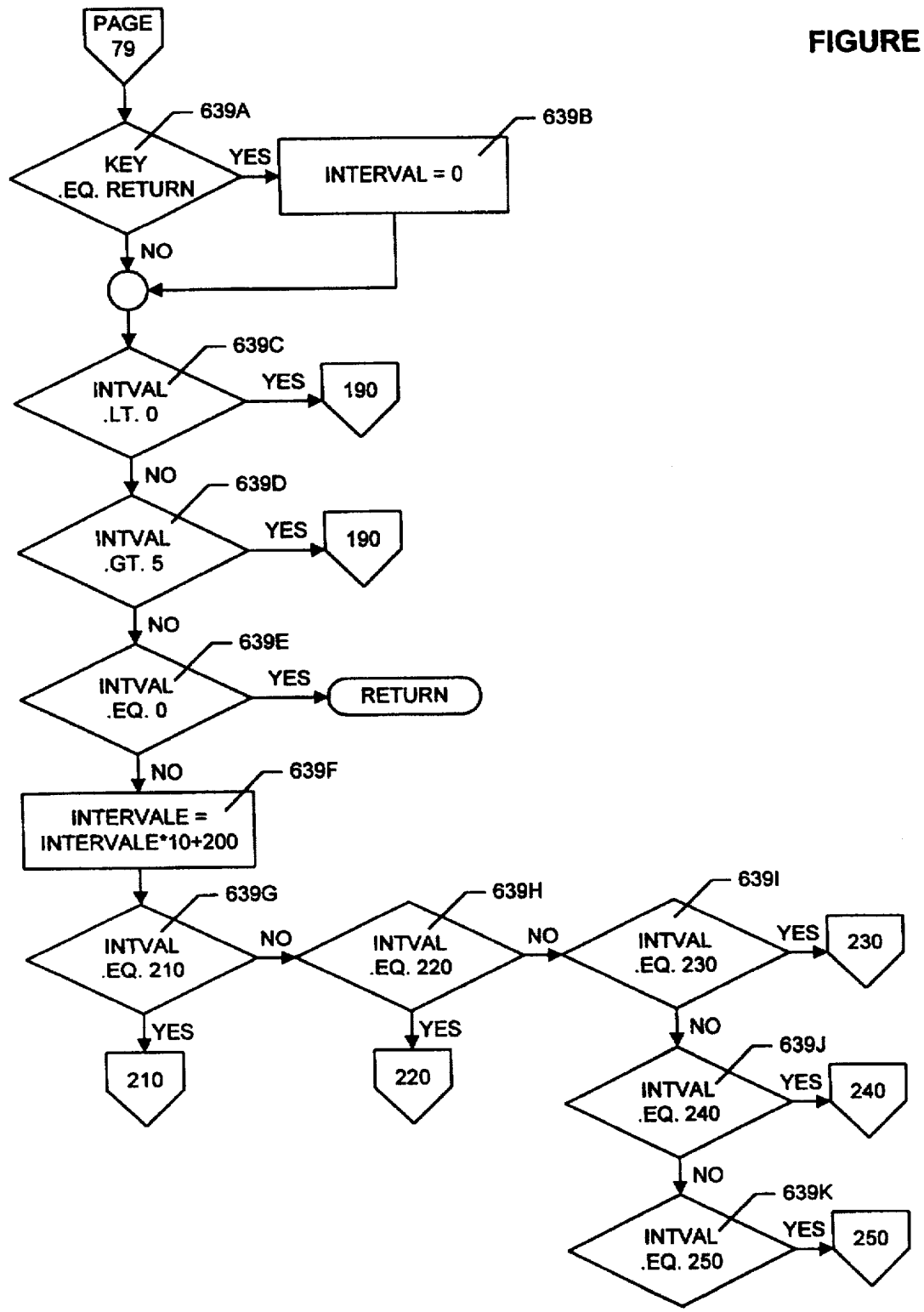
Figure 72:
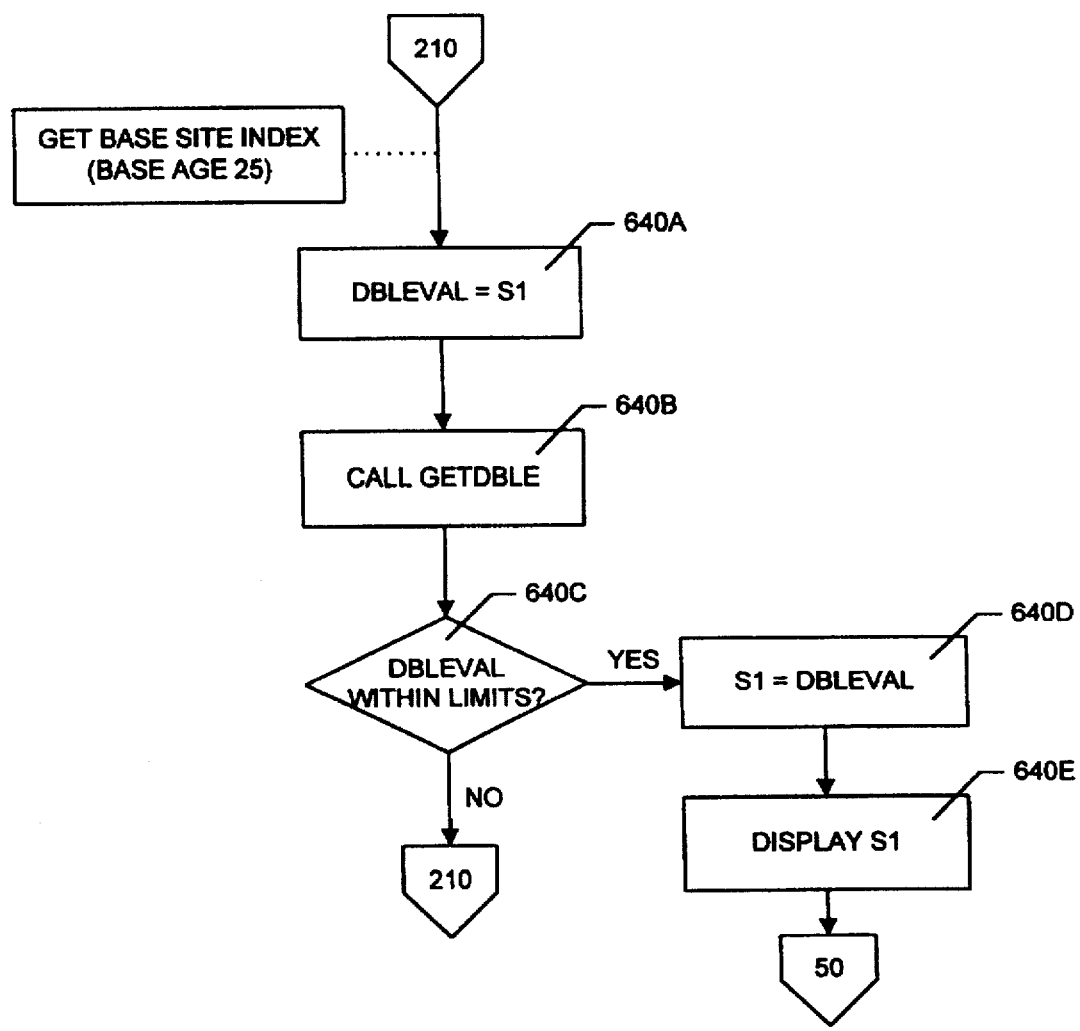
Figure 73:
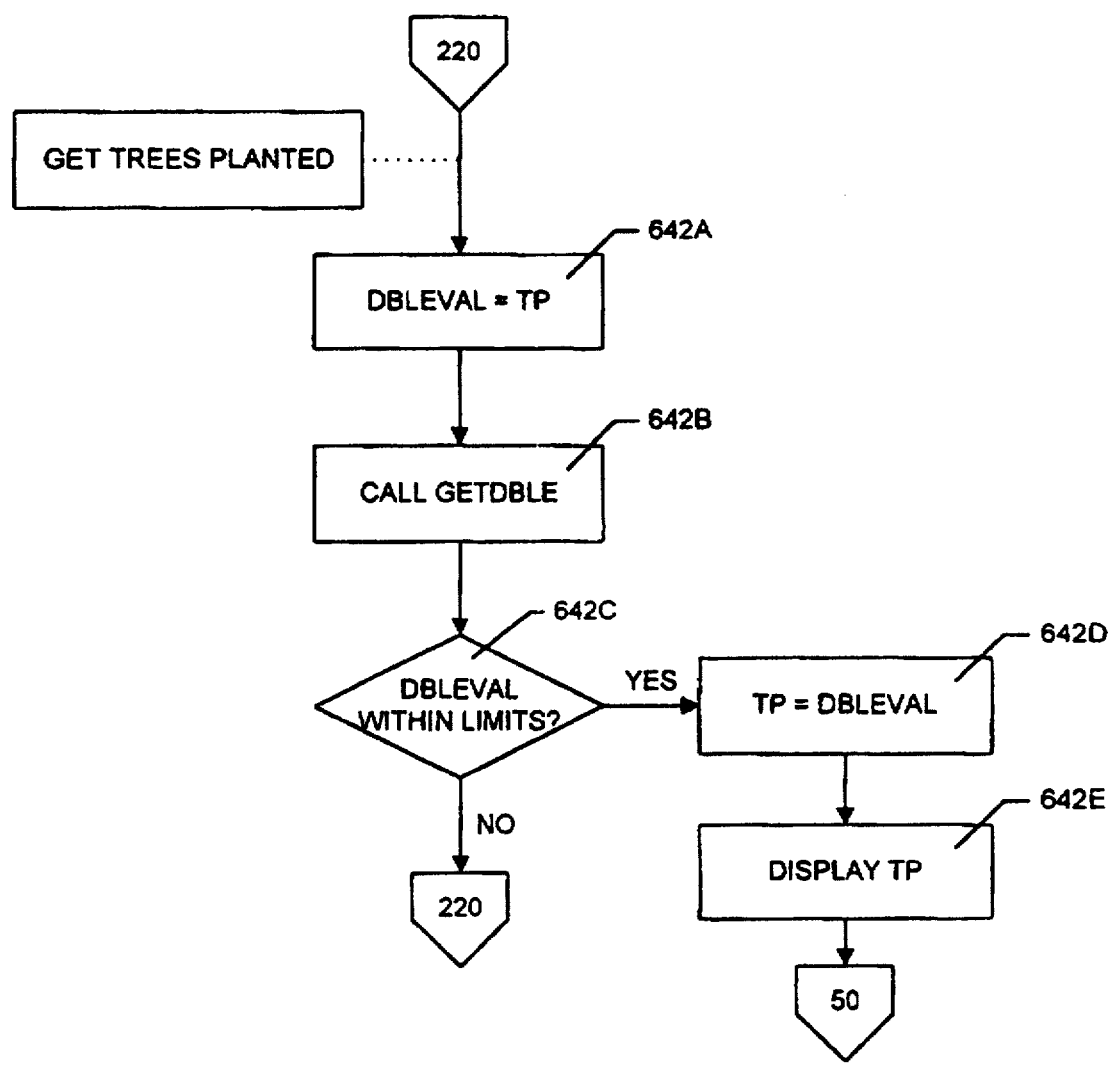
Figure 74:
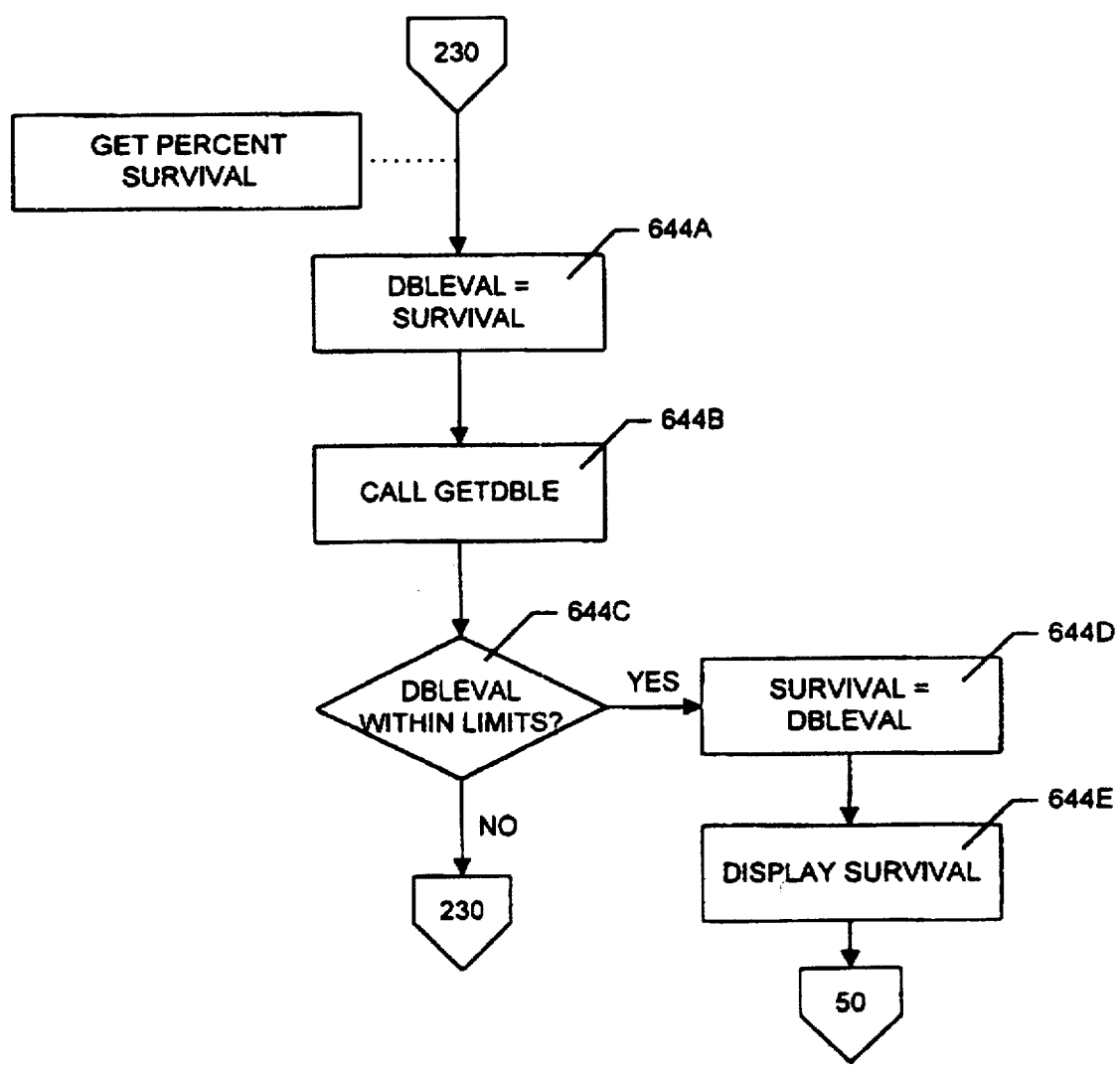
Figure 75:
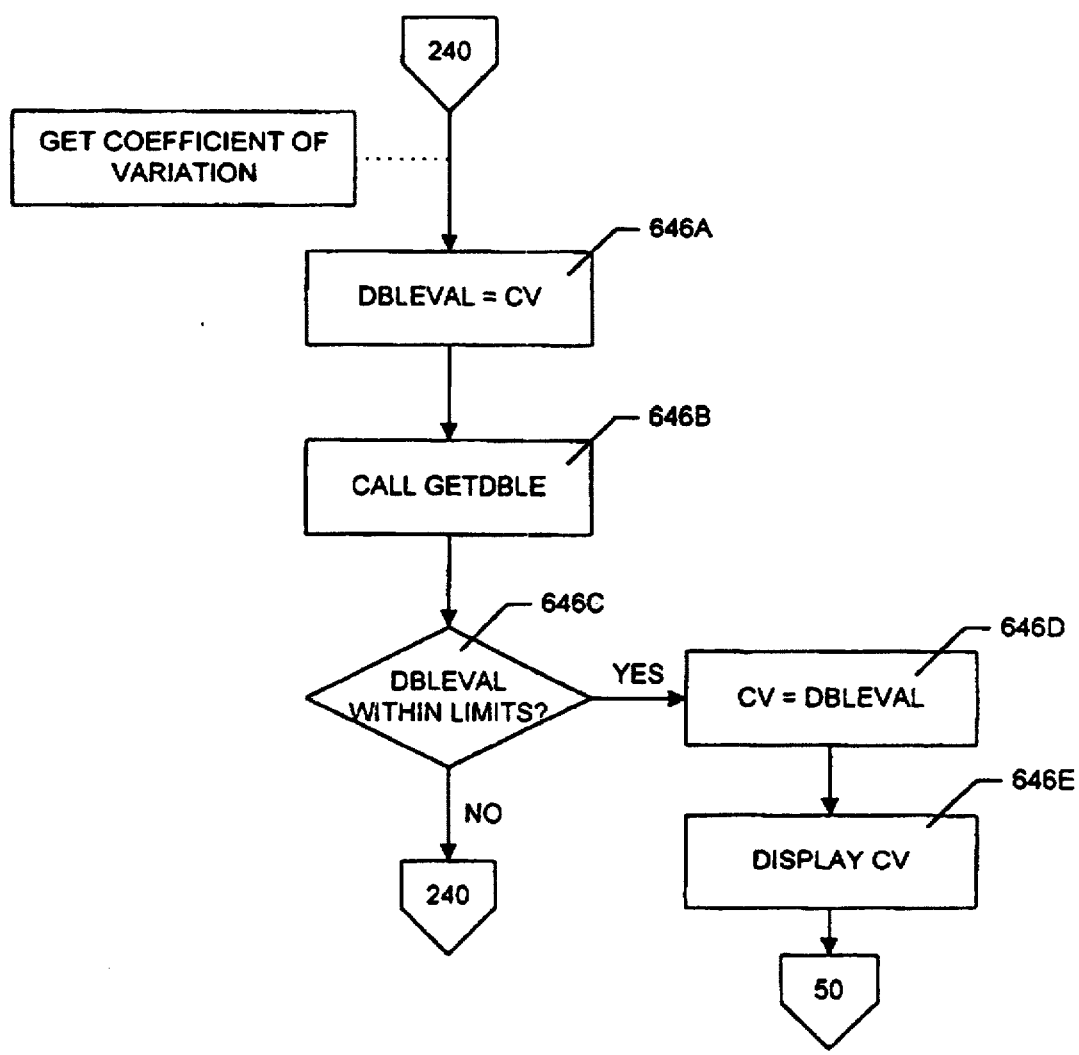
Figure 76:
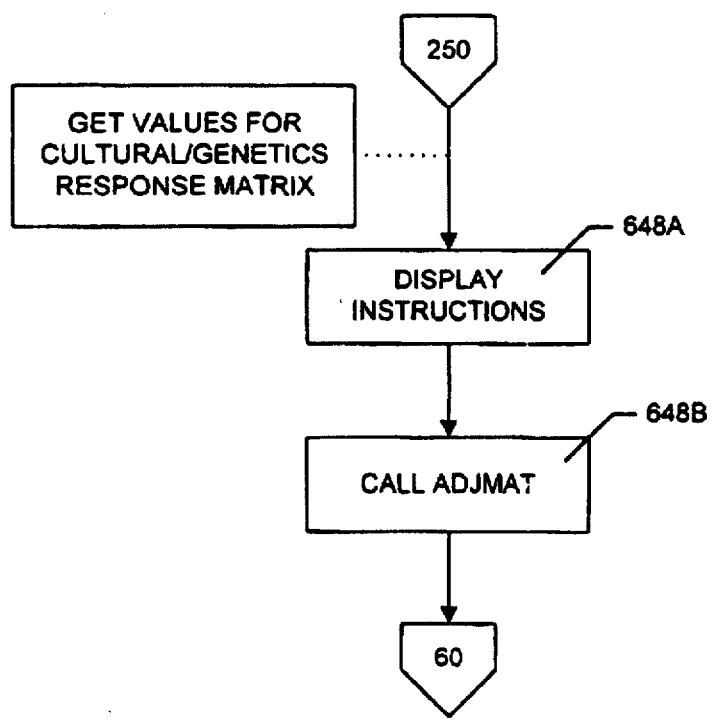

FIG. 70 illustrates a flow diagram for displaying stand establishment model settings according to the present invention. Box 634 relates to display of variable labels and text, while EVAL and UPDATE are called in boxes 635a and 635b, respectively. Box 636 relates to display of a prompt and waiting for a keystroke. Box 638 reads the keystroke, while box 638a checks for Alt-C. If so, the system pops up the calculator (box 639). ASCII code of 13 is carriage return, so the system treats it as zero, and exits. In FIG. 71, a key check and various other checks are performed (boxes 639a–639k). In FIG. 72, boxes 640a–640e, base site index (base age 25) is obtained. In FIG. 73, boxes 642a–642e, trees planted are obtained. In FIG. 74, boxes 644a–644e, percent survival is obtained. In FIG. 75, boxes 646a–646e, coefficient of variation for 0.01 acre survival plots at age one is obtained. Finally, in FIG. 76, boxes 648a–648b, values for the cultural/genetics response adjustment matrix are obtained.

While the above description contains many specificities, these should not be construed as limitations on the scope of the invention, but rather as an exemplification of one preferred embodiment thereof. Many other variations are possible. For example, the method could account for the effects of mid-rotation culture, including nitrogen fertilization, prescribed burning, and thinning. The method could incorporate new weight and volume equations, based on results from the U.S. Loblolly Individual Tree Weight and Volume Study, as they become available. The method could provide the option of using different site index equations, depending on Land Classification soil types, as they become available. The method could include individual tree calculations for basal area increment, survival probability, height growth, and cull percent to provide a mechanism for projecting an existing stand table. The method could provide an interface to read data downloaded from another source. The method could compute and display the Current Annual Increment. The method could specify which product class should be the basis for the calculation of CAI and MAI. The method could include a graphing module, which may be used to show tracks and trends. The method could add on-line help capability. The method could add an option to save a projection at any age to the print file. The method could use the escape key to backup to previous position. The method could include pop-up lists of the available choices, to be used when making selections. The method could select the delimiter character to be used in the print file. Accordingly, the scope of the invention should be determined not by the embodiments illustrated, but by the appended claims and their legal equivalents.

The claims:

1. A method of providing consistent estimated growth and yield values for an agricultural plot, said method comprising the steps of:

calling initial values of the plot;

calling current values and program settings;

determining if an establishment model is to be used;

if establishment is to be used, indicating that calculations are from bare ground;

setting basic values by searching for age of plantation in years, agriculture per acre surviving and basal area wherein values for basal area are projected from bare ground when blank;

calling initial values for stand;

calculating height of dominant and co-dominant agriculture;

determining if values are for bare ground calculations;

if values are not for bare ground calculations, calculating relative spacing, calculating quadratic mean diameter, and calculating percent stocking;

if values are for bare ground calculations, determining if values are for establishment model and, if values are for establishment model, setting basal area carrying capacity site index equal to site index;

calling coordinates order in which other subroutines are called by projecting to target conditions at given age;

determining if an establishment model is utilized and, if the establishment model is utilized, setting bare ground equal to true;

calculating basal area;

determining if basal area in square feet per acre is greater than zero;

if said basal area in square feet is greater than zero, calculating quadratic mean diameter, calculating agriculture per acre, and calculating basal area;

outputting parameters;

generating diameter distribution and calculating stand-level yields;

determining if the model has been established and if the model has been established, adjusting for cultural and genetic effects;

calculating mean annual increment of merchantable dry tons;

determining whether values are to be captured and, if values are to be captured, outputting parameters; and outputting parameters for at least one of the variables and projecting consistent estimated growth and yield values for the plot, including height of dominant-codominant trees to new age, basal area, and trees per acre to new age.

2. The method as recited in claim 1, wherein said step of calling said initial values of the plot further includes fetching at least one of the following: base site index, cultural/ genetics adjustments, coefficient of variation for 0.01 acre survival plots, diameter limits, default age when beginning, calculated site index base age twenty-five years, baseline percent survival, number of trees established, trees planted, background color, foreground color, intensity attribute, blink attribute, cultural/genetic values display, unit number of input, unit number of output, unit number of print file, bare ground, send calculations to the print file, are we using the default values, project from bare ground, does the print file already exists, user identification field for capture file, and name of capture file for use with another method.

3. The method as recited in claim 1, wherein said step of calling current values and program settings further includes the step of fetching at least one of the following: adjusted coefficient of variation for 0.01 acre survival plots based on cultural/genetic effects, adjusted survival based on cultural/ genetic effects, years gained from cultural/genetic effects, basal area carrying capacity, site index to use for basal area carrying capacity, base site index before cultural/genetics adjustments, array of cultural/genetics adjustments, coefficient of variation for 0.01 acre survival plots, diameter limits, default age when beginning, calculated site index, percent hardwood basal area after crown closure, mean height dominant-codominant trees as projected by the Site Index equation, percent height gain from cultural/genetics, calculated site index base age twenty-five years, baseline percent survival, number of trees established, trees planted, uniformity reduction with coefficient of variation for 0.01 acre survival plots adjusted by cultural/genetic effects, percent of stand area in windrows from cultural/genetics, background color, foreground color, array for cultural/genetic values display with highlighted values are recommended for adjustment effects, no change was necessary, unit number of output, send calculations to the print file, are we using the default values, project from bare ground, user identification field for capture file, name of capture file for use with another method, and error message.

4. The method as recited in claim 1, wherein the step of calling initial values for stand further includes the step of fetching at least one of the following parameters: age of plantation in years, basal area in square feet per acre, trees per acre surviving, background color, foreground color, from bare ground, and project from bare ground.

5. The method recited in claim 1, wherein the step of calling coordinates order in which other subroutines are called by projecting to target conditions at given age comprises utilizing at least one of the following variables: site index to use for basal area carrying capacity, number of trees established using age one survival per acre, height of dominant-codominants at previous age, mean height in feet of dominant-codominant trees as projected by a site index equation, quadratic mean dbh in inches, percent stocking, relative spacing, basal area in square feet per acre, trees per acre surviving, any bare ground values, error message.

6. The method as recited in claim 1, wherein the step of outputting parameters comprises outputting at least one of the following variables: age of plantation in years, basal area in square feet per acre, trees per acre surviving, quadratic mean dbh in inches, mean height in feet of dominant-codominant trees as projected by the predetermined site index equation, relative spacing, percent stocking, background color, and foreground color.

7. The method as recited in claim 1, wherein the step of generating diameter distribution and calculating stand-level yields includes generating at least one of the following variables: trees per acre surviving, quadratic mean dbh in inches, mean height in feet of dominant-codominant trees as projected by a predetermined site index equation, age of plantation in years, array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per area, sawtimber cubic feet per acre, tops cubic foot volume, 1000 board feet per acre using Quarter-Inch International, 1000 board feet per acre using Scribner, and error message.

8. The method of claim 1, wherein the step of determining whether values are to be captured and, if values are to be captured, outputting parameters includes generating at least one of the following variables: unit number of outputs, user identification field for capture file, sawtimber dry weight, trees planted, number of trees established with age one survival per acre, coefficient of variation for 0.01 acre survival plots, uniformity reduction with coefficient of variation for 0.01 acre survival plots adjusted by cultural/ genetics, basal area carrying capacity, age of plantation in years, basal area in square feet per acre, trees per acre surviving, quadratic mean dbh in inches, mean height in feet of dominant-codominant trees as projected by a predetermined site index equation, age of plantation in years, array of diameter limits, total yield in given tons per acre, merchantable yield in green tons per acre, chip & saw green weight, sawtimber yield in green tons per acre, tops green weight, total dry weight, merchantable dry weight, chip & saw dry weight, tops dry weight, total cubic feet per acre, merchantable cubic feet per acre, chip & saw cubic foot per volume, sawtimber cubic feet per acre, tops cubic foot volume, 1000 board feet per acre using Quarter Inch International, and 1000 board feet per acre using Scribner.

9. The method of claim 1, wherein the step of outputting parameters includes outputting at least one of the following variables: array of diameter limits, total yield in green tons per acre, merchantable yield in green tons per acre, chip & saw green weight, sawtimber yield in green tons per acre, tops green weight, total dry weight, merchantable dry weight, chip & saw dry weight, sawtimber dry weight, tops dry weight, total cubic feet per acre, merchantable cubic feet per acre, chip & saw cubic foot per volume, sawtimber cubic feet per acre, tops cubic foot volume, 1000 board feet per acre using Quarter Inch International, 1000 board feet per acre using Scribner, and mean annual increment of merchantable dry tons.

10. The method as recited in claim 1, wherein said step of calculating basal area comprises calculating basal area in pine and hardwood;

said method further comprising the step of projecting consistent estimated and yield values for a plot of trees including height of dominant and co-dominant trees to new age, basal area, and trees per acre to new age.

11. The method as recited in claim 10, further comprising the steps of:

initializing variables to defaults and saved settings;

setting cursor scan lines for avoiding a disappearing cursor problem;

setting a BREAK status to OFF to disable Ctrl-Break (Ctrl-C) aborts;

checking for a command line parameter;

if the command line parameter is present, looking for a file with that name and, if the file with that name exists, reading its default values;

if the command line parameter is not present, looking for a predetermined file and, if it exists, using it for default values;

checking if the command line pathname is valid;

reading the settings from the file;

using the default settings;

adjusting basal area in square feet per acre carrying capacity site index;

turning on highlighting for recommended response categories in the cultural/genetics response adjustment matrix;

opening file channels;

turning on keyboard buffering and clock display;

setting pulpwood maximum dbh to sawtimber minimum dbh; and if the predetermined file does not exist, writing the values out to the predetermined file.

12. The method as recited in claim 11, further comprising the steps of setting top diameter limits;

setting minimum dbh limits;

setting maximum dbh limits; and setting pulpwood maximum dbh=sawtimber minimum dbh.

13. The method of claim 10, further comprising the steps of:

checking for the existence of the capture file;

if the capture file does not exist, creating the capture file;

opening the capture file for use; and adding the column headings to it.

14. The method of claim 10, further comprising the steps of:

displaying current values of program settings;

asking if changes are to be made;

indicating sawtimber does not have a specifiable maximum limit;

blanking out the prompt message; and finishing writing to the display.

15. The method of claim 10, further comprising the steps of:

getting initial values for stand;

determining whether said basal area in square feet per acre or trees per acre surviving are entered;

if basal area in square feet per acre or trees per acre surviving are not entered, projecting from bare ground;

getting the initial stand age;

checking for errors, and printing a message;

blanking out any error message;

checking to see if initial stand basal area is entered;

if initial stand basal area is not entered, assuming bare ground;

projecting to target stand;

using key codes to determine whether or not a particular keystroke is within a class that is valid and, if so, processing the keystroke, but if not valid, ignoring the keystroke or constructing an error message and returning control;

blanking out any error message;

determining if basal area was entered, then also reading trees/acre;

checking for errors, and printing a message; and blanking out any error message.

16. The method of claim 10, further including the steps of:

calling the routines listed in the external subroutines section;

computing the quadratic mean diameter, percent stocking, and relative spacing;

determining if data are from bare ground;

calculating the basal area and trees per acre;

receiving the data and indicating that bare ground is false;

declaring variables;

determining if mean height in feet of dominant-codominant trees as projected by the site index equation equals height of dominant-codominants at previous age and the data is not from bare ground;

calculating stand-level model parameters;

performing the intermediate calculations for basal area in square feet per acre and survival equations;

calculating the basal area growth;

calculating surviving trees per acre;

determining crash factor of grown stand;

checking for errors in computed values returned by other modules;

initializing error message variables;

calculating quadratic mean diameter; and calculating percent stocking.

17. The method of claim 10, further comprising the steps of:

displaying values at their proper location on the screen; and blanking out the unknown variables' previous value.

18. The method of claim 10, further comprising the steps of:
- displaying the final portion of the calculated values on the screen;
- filling in the values at the appropriate locations for total green weight, dry weight, and cubic foot to include merchantable, pulp, chip & saw and saw for each of total yield in green tons per acre, total dry weight, total cubic feet per acre, merchantable yield in green tons per acre, merchantable dry weight, merchantable cubic feet per acre, chip & saw green weight, chip & saw dry weight, chip & saw cubic foot volume, sawtimber yield in green tons per acre, sawtimber dry weight, and sawtimber cubic foot volume;
- calculating pulp values as merchantable minus saw, wherein the currently used dry-weight equation is invalid for sawtimber, if the top-diameter is larger than eight inches;
- calculating cord values as seventy-five cubic feet of solid wood; and
- multiplying by one thousand to give total board feet.

19. The method of claim 10, further comprising the step of displaying the first text portion of a control panel by putting the first text portion of the control panel on the screen.

20. The method of claim 10, further comprising the step of displaying the second part of the control panel by putting the second text portion of the control panel on the screen.

21. The method of claim 10, further comprising the step of writing values to an output file.

22. The method of claim 10, further comprising the steps of:
- controlling a calling order of modules denoted in subroutines;
- utilizing external subroutines to compute the Weibull distribution;
- computing stand level yield;
- declaring variables;
- recovering the Weibull distribution scale and shape parameters;
- calculating stand-level yields from diameter distribution based on parameters from Weibull; and
- displaying variable labels and current values of variables.

23. The method of claim 10, further comprising the steps of:
- getting values for settings variables;
- displaying variable labels and current values of variables;
- prompting for new value settings;
- saving calculations to a print file;
- blanking out the filename prompt;
- getting a specified user identification field for a capture file;
- checking for stand establishment model;
- getting pulpwood top diameter;
- getting pulpwood minimum dbh;
- getting chip & saw top diameter;
- getting chip & saw minimum dbh;
- getting chip & saw maximum dbh;
- getting sawlog top diameter;
- getting sawlog minimum diameter;
- setting pulpwood maximum diameter equal to sawtimber minimum diameter;
- getting site index base age to twenty-five;
- getting number of trees established at age one;
- using the calculator;
- writing current settings to a file; and
- adjusting stand establishment model settings.

24. The method as recited in claim 10, further comprising determining total stem volume, inside the bark, or merchantable volume from dbh and total height by performing the following steps:
- initializing variables;
- checking input variables for invalid values and building at least one error message; and
- calculating volume.

25. The method as recited in claim 10, comprising the steps of providing an equation which calculates total stem dry weight inside the bark and, if top diameter is not equal to zero, then calculating merchantable dry weight using the total stem dry weight and a predetermined Flowers' ratio equation by performing the following steps:
- initializing variables;
- checking input variables for invalid values and, if invalid, building at least one error message;
- calculating total dry weight in pounds inside bark;
- determining if top diameter is specified (i.e., >0); and
- calculating merchantable dry weight using an equation by Flowers.

26. The method as recited in claim 10, further comprising the step of calculating Girard's form class, the ratio of the diameter at the top of the first log to dbh, for an individual planted loblolly pine from an unthinned, unfertilized stand by performing the following steps:
- initializing variables;
- checking input variables for invalid values and building at least one error message;
- determining if ERROR is true;
- if ERROR is true, setting the output values to zero; and
- if ERROR is not true, performing the calculations.

27. The method as recited in claim 10, further comprising reducing a proportion of sawtimber trees for a given dbh class by performing the following steps:
- declaring variables;
- initializing variables;
- checking input variables for invalid values;
- and building at least one error message.

28. The method as recited in claim 10, comprising the step of displaying error messages.

29. The method of claim 10, further comprising the steps of determining basal area growth by performing the following steps:
- declaring variables;
- initializing variables;
- checking input variables for invalid values;
- building at least one error message; and
- computing basal area in square feet per acre.

30. The method as recited in claim 10, further comprising the step of computing board foot volume for one log according to the Doyle Log Rule by performing the following steps:
- declaring variables;
- initializing variables;
- checking input variables for invalid values;
- building at least one error message; and calculating Doyle Board Feet.

31. The method as recited in claim 10, further comprising the step of computing board foot volume for one log according to a Quarter Inch International Log Rule by performing the following steps:
   declaring variables;
   initializing variables;
   checking input variables for invalid values;
   building at least one error message; and
   calculating International Board Feet.

32. The method as recited in claim 10, further comprising the step of computing board foot volume for one log according to a least squares equation, which approximates a Scribner Log Rule, by performing the following steps:
   declaring variables;
   initializing variables;
   checking input variables for invalid values;
   building at least one error message; and
   calculating Scribner Board Feet.

33. The method as recited in claim 10, further comprising the step of creating a non-existent settings files by writing default settings, along with identifiers for each value, to the non-existent settings file.

34. The method as recited in claim 10, further comprising the step of updating establishment model settings by writing an accumulated value for a response.

35. The method as recited in claim 10, further comprising the step of obtaining a character string from an input according to the following steps:
   displaying the field width in reverse video;
   inserting the current value of the string;
   positioning the cursor at the beginning of the field, awaiting input;
   providing a variable keyboard scan code with the following meanings
      0=all characters are allowed, including control and graphics,
      1=check for DOS filename protocols, but no pathnames,
      2=allow only normal ASCII characters (32-126),
      3=check for DOS filename and pathname protocols,
      4=Yes/No answer;
   setting ASCII Code 13=<Enter> key (Carriage Return); and
   checking if anything other than a carriage return was entered.

36. The method as recited in claim 10, further comprising the step of calculating individual tree green weight equation for plantation-grown loblolly pine by performing the following steps:
   declaring variables;
   initializing variables;
   checking input variables for invalid values and building at least one error message;
   calculating green weight; and
   calculating merchantable green weight, using the top diameter, to compute a ratio;
   wherein, if the top diameter equals zero, then ratio equals one and green weight is returned as the total green weight.

37. The method of claim 10, further comprising the steps of calculating crash factor and relative spacing, wherein the crash factor reduces basal area in high-density stands by performing the following steps:
   setting the relative spacing to the ratio of inter-tree distance to mean height of dominant-codominant trees;
   imposing a lower limit on the crash-factor;
   fitting the data by rounding to the nearest tenth;
   declaring variables;
   initializing variables;
   checking input variables for invalid values and building at least one error message;
   calculating relative spacing and crash-factor, where $0.6 \leq$ crash-factor $\leq 1.0$;
   testing the value to be used in the exponential function to prevent floating point exceptions; and
   if testing is determined to be OK, then calculating and testing for a crash factor lower limit; and
   if testing is not determined to be OK, setting crash factor equal to a lower limit.

38. The method of claim 10, further comprising the step of evaluating the expression for the second non-central moment of the Weibull distribution when the location parameter and the 93rd percentile are known by performing the steps of:
   declaring variables;
   initializing variables;
   checking input variables for invalid values and building at least one error message; and
   calculating the shape, scale, and moment.

39. The method of claim 10, further comprising the step of determining the total height for plantation-grown loblolly pine by carrying out the following steps:
   declaring variables;
   initializing variables;
   checking input variables for invalid values and building at least one error message; and
   calculating total height.

40. The method of claim 10, further comprising the step of calculating percent stocking according to the following steps:
   declaring variables;
   initializing variables;
   checking input variables for invalid values and building at least one error message; and
   calculating percent stocking.

41. The method of claim 10, further comprising predicting survival by projecting the number of trees from one time to another, using height of dominant-codominants as a surrogate, comprising the following steps:
   declaring variables;
   initializing variables;
   checking input variables for invalid values and building at least one error message; and
   calculating trees per acre surviving.

42. The method of claim 10, further comprising the steps of receiving an integer from an input by displaying the field width in reverse video, and inserting the current value of the variable, after which the cursor is positioned at the beginning of the field, awaiting input.

43. The method of claim 10, further comprising the steps of receiving values for the cultural/genetics response adjustment matrix according to the following steps:
   assigning limits of the cultural/genetic adjustment matrix;
   assigning keyboard scan codes for the cursor control keys;
   assigning keyboard scan codes for the escape key;

displaying the value of the current cell;

waiting for a keystroke to be entered, then determining its type, wherein Type 0=Extended key functions, Type 1=Numeric keys (and signs);

adjusting the position to the lightbar wherein Type 2=Alpha (ASCII 32-126); and adjusting the position of the lightbar wherein Type 3=Math symbols and brackets, Type 4=Graphics characters (ASCII 128-254), Type 5=Control characters (ASCII 1-31), ASCII Code 27 is escape, so exit, ASCII Code 13 is carriage return, so adjust position of lightbar, Type 6=Cursor movement keys.

44. The method as recited in claim 10, further comprising the steps of obtaining a double precision value from the input by displaying the field width in reverse video, and the current value is inserted wherein Type 5=Control characters (ASCII 1-31), and <Enter> key was not pressed.

45. The method as recited in claim 10, further comprising the steps of:

calling a pop-up calculator for performing the steps of calculating site index base age twenty-five, trees per acre surviving, and percentages;

turning the keyboard buffer off;

saving current text in a window area for the calculator;

clearing the window area, and drawing a box around the window area;

calculating one of site index given age of plantation in years and height of dominant-codominant tree or trees, trees per acre surviving given spacing within rows and between rows, and a percentage value;

restoring text to screen; and turning keystroke buffer back on.

46. The method as recited in claim 10, further comprising the step of evaluating variables using defaults or values supplied according to the following steps:

evaluating variables, using defaults or values supplied at run-time;

adjusting percent survival based on genetic/cultural values;

calculating trees established age one;

if an adjusted coefficient of variation for 0.01 acre survival plots at age one is greater than zero, calculating uniformity reduction;

checking the uniformity reduction so that it is not greater than 1.0 or less than 0.0;

adjusting for age gain;

adjusting for height gain from genetics improvement;

adjusting basal area carrying capacity site index, using height gain (%) and calculated site index with a base age of 25 years adjusted; and calculating the basal area carrying capacity.

47. The method as recited in claim 10, further comprising the step of estimating taper reduction for calculating diameter inside bark at the top of the each sixteen foot log, wherein up to six logs with up to forty inch diameter can be handled, in accordance with the following steps:

declaring variables;

initializing variables;

checking input variables for invalid values and building at least one error message; and calculating the taper of the log.

48. The method recited in claim 10, further comprising performing intermediate computations using stand-level model parameters for the basal area and survival equations of the loblolly pine plantation growth and yield model, in accordance with the following steps:

determining if bare ground=true;

if bare ground=false but basal area has not been measured, entering the number of trees established at age one survival per acre to project basal area as if from bare ground, while projecting survival from its observed value;

determining if the number of trees established at age one survival per acre defaults to 600;

determining if both initial basal area and initial survival are entered (>0) and bare ground is false, so that the number of trees established at age one survival per acre is ignored;

declaring variables;

initializing variables;

assigning values for model parameters;

checking input variables for invalid values and building at least one error message;

computing a plurality of parameters for basal area in square feet per acre;

determining if bare ground projection is "true";

computing for basal area in square feet per acre model and for trees per acre surviving model based on number of trees established at age one survival per acre;

determining if inventory projection is "true";

computing for basal area in square feet per acre model based on initial basal area in square feet per acre model and initial mean height in feet of dominant-codominant trees as projected by the site index equation;

computing trees per acre surviving model based on initial trees per acre surviving and initial mean height in feet of dominant-codominant trees as projected by the site index equation;

determining if initial basal area in square feet per acre is $\geq$ a carrying capacity and, if so, decreasing basal area in square feet per acre so that basal area in square feet per acre is 99% of carrying capacity;

determining if input basal area in square feet per acre is zero, and projecting basal area in square feet per acre as if a bare ground projection;

using an estimate of establishment density number of trees established with age one survival per acre, wherein the number of trees established with age one survival per acre will default to 600 trees per acre if it was not specified; and estimating initial mean height feet of dominant-codominant trees as projected by the site index equation $\leq$ HIP, T1 and T2 as if from bare ground, wherein the number of trees established with age one survival per acre is estimated from initial trees per acre surviving and initial mean height in feet of dominant-codominant trees as projected by the site index equation.

49. The method as recited in claim 10, further comprising calculating one of site index and mean height in feet of dominant-codominant trees as projected by the site index equation depending on which is $\leq 0$, wherein the calculation utilizes a modified Clutter & Lenhart site index curve in accordance with the following steps:

declaring variables;

initializing variables;

assigning values for model parameters;

checking input variables for invalid values and building at least one error message;

performing calculations;

calculating height of dominant-codominant trees, wherein for ages of 13 years and greater, using the Clutter & Lenhart height predictions, and for ages less than 13 years, the curve is defined by an allometric form of the Richards function, and wherein the equation is forced through three points, the origin, and the Clutter & Lenhart height predictions at ages 12 and 13 years;

calculating site index wherein, if age of plantation in years is greater than 12, a Clutter & Lenhart equation is used and, if the age of planation is less than 12, an iterative bisection on the range 30 to 110 is performed until predicted height is within 0.1 foot of the true height; and bisecting and iterating.

50. The method recited in claim 10, further comprising the steps of:

receiving Weibull parameters;

computing stand-level yields from three threshold dbhs for three different top diameters;

calling for prediction of total height, individual tree green weights, dry weights, cubic foot volume, 1000 board feet in Doyle, 1000 board feet in Quarter Inch International, and 1000 board feet in Scribner;

corresponding three values for threshold dbh and top diameter to three different yield classes;

outputting yields corresponding to the first class (merchantable yield in green tons per acre, merchantable dry weight, merchantable cubic feet per acre) for all material larger than threshold dbh (1) and top diameter (1), wherein the second class (chip & saw, chip & saw dry weight, chip & saw cubic foot volume) is for all material larger than threshold dbh (2) and top diameter (2) but smaller than threshold (3) and top diameter (3), and the third class is the largest material (sawtimber) and excludes the others;

reducing frequency of trees larger than threshold dbh (3) by removing, changing, or modifying a third value of threshold dbh and top diameter input corresponding to any desired product definition;

assuming the material to be sawtimber, setting DXINC=1 inch for accuracy and efficiency;

defining class limits as (0, DX, 2*DX, 3*DX, 4*DX, 5*DX, . . . ); using the class midpoints, ([i*DX+(i+1)*DX]/2), for the accumulation of basal area and yield;

processing classes into infinity according to the definition of the Weibull, but for practicality imposing a stopping condition when a class is reached with less than 0.15 trees per acre surviving of larger size;

picking up exactly one inch (not one class) and placing the remaining trees at that point;

specifying values for threshold dbh so that their precision is compatible with DX, otherwise merchantable yields will be biased;

determining if accumulated basal area and input trees per acre surviving imply that the quadratic mean dbh is different from its input value then issuing a warning;

determining if the input Weibull parameters were recovered from stand parameters so this condition would never occur;

providing yields for any Weibull parameter values;

initializing variables;

assigning values for model parameters;

checking input variables for invalid values and build error message or messages;

marking the fallback position, in case there are too many inputs≦0, so the error message can be modified;

checking if there is room to complete normal error message about≦0, otherwise replacing with multiple error message, but without overwriting any message about mean diameters being unequal;

performing calculations;

flagging the stopping criterion, after which one last pass is made with left-over probability placed in the right tail exactly one inch back from the current unused value of X;

accumulating basal area check sum, and calculating total yield values;

calculating merchantable values, wherein dry weight equation is invalid if top diameter is>8.0 inches;

calculate chip & saw values;

calculating saw log values by reducing proportion of sawtimber trees wherein dry weight equation is invalid if sawtimber top diameter is>8.0 inches; and incrementing diameter, wherein all probability has been accounted for, and determining if not, building a warning message.

51. The method as recited in claim 10, further comprising evaluating the Gamma function using a polynomial approximation for values greater than zero in accordance with the steps of:

determining if the argument to the function is a value which may cause a floating point error, so the evaluation will not be performed, wherein the function arguments which may cause an error condition are in categories defined as zero (divide by zero error), values greater than about 57 (floating point overflow error), and negative values;

determining if the value to be evaluated falls within one of the categories, wherein the function result is set to zero, which the Gamma function will never evaluate to, and passing control back to the calling routine;

checking for invalid input, wherein the function is undefined for zero;

determining if ARG=0, wherein the function returns to 0, and if ARG has a value greater than 57, floating point overflow may occur, so the function returns to 0;

determining if ARG is a cardinal number, GAMMA (ARG)=ARG! (factorial), wherein the absolute value of the error of the polynomial approximation equation is$\leq 3*10^7$;

declaring variables and parameters;

initializing variables; and checking for argument value which may cause a floating point exception.

52. The method as recited in claim 10, further comprising estimating individual tree board foot based on log rule definitions with upper log taper based on equations developed from predetermined tables and sawtimber height from a taper equation previously derived from a Flowers' volume ratio equation for plantation loblolly pine in accordance with the following steps:

determining if the sawtimber height is greater than six logs;

calculating the board feet for six logs only;

determining if the dbh is greater than forty inches;

calculating with the value of forty inches for the scaling diameter;

declaring variables;

initializing variables;

checking input variables for invalid values and building at least one error message;

calculating saw timber height using a Flowers' equation;

checking that there is at least one sixteen foot log and not more than six logs;

determining if there are more than six logs;

estimating form class;

assuming that the stump subtracts one half foot, then dividing up the stem into sixteen foot logs plus an eight foot half log if there is that much left over;

calculating forty percent of dbh here, rather than each pass through loop;

looping through each log in the tree to compute board foot per log;

determining if there is an extra half-log, also looping through another tree, one with an extra whole log, and using the mean board foot of the two trees;

calculating taper of the log;

checking for problems which arise from the way taper and dib are calculated;

calculating the board feet for sixteen-foot log, using equations for Doyle, Quarter Inch International, and Scribner; and calculating mean board feet for a tree with a half-log.

53. The method as recited in claim 10, further comprising recovering the shape and scale parameters of a Weibull distribution using the second noncentral moment quadratic mean dbh and the 93rd percentile in accordance with the following steps:

using a combination of a bisection method and a secant method to solve for the shape parameter, restricted to lie between a range of one and ten;

determining if the solution implied by the inputs lies outside the range;

perturbating a 93rd percentile of DBH in increments of 0.1 until bracketing a solution by one and ten;

determining if the prediction of the 93rd percentile is adjusted during the calculations;

creating a warning message;

declaring variables;

initializing variables;

checking input variables for invalid values and build error message or messages;

calculating the 93rd percentile;

insuring that SHAPEL and SHAPEU bracket the solution;

if SHAPEL and SHAPEU do not bracket the solution, adjusting the 93rd percentile as necessary;

doing five bisection iterations to get started;

beginning secant iterations, maximum of 100, and if no convergence, return non-convergence parameters and implied value of quadratic mean dbh;

indicating no convergence by secant method;

adjusting prediction of 93rd percentile; and indicating a solution cannot be found, even after adjusting the 93rd percentile.

54. The method as recited in claim 10, further comprising displaying stand establishment model settings in accordance with the following steps:

displaying variable labels and text;

waiting for a keystroke;

checking if it is Alt-C and, if so, pop up the calculator;

setting ASCII code of 13 to carriage return, treat as zero, and exit;

getting base site index;

getting trees planted;

getting percent survival;

getting coefficient of variation for 0.01 acre survival plots at age one; and getting values for the cultural/genetics response adjustment matrix.

* * * * *